(12) United States Patent
You

(10) Patent No.: US 12,238,967 B2
(45) Date of Patent: Feb. 25, 2025

(54) DISPLAY DEVICE AND METHOD OF MANUFACTURING THE DISPLAY DEVICE

(71) Applicant: SAMSUNG DISPLAY CO., LTD., Yongin-si (KR)

(72) Inventor: Chungi You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/583,853

(22) Filed: Feb. 21, 2024

(65) Prior Publication Data
US 2024/0251596 A1 Jul. 25, 2024

Related U.S. Application Data

(62) Division of application No. 17/363,752, filed on Jun. 30, 2021, now Pat. No. 11,943,969.

(30) Foreign Application Priority Data

Sep. 4, 2020 (KR) .................. 10-2020-0113214

(51) Int. Cl.
| | | |
|---|---|---|
| H10K 71/00 | (2023.01) | |
| H10K 50/844 | (2023.01) | |
| H10K 59/121 | (2023.01) | |
| H10K 59/131 | (2023.01) | |
| H10K 59/40 | (2023.01) | |

(Continued)

(52) U.S. Cl.
CPC ......... *H10K 59/121* (2023.02); *H10K 50/844* (2023.02); *H10K 59/131* (2023.02); *H10K 59/40* (2023.02); *H10K 59/65* (2023.02); *H10K 71/00* (2023.02); *H10K 77/10* (2023.02); *H10K 59/1201* (2023.02)

(58) Field of Classification Search
CPC ....................................................... H10K 71/00
See application file for complete search history.

(56) References Cited

U.S. PATENT DOCUMENTS

| | | |
|---|---|---|
| 9,425,426 B2 | 8/2016 | Choi et al. |
| 10,431,762 B2 | 10/2019 | Jung et al. |

(Continued)

FOREIGN PATENT DOCUMENTS

| | | | |
|---|---|---|---|
| KR | 10-2015-0044083 A | 4/2015 | |
| KR | 10-2017-0096646 A | 8/2017 | |

(Continued)

*Primary Examiner* — Douglas M Menz
(74) *Attorney, Agent, or Firm* — Lewis Roca Rothgerber Christie LLP

(57) ABSTRACT

A display device includes: a substrate including an opening area, a display area surrounding the opening area, and a non-display area between the opening area and the display area; a first insulating layer on the substrate, the first insulating layer including a first recess or a first opening overlapping the non-display area; a second insulating layer on the first insulating layer, the second insulating layer including a second opening exposing a first upper surface of the first insulating layer between the first recess or the first opening and the opening area; a conductive pattern between the first insulating layer and the second insulating layer, the conductive pattern including a first layer and a second layer; and a display element on the second insulating layer and overlapping the display area, the display element including a first electrode, an emission layer, and a second electrode.

10 Claims, 37 Drawing Sheets

(51) Int. Cl.
*H10K 59/65* (2023.01)
*H10K 77/10* (2023.01)
*H10K 59/12* (2023.01)

(56) References Cited

U.S. PATENT DOCUMENTS

| | | | |
|---|---|---|---|
| 10,541,380 | B1 | 1/2020 | Sung et al. |
| 10,840,478 | B2 | 11/2020 | Han et al. |
| 2020/0168683 | A1 | 5/2020 | Son et al. |
| 2020/0259121 | A1 | 8/2020 | Lee et al. |
| 2020/0343485 | A1 | 10/2020 | Kim et al. |
| 2022/0069255 | A1 | 3/2022 | You |

FOREIGN PATENT DOCUMENTS

| | | |
|---|---|---|
| KR | 10-2019-0027003 A | 3/2019 |
| KR | 10-2019-0027985 A | 3/2019 |
| KR | 10-2020-0033376 A | 3/2020 |
| KR | 10-2020-0037025 A | 4/2020 |

DISPLAY DEVICE AND METHOD OF MANUFACTURING THE DISPLAY DEVICE

CROSS-REFERENCE TO RELATED APPLICATIONS

This application is a divisional of U.S. patent application Ser. No. 17/363,752, filed Jun. 30, 2021, which claims priority to and the benefit of Korean Patent Application No. 10-2020-0113214, filed Sep. 4, 2020, the entire content of both of which is incorporated herein by reference.

BACKGROUND

1. Field

One or more embodiments relate to a display device in which an organic material around an opening is removed through a laser lift-off process, and a method of manufacturing the display device.

2. Description of Related Art

Recently, the usage of display devices has diversified. Also, display devices have become thinner and lighter, and thus, the uses of display devices have expanded.

While increasing the area occupied by a display area in display devices, various functions have been connected or linked to the display devices. In order to increase the area and add various functions, studies have been conducted on display devices that have an opening in a display area.

SUMMARY

In the case of a display device having an opening, a foreign material such as moisture may infiltrate into the side of the opening and damage display elements. Aspects of one or more embodiments are directed towards a display device having a structure capable of preventing moisture infiltration through an opening and a method of manufacturing the display device. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display device includes a substrate including an opening area, a display area surrounding the opening area, and a non-display area between the opening area and the display area, a first insulating layer on the substrate, the first insulating layer including a first recess or a first opening overlapping the non-display area, a second insulating layer on the first insulating layer, the second insulating layer including a second opening exposing a first upper surface of the first insulating layer between the first recess or the first opening and the opening area, a conductive pattern between the first insulating layer and the second insulating layer, the conductive pattern including a first layer and a second layer, and a display element on the second insulating layer and overlapping the display area, the display element including a first electrode, an emission layer on the first electrode, and a second electrode on the emission layer.

According to an embodiment, the display device may further include a middle insulating layer between the first insulating layer and the second insulating layer, and a gate electrode between the first insulating layer and the middle insulating layer, wherein the conductive pattern is between the middle insulating layer and the second insulating layer.

According to an embodiment, the middle insulating layer may include a middle opening connected to the first recess or the first opening, and a second upper surface of the middle insulating layer on the first upper surface of the first insulating layer may be exposed by the second opening.

According to an embodiment, the first insulating layer may include a buffer layer and a gate insulating layer, and the display device may further include a semiconductor layer between the buffer layer and the gate insulating layer and a middle insulating layer between the first insulating layer and the second insulating layer, and the conductive pattern may be between the gate insulating layer and the middle insulating layer.

According to an embodiment, the middle insulating layer may include a middle opening connected to the first recess or the first opening, and the middle opening may expose the first upper surface of the first insulating layer.

According to an embodiment, the first layer may include titanium or amorphous silicon to which a dopant is added.

According to an embodiment, the display device may further include a lower pattern layer on the first upper surface of the first insulating layer, wherein the lower pattern layer may include amorphous silicon to which a dopant is added.

According to an embodiment, the first recess or the first opening may include a plurality of first recesses or a plurality of first openings, and the display device may further include a middle conductive pattern between the plurality of first recesses or the plurality of first openings.

According to an embodiment, the display element may further include at least one of a first functional layer between the first electrode and the emission layer or a second functional layer between the emission layer and the second electrode, and the second electrode and at least one of the first functional layer or the second functional layer may extend from the display area to the first recess or the first opening to overlap the first recess or the first opening, and may include a second transmission hole and a first transmission hole exposing the first upper surface of the first insulating layer, respectively.

According to an embodiment, the display device may further include an encapsulation layer covering the display element, the encapsulation layer including a first inorganic encapsulation layer, an organic encapsulation layer, and a second inorganic encapsulation layer, wherein the first inorganic encapsulation layer and the second inorganic encapsulation layer may extend from the display area to the first upper surface of the first insulating layer to overlap the first transmission hole and the second transmission hole.

According to one or more embodiments, a method of manufacturing a display device includes preparing a display substrate including a substrate and a first insulating layer on the substrate, the substrate including a non-display area and a display area, forming, on the first insulating layer, a conductive pattern including a first layer and a second layer, forming, in the non-display area, a pattern layer including a lower pattern layer and an upper pattern layer, forming a conductive layer on the pattern layer and the display area, patterning the conductive layer to form a first electrode, and removing the upper pattern layer, wherein the lower pattern layer the first layer include a same material, and the upper pattern layer and the second layer include a same material.

According to an embodiment, the method may further include forming a second electrode and at least one of a first functional layer or a second functional layer, on the lower pattern layer and the first electrode, and removing the second electrode and at least one of the first functional layer or the second functional layer on the lower pattern layer.

According to an embodiment, the removing of the second electrode and at least one of the first functional layer or the second functional layer may include forming, in at least one of the first functional layer or the second functional layer, a first transmission hole exposing a portion of an upper surface of the first insulating layer, and forming, in the second electrode, a second transmission hole exposing the portion of the upper surface of the first insulating layer.

According to an embodiment, the removing of the second electrode and at least one of the first functional layer or the second functional layer may include irradiating laser light on the lower pattern layer, and removing the lower pattern layer.

According to an embodiment, the removing of the second electrode and at least one of the first functional layer or the second functional layer may include irradiating laser light on the lower pattern layer, and exposing an upper surface of the lower pattern layer.

According to an embodiment, the method may further include forming, on the first insulating layer, a middle conductive pattern overlapping the non-display area, forming, on the middle conductive pattern, a second electrode and at least one of a first functional layer or a second functional layer, and removing the second electrode on the middle conductive pattern to expose an upper surface of at least one of the first functional layer or the second functional layer, wherein the middle conductive pattern and the lower pattern layer may include a same material.

According to an embodiment, the method may further include forming a second insulating layer covering the conductive pattern and the pattern layer, forming, in the second insulating layer, a second opening exposing the pattern layer, and forming, in the first insulating layer, a first recess or a first opening connected to the second opening.

According to an embodiment, the method may further include forming a middle insulating layer on the first insulating layer, wherein the pattern layer and the conductive pattern may be formed on the middle insulating layer, and the forming of the second opening may include forming a middle opening in the middle insulating layer.

According to an embodiment, the method may further include forming a middle insulating layer on the first insulating layer, wherein the forming of the second opening may include forming a middle opening in the middle insulating layer, and exposing the pattern layer through the middle opening.

According to an embodiment, the substrate may further include a bending area, and the method may further include forming a photoresist layer covering the second opening, the photoresist layer including a photoresist opening exposing the bending area, and etching the first insulating layer and the second insulating layer overlapping the photoresist opening.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
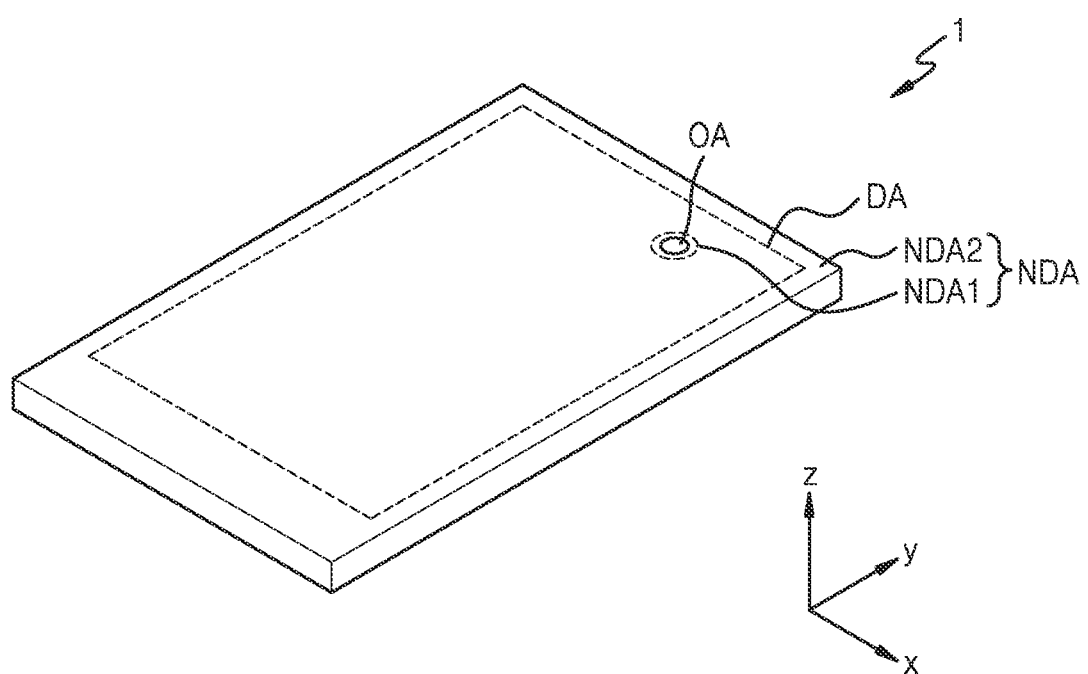
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various suitable changes and numerous embodiments, certain embodiments will be illustrated in the drawings and described in the written description. Effects and features of the disclosure, and methods of achieving them will be clarified with reference to embodiments described below in more detail with reference to the drawings. However, the disclosure is not limited to the following embodiments and may be embodied in various suitable forms.

One or more embodiments of the disclosure will be described below in more detail with reference to the accompanying drawings. Those components that are the same or are in correspondence with each other are rendered the same reference numeral regardless of the figure number, and redundant explanations may not be repeated.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "comprises," "includes," "including," and/or "comprising" used herein specify the presence of stated features or elements, but do not preclude the presence or addition of one or more other features or elements.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

In the following embodiments, it will be understood that when a layer, region, or component is referred to as being "connected to" or "coupled to" another layer, region, or component, it may be directly or indirectly connected or coupled to the other layer, region, or component. That is, for example, intervening layers, regions, or components may be present. For example, when layers, areas, components, or the like are referred to as being "electrically connected," the layers, areas, or components may be directly electrically connected, or the layers, areas, or components may be indirectly electrically connected and an intervening portion may be present.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

A display device displays an image and may include a game console, a multimedia device, or a portable mobile device such as an ultra-small personal computer (PC). A display device may include a liquid crystal display, an electrophoretic display, an organic light-emitting display, an inorganic light-emitting display, a field emission display, a surface-conduction electron-emitter display, a quantum dot display, a plasma display, a cathode ray display, and/or the like. Hereinafter, an organic light-emitting display device is described as an example of a display device according to an embodiment, but the various types of display devices described above may be used in embodiments.

Figure 2:
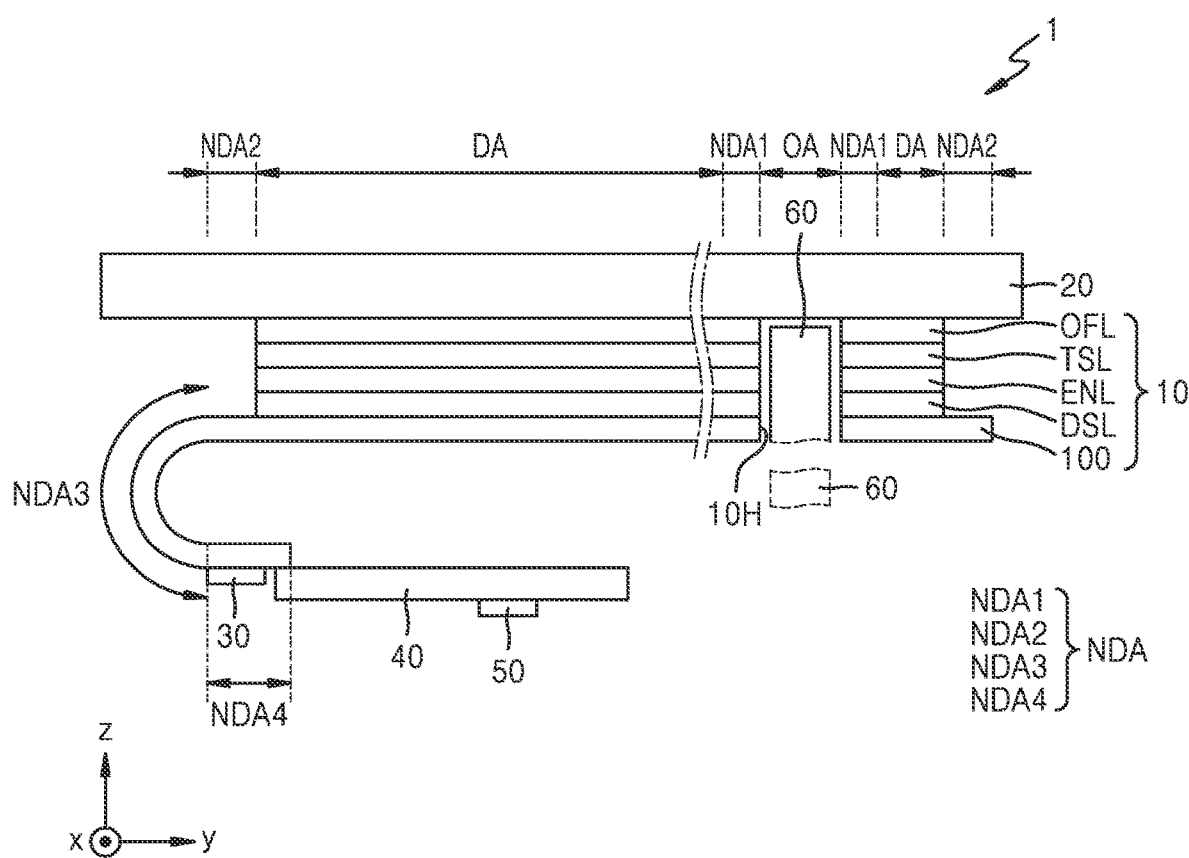
FIG. 2 is a schematic cross-sectional view of a display device according to an embodiment.

FIG. 1 is a schematic perspective view of a display device 1 according to an embodiment. FIG. 2 is a schematic cross-sectional view of the display device 1 according to an embodiment.

Referring to FIGS. 1 and 2, the display device 1 may include a display area DA, a non-display area NDA, and an opening area OA. The display area DA may emit light. A plurality of pixels may be arranged in the display area DA, and the display device 1 may provide a certain image by using light emitted from the pixels. The non-display area NDA does not emit light. The non-display area NDA may be arranged adjacent to the display area DA.

The opening area OA may be at least partially surrounded by the display area DA. According to an embodiment, the opening area OA may be completely surrounded by the display area DA.

The display device 1 may include a display panel 10, a cover window 20, a display driver 30, a display circuit board 40, a touch sensor driver 50, and a component 60. The display panel 10 may display an image. The display panel 10 may include pixels arranged in the display area DA. The pixels may include a display element and a pixel circuit connected thereto. The display element may include an organic light-emitting diode, an inorganic light-emitting diode, or a quantum dot light-emitting diode. Hereinafter, a detailed description will be given focusing on a case in which the display element includes an organic light-emitting diode.

The display panel 10 may include a substrate 100 and multiple layers over the substrate 100. In this case, the display area DA, the non-display area NDA, and the opening area OA may be defined in the substrate 100 and/or the multiple layers. For example, the substrate 100 may include the display area DA, the non-display area NDA, and the opening area OA. Hereinafter, a detailed description will be given focusing on a case in which the display area DA, the non-display area NDA, and the opening area OA are defined in the substrate 100.

The non-display area NDA may include a first non-display area NDA1, a second non-display area NDA2, a third non-display area NDA3, and a fourth non-display area NDA4. The first non-display area NDA1 may surround the opening area OA. The second non-display area NDA2 may at least partially surround the display area DA. According to an embodiment, the first non-display area NDA1 may completely surround the opening area OA. The display area DA may completely surround the first non-display area NDA1. The second non-display area NDA2 may completely surround the display area DA. The third non-display area NDA3 may be connected to the second non-display area NDA2 and the fourth non-display area NDA4. The third non-display area NDA3 may be a bending area, and the substrate 100 may be bent in the third non-display area NDA3. In this case, at least some portions of the lower surface of the substrate 100 may face each other. The fourth non-display area NDA4 may be a pad area in which the display driver 30 and/or the display circuit board 40 are arranged.

According to an embodiment, the display panel 10 may include the substrate 100, a display layer DSL, an encapsulation layer ENL, a touch sensor layer TSL, and an optical functional layer OFL. The substrate 100 may include glass or a polymer resin, such as polyethersulfone, polyacrylate, polyetherimide, polyethylene naphthalate, polyethylene terephthalate, polyphenylene sulfide, polyimide, polycarbonate, cellulose triacetate, or cellulose acetate propionate. According to an embodiment, the substrate 100 may have a multiple layer structure including a base layer including the above-described polymer resin and a barrier layer. The substrate 100 including the polymer resin may be flexible, rollable, or bendable.

The display layer DSL may be on the substrate 100. The display layer DSL may include a pixel circuit layer including a plurality of pixel circuits and a display element layer including a plurality of display elements. In this case, the pixel circuits may be connected to the display elements, respectively. The pixel circuit may include a thin-film transistor and a storage capacitor. Also, the display layer DSL may further include insulating layers.

The encapsulation layer ENL may be on the display layer DSL. The encapsulation layer ENL may be on the display element and may cover the display element. According to an embodiment, the encapsulation layer ENL may include at least one inorganic encapsulation layer and at least one organic encapsulation layer. The at least one inorganic encapsulation layer may include at least one inorganic material selected from aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), or silicon oxynitride (SiON). The at least one organic encapsulation layer may include a polymer-based material. The polymer-based material may include an acrylic resin, an epoxy resin, polyimide, polyethylene, and/or the like. According to an embodiment, the at least one organic encapsulation layer may include acrylate.

The touch sensor layer TSL may be on the encapsulation layer ENL. The touch sensor layer TSL may sense coordinate information according to an external input, for example, a touch event. The touch sensor layer TSL may include a sensor electrode and touch lines connected to the sensor electrode. The touch sensor layer TSL may sense an external input by using a self-capacitance method or a mutual-capacitance method.

The touch sensor layer TSL may be formed on the encapsulation layer ENL. Alternatively, the touch sensor layer TSL may be separately formed on a touch substrate and then bonded to the encapsulation layer ENL through an adhesive layer such as an optically clear adhesive. According to an embodiment, the touch sensor layer TSL may be formed directly on the encapsulation layer ENL. In this case, the adhesive layer may not be between the touch sensor layer TSL and the encapsulation layer ENL.

The optical functional layer OFL may be on the touch sensor layer TSL. The optical functional layer OFL may reduce reflectance of light (external light) incident on the display device 1 (e.g., the optical functional layer OFL of the display device 1) from the outside, and/or may improve color purity of light emitted from the display device 1. According to an embodiment, the optical functional layer OFL may include a retarder and/or a polarizer. The retarder may be a film type retarder or a liquid crystal coating type retarder and may include a λ/2 retarder and/or a λ/4 retarder. The polarizer may also be a film type polarizer or a liquid crystal coating type polarizer. The film type polarizer may include a stretched synthetic resin film, and the liquid crystal coating type polarizer may include liquid crystals arranged in a certain array. Each of the retarder and the polarizer may further include a protective film.

According to another embodiment, the optical functional layer OFL may include a black matrix and color filters. The color filters may be arranged considering the color of light emitted from each of the pixels of the display device 1. Each of the color filters may include a red, green, or blue pigment or dye. Alternatively, each of the color filters may further include, in addition to the pigment or dye, quantum dots. Alternatively, some color filters may not include the pigment or dye and may include scattering particles such as titanium oxide.

According to another embodiment, the optical functional layer OFL may include a destructive interference structure. The destructive interference structure may include a first reflective layer and a second reflective layer, which are arranged on different layers from each other. First reflected light and second reflected light, which are respectively reflected from the first reflective layer and the second reflective layer, may destructively interfere with each other. Thus, reflectance of external light may be reduced.

The display panel 10 may include an opening 10H. According to an embodiment, the substrate 100 may include the opening area OA, and each of the display layer DSL, the encapsulation layer ENL, the touch sensor layer TSL, and the optical functional layer OFL may include first to fourth openings (i.e., a first opening, a second opening, a third opening, and a fourth opening) respectively. The opening area OA and the first to fourth openings may overlap each other to form the opening 10H of the display panel 10. In other words, the opening 10H may include the first to fourth openings. According to another embodiment, at least one of the substrate 100, the display layer DSL, the encapsulation layer ENL, the touch sensor layer TSL, or the optical functional layer OFL may not include an opening. For example, one or two selected from the substrate 100, the display layer DSL, the encapsulation layer ENL, the touch sensor layer TSL, and the optical functional layer OFL may not include an opening.

The cover window 20 may be on the display panel 10. The cover window 20 may protect the display panel 10. The cover window 20 may include at least one of glass, sapphire, or plastic. The cover window 20 may include, for example, ultra-thin glass (UTG) or colorless polyimide (CPI).

The display driver 30 may be arranged in the fourth non-display area NDA4. The display driver 30 may receive control signals and power supply voltages and generate and output signals and voltages for driving the display panel 10. The display driver 30 may include an integrated circuit (IC).

The display circuit board 40 may be electrically connected to the display panel 10. For example, the display circuit board 40 may be electrically connected to the fourth non-display area NDA4 of the substrate 100 by an anisotropic conductive film. The display circuit board 40 may include a flexible printed circuit board (FPCB) that is bendable, or a rigid PCB that is rigid and is thus not easily bent. Alternatively, in some cases, the display circuit board 40 may include a complex PCB including both the rigid PCB and the FPCB The touch sensor driver 50 may be on the display circuit board 40. The touch sensor driver 50 may include an IC. The touch sensor driver 50 may be bonded to the display circuit board 40. The touch sensor driver 50 may be electrically connected to sensor electrodes of the touch sensor layer TSL of the display panel 10 through the display circuit board 40.

The component 60 may overlap the opening area OA. The component 60 may be located at the opening 10H of the display panel 10, as indicated by a solid line in FIG. 2, or may be under the display panel 10, as indicated by a dashed line.

The component 60 may include an electronic element. The component 60 may include an electronic element using light or sound. For example, the electronic element may include a sensor (e.g., infrared sensor) configured to receive and use light, a camera configured to receive light and capture an image, a sensor configured to output and sense light or sound so as to measure a distance or recognize a fingerprint, a small lamp configured to output light, a speaker configured to output sound, and/or the like. When the component 60 is an electronic element using light, the component 60 may use light of various suitable wavelength bands, such as visible light, infrared light, and ultraviolet light. In some embodiments, the opening 10H of the display panel 10 may be understood as a transmission portion through which the light and/or sound output from the component 60 to the outside or traveling from the outside toward the electronic element may be transmitted.

According to another embodiment, when the display device 1 is used as a smart watch or a dashboard for a vehicle, the component 60 may be a member including a clock hand or a needle indicating certain information (e.g., vehicle speed, etc.). When the display device 1 includes a clock hand or a needle indicating certain information (e.g., vehicle speed, etc.), the component 60 may be exposed to the outside through the cover window 20, and the cover window 20 may include an opening overlapping the opening 10H of the display panel 10.

The component 60 may include component(s) related to the functions of the display panel 10 as described above, or may include component(s) such as accessories that increase a sense of beauty (i.e., an aesthetic appeal) of the display panel 10.

Figure 3:
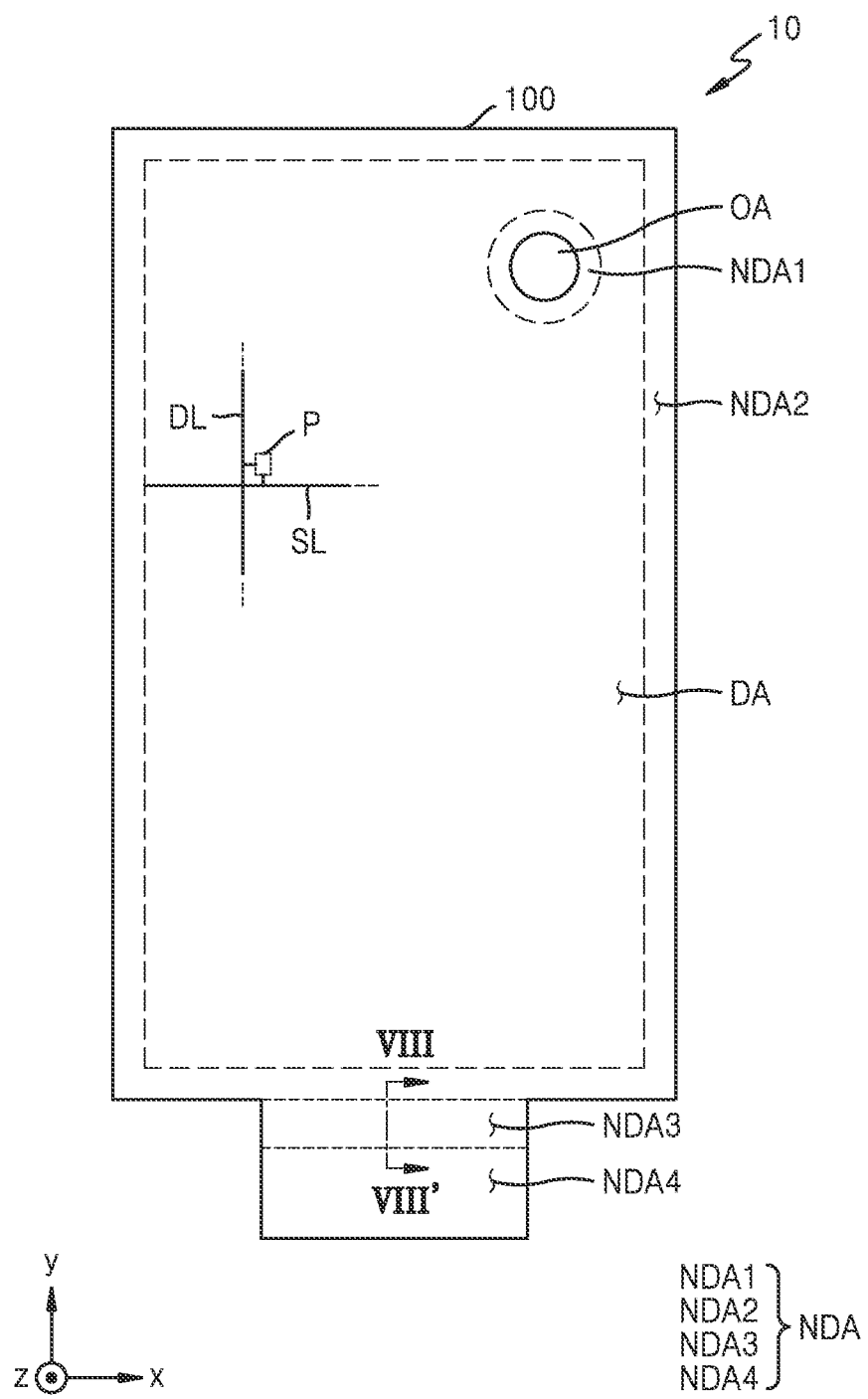
FIG. 3 is a schematic plan view of a display panel according to an embodiment.
Figure 4:
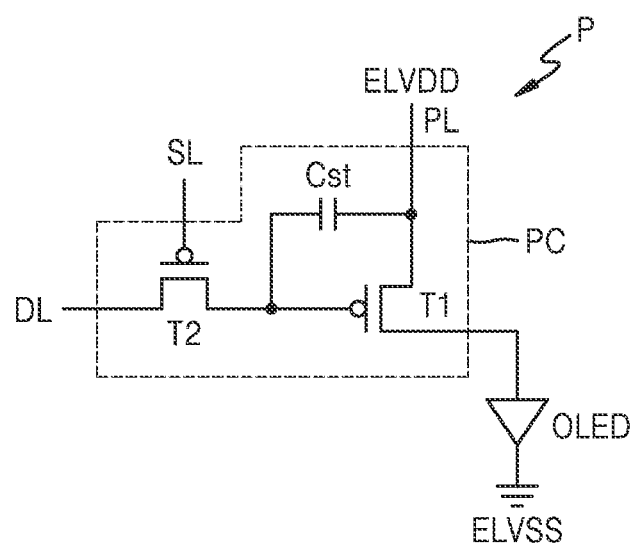
FIG. 4 is a schematic equivalent circuit diagram of a pixel of a display panel.

FIG. 3 is a schematic plan view of a display panel 10 according to an embodiment, and FIG. 4 is a schematic equivalent circuit diagram of a pixel P of the display panel 10.

Referring to FIG. 3, the display panel 10 may include a display area DA, a non-display area NDA, and an opening area OA. In this case, the display area DA, the non-display area NDA, and the opening area OA may be defined in a substrate 100 of the display panel 10. That is, the substrate 100 may include the display area DA, the non-display area NDA, and the opening area OA. The non-display area NDA may include a first non-display area NDA1, a second non-display area NDA2, a third non-display area NDA3, and a fourth non-display area NDA4.

The display panel 10 may include a plurality of pixels P arranged in the display area DA. As illustrated in FIG. 4, each of the pixels P may include a pixel circuit PC and an organic light-emitting diode OLED as a display element connected to the pixel circuit PC. The pixel circuit PC may include a driving thin-film transistor T1, a switching thin-film transistor T2, and a storage capacitor Cst. Each of the pixels P may emit red light, green light, blue light, or white light from the organic light-emitting diode OLED.

The switching thin-film transistor T2 may be connected to a scan line SL and a data line DL and may be configured to transmit, to the driving thin-film transistor T1, a data voltage or a data signal input from the data line DL according to a switching voltage or a switching signal input from the scan line SL.

The storage capacitor Cst may be connected to the switching thin-film transistor T2 and a driving voltage line PL, and may store a voltage corresponding to a difference between a voltage transmitted from the switching thin-film transistor T2 and a first power supply voltage ELVDD supplied to the driving voltage line PL.

The driving thin-film transistor T1 may be connected to the driving voltage line PL and the storage capacitor Cst and may be configured to control a driving current flowing from the driving voltage line PL to the organic light-emitting diode OLED according to a voltage value stored in the storage capacitor Cst.

The organic light-emitting diode OLED may emit light having a certain luminance according to the driving current. A second electrode of the organic light-emitting diode OLED may be configured to receive a second power supply voltage ELVSS.

Although FIG. 4 illustrates that the pixel circuit PC includes two thin-film transistors and one storage capacitor, the number of thin-film transistors and the number of storage capacitors may be variously changed in a suitable manner according to the design of the pixel circuit PC.

Referring to FIG. 3 again, the first non-display area NDA1 may surround the opening area OA. The first non-display area NDA1 is an area in which a display element such as an organic light-emitting diode configured to emit light is not arranged. Signal lines configured to provide signals to the pixels P arranged around the opening area OA may pass through the first non-display area NDA1.

The second non-display area NDA2 may at least partially surround the display area DA. A scan driver configured to provide scan signals to the pixels P, a data driver configured to provide data signals to the pixels P, main power lines configured to provide a first power supply voltage and/or a second power supply voltage, and/or the like may be arranged in the second non-display area NDA2.

The third non-display area NDA3 is a bending area, and FIG. 3 illustrates an unbent (i.e., not bent) shape of the display panel 10. The third non-display area NDA3 may be connected to the second non-display area NDA2. According to an embodiment, the third non-display area NDA3 may be between the second non-display area NDA2 and the fourth non-display area NDA4.

The fourth non-display area NDA4 is a pad area and may be connected to the third non-display area NDA3. The display driver (e.g., see the display driver 30 of the embodiment shown in FIG. 2) and/or the display circuit board (e.g., see the display circuit board 40 of the embodiment shown in FIG. 2) may be arranged in the fourth non-display area NDA4.

Figure 5:
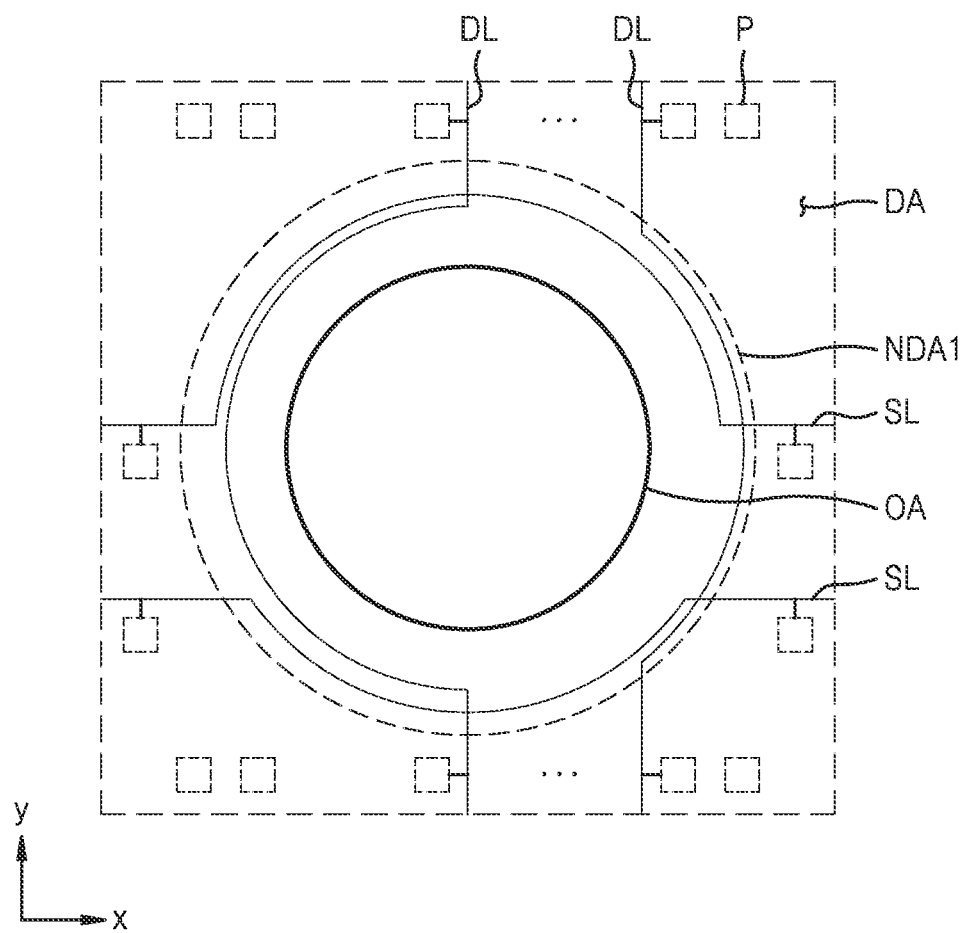
FIG. 5 is a schematic plan view of a portion of a display panel according to an embodiment.

FIG. 5 is a schematic plan view of a portion of a display panel according to an embodiment. FIG. 5 schematically illustrates signal lines arranged in the first non-display area NDA1.

Referring to FIG. 5, pixels P may be arranged in a display area DA. Each of the pixels P may be connected to a scan line SL and a data line DL. The first non-display area NDA1 may be between an opening area OA and the display area DA.

The pixels P may be apart from or spaced from each other around the opening area OA. The pixels P may be vertically apart from or vertically spaced from each other around the opening area OA. The pixels P may be horizontally apart from or horizontally spaced from each other around the opening area OA.

Signal lines adjacent to the opening area OA from among signal lines configured to supply signals to the pixels P may bypass the opening area OA. Some data lines DL passing through the display area DA may extend in the y direction to provide data signals to the pixels P arranged above and below with the opening area OA therebetween, and may bypass along the edge of the opening area OA in the first non-display area NDA1. Some scan lines SL passing through the display area DA may extend in the x direction to provide scan signals to the pixels P arranged left and right with the opening area OA therebetween, and may bypass along the edge of the opening area OA in the first non-display area NDA1.

Figure 6:
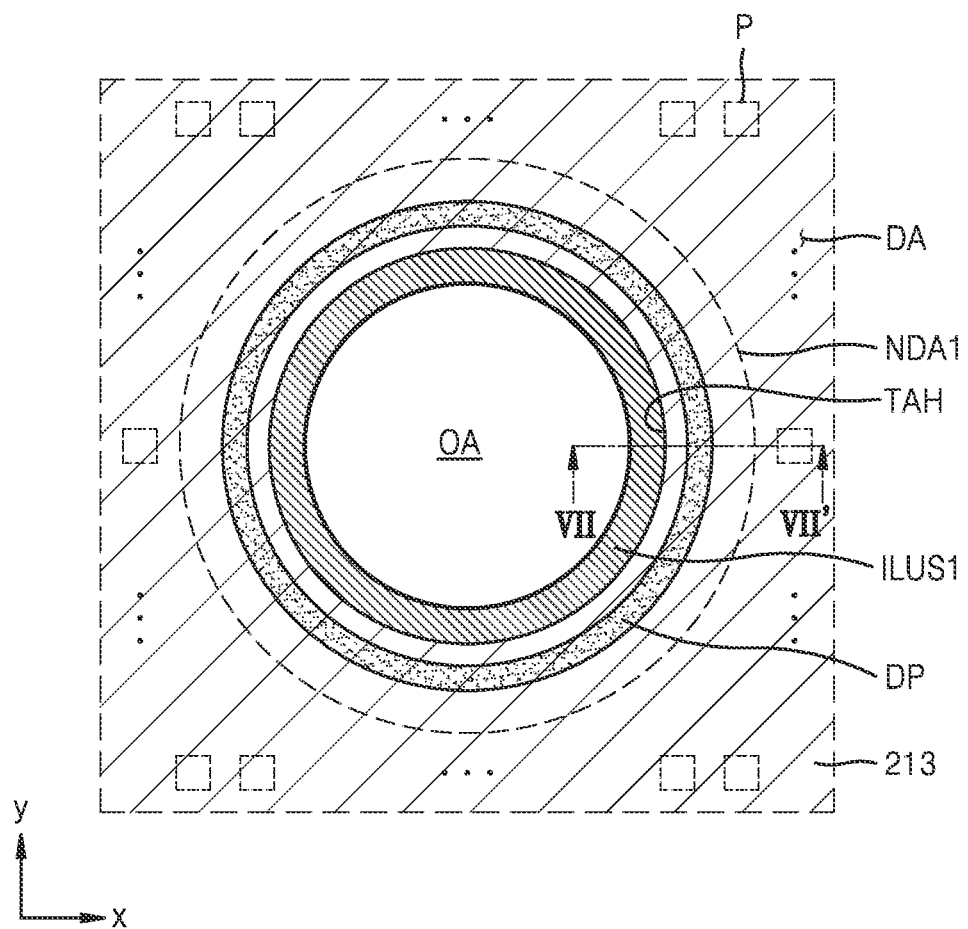
FIG. 6 is a plan view of a portion of a display panel according to an embodiment.

FIG. 6 is a plan view of a portion of a display panel according to an embodiment. FIG. 6 illustrates a transmission hole TAH and a dam portion DP arranged in the first non-display area NDA1. Also, FIG. 6 illustrates a second electrode 213 arranged in the first non-display area NDA1 and a display area DA.

Referring to FIG. 6, at least one dam portion DP may be between an opening area OA and the display area DA on a substrate. In this specification, the dam portion DP refers to a configuration protruding with respect to a reference surface. Also, a recess may be defined, and the recess refers to a configuration that is concave with respect to the reference surface. The reference surface may be an upper surface of one of insulating layers on the substrate.

The second electrode 213 and first and second functional layers including an organic material may be removed between the opening area OA and the dam portion DP. Therefore, it is possible to prevent or reduce infiltration of external air such as moisture through the opening area OA. That is, each of the first functional layer, the second functional layer, and the second electrode 213 may include a transmission hole TAH exposing the opening area OA and a portion of the first non-display area NDA1 around the opening area OA. The transmission hole TAH may expose the first non-display area NDA1 between the dam portion DP and the opening area OA. For example, the transmission hole TAH may expose a first upper surface ILUS1 of a first insulating layer adjacent to the opening area OA. According to an embodiment, the first insulating layer adjacent to the opening area OA may surround or encircle the opening area OA.

According to an embodiment, a first recess or a first opening provided in the first insulating layer may be between the transmission hole TAH and the dam portion DP. The transmission hole TAH may be formed by partially removing the first functional layer, the second functional layer, and the second electrode 213 through a laser lift-off process, and the first recess or the first opening may be introduced so as to form the transmission hole TAH through a laser lift-off process.

According to an embodiment, the dam portion DP may have a ring shape that completely surrounds or encircles the opening area OA in the first non-display area NDA1. The diameter of the dam portion DP may be greater than the diameter of the opening area OA.

Figure 7A:
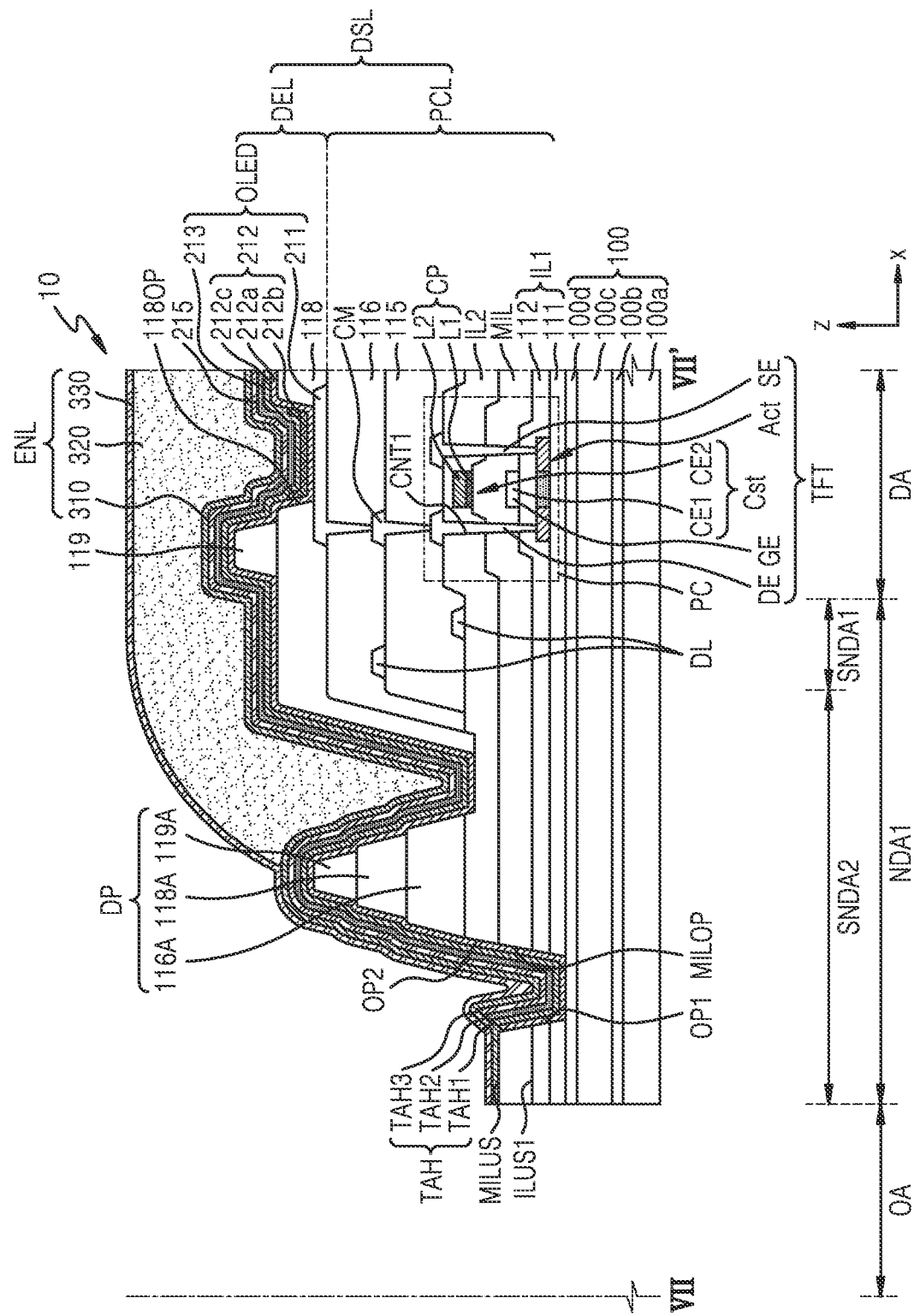
FIGS. 7A and 7B are schematic cross-sectional views of the display panel taken along the line VII-VII' of FIG. 6, according to an embodiment.
Figure 7B:
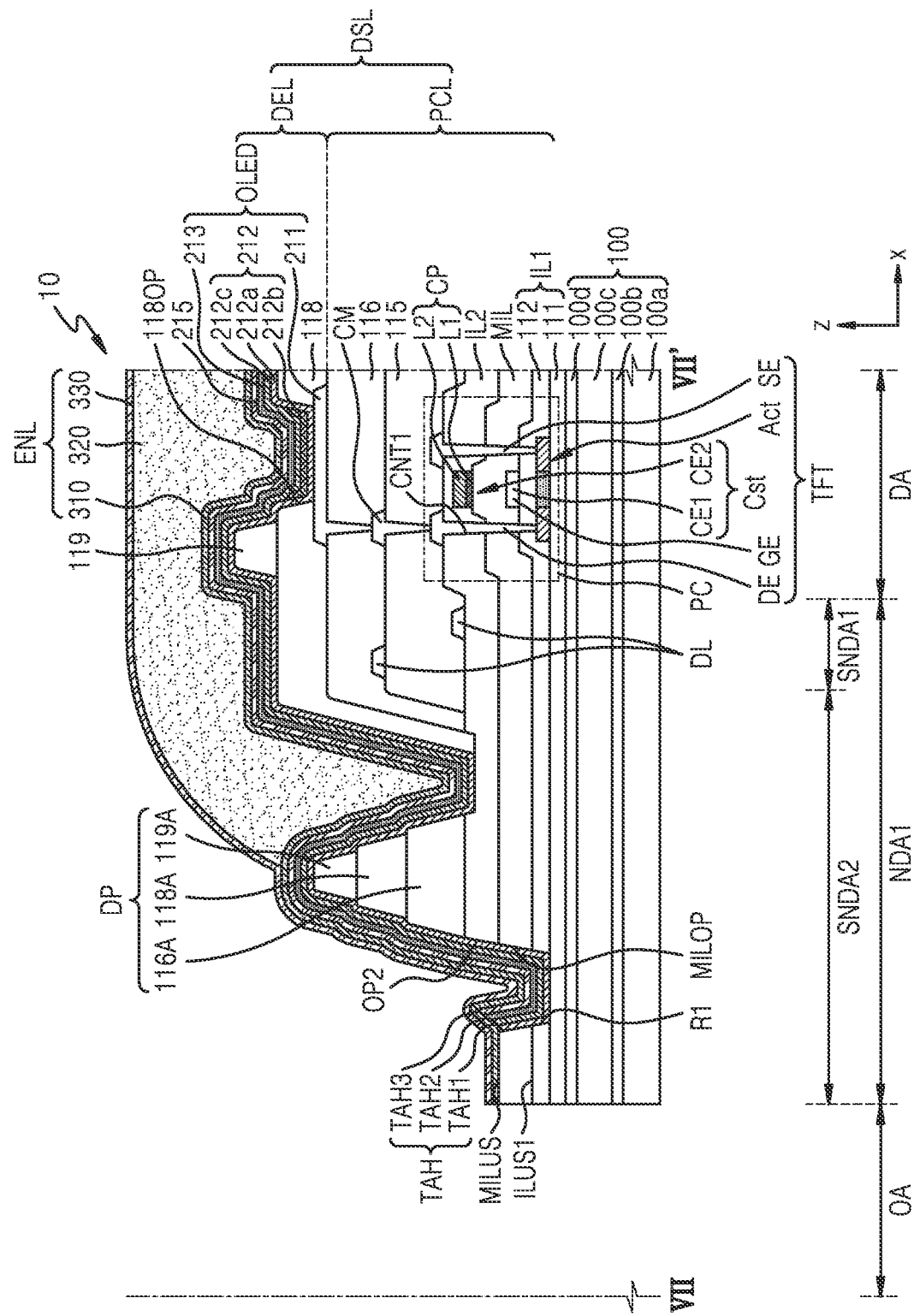

FIGS. 7A and 7B are schematic cross-sectional views of the display panel 10 taken along the line VII-VII' of FIG. 6, according to an embodiment.

Referring to FIGS. 7A and 7B, the display panel 10 may include a substrate 100, a display layer DSL, and an encapsulation layer ENL. The display layer DSL may include a pixel circuit layer PCL and a display element layer DEL. The pixel circuit layer PCL may include a first insulating layer IL1, a middle insulating layer MIL, a second insulating layer IL2, a first organic insulating layer 115, a second organic insulating layer 116, a pixel circuit PC, and a data line DL. The display element layer DEL may include an organic light-emitting diode OLED, a pixel defining layer 118, a spacer 119, and a capping layer 215.

A substrate 100 may include a display area DA, a first non-display area NDA1, and an opening area OA. The first non-display area NDA1 may be between (e.g., between in the x direction) the display area DA and the opening area OA.

The substrate 100 may include a first base layer 100a, a first barrier layer 100b, a second base layer 100c, and a second barrier layer 100d. According to an embodiment, the first base layer 100a, the first barrier layer 100b, the second base layer 100c, and the second barrier layer 100d may be stacked (e.g., sequentially stacked). According to an embodiment, the first base layer 100a, the first barrier layer 100b, the second base layer 100c, and the second barrier layer 100d may be continuously arranged. For example, the first base layer 100a, the first barrier layer 100b, the second base layer 100c, and the second barrier layer 100d may be continuously arranged in a direction from the display area DA to the opening area OA. According to an embodiment, the first base layer 100a, the first barrier layer 100b, the second base layer 100c, and the second barrier layer 100d may extend continuously in the display area DA and the first non-display area NDA1.

At least one of the first base layer 100a or the second base layer 100c may include a polymer resin, such as polyethersulfone, polyacrylate, polyetherimide, polyethylene naphthalate, polyethylene terephthalate, polyphenylene sulfide, polyimide, polycarbonate, cellulose triacetate, or cellulose acetate propionate.

Each of the first barrier layer 100b and the second barrier layer 100d is a barrier layer for preventing or reducing infiltration of an external foreign material. Each of the first barrier layer 100b and the second barrier layer 100d may be a single layer or multiple layers including an inorganic material such as silicon nitride ($SiN_x$), silicon oxide ($SiO_2$), and/or silicon oxynitride (SiON).

The display layer DSL including the pixel circuit layer PCL and the display element layer DEL may be on the substrate 100. The first insulating layer IL1 of the pixel circuit layer PCL may include a buffer layer 111 and a gate insulating layer 112. The first insulating layer IL1 may be arranged in the display area DA and the first non-display area NDA1. The pixel circuit PC may include a thin-film transistor TFT and a storage capacitor Cst.

The buffer layer 111 may be on the substrate 100. The buffer layer 111 may include an inorganic insulating material such as silicon nitride (SiN$_x$), silicon oxynitride (SiON), and silicon oxide (SiO$_2$), and may include a single layer or multiple layers including the above-described inorganic insulating material.

The thin-film transistor TFT may include a semiconductor layer Act, and the semiconductor layer Act may be on the buffer layer 111. The semiconductor layer Act may include polysilicon. Alternatively, the semiconductor layer Act may include amorphous silicon, semiconductor oxide, or an organic semiconductor. The semiconductor layer Act may include a channel region, and a drain region and a source region on or at respective sides of the channel region. A gate electrode GE may overlap (e.g., overlap in the z direction) the channel region.

The gate electrode GE may include a low resistance metal material. The gate electrode GE may include a conductive material such as molybdenum (Mo), aluminum (Al), copper (Cu), and titanium (Ti), and may include a single layer or multiple layers including the above-described material.

The gate insulating layer 112 between the semiconductor layer Act and the gate electrode GE may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO).

The middle insulating layer MIL may be between (e.g., between in the z direction) the first insulating layer IL1 and the second insulating layer IL2. According to an embodiment, the middle insulating layer MIL may cover the gate electrode GE. The middle insulating layer MIL may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO).

The second insulating layer IL2 may be on the first insulating layer IL1. According to an embodiment, the second insulating layer IL2 may be on the middle insulating layer MIL. The second insulating layer IL2 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO). The second insulating layer IL2 may be a single layer or multiple layers including the above-described inorganic insulating material.

A conductive pattern CP may be between the first insulating layer IL1 and the second insulating layer IL2. According to an embodiment, the conductive pattern CP may be between the middle insulating layer MIL and the second insulating layer IL2. The conductive pattern CP may include a first layer L1 and a second layer L2 on the first layer L1. According to the present embodiment, the conductive pattern CP includes the first layer L1 and the second layer L2 so as to form the transmission hole TAH in the first non-display area NDA1 through a laser lift-off process. For example, a pattern layer PTL (see FIG. 9A) formed in the first non-display area NDA1 concurrently (e.g., simultaneously) with the conductive pattern CP may be removed through a laser lift-off process to form the transmission hole TAH as will be described in more detail below.

According to an embodiment, the first layer L1 may include titanium (Ti). According to another embodiment, the first layer L1 may include amorphous silicon to which a dopant is added. The dopant added to the amorphous silicon (a-Si) may include one selected from boron (B), phosphorus (P), nitrogen (N), nickel (Ni), cobalt (Co), and fluorine (F).

The second layer L2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

According to an embodiment, the conductive pattern CP may function as an upper electrode CE2 of the storage capacitor Cst. For example, the conductive pattern CP may overlap the gate electrode GE thereunder. In this case, the gate electrode GE and the conductive pattern CP overlapping each other with the middle insulating layer MIL therebetween may form the storage capacitor Cst. That is, the gate electrode GE may function as a lower electrode CE1 of the storage capacitor Cst.

According to an embodiment, the storage capacitor Cst may overlap (e.g., overlap in the z direction) the thin-film transistor TFT. According to another embodiment, the storage capacitor Cst may not overlap (e.g., not overlap in the z direction) the thin-film transistor TFT.

A drain electrode DE and a source electrode SE may be located on the second insulating layer IL2. The drain electrode DE and the source electrode SE may be connected to the semiconductor layer Act through contact holes provided in the gate insulating layer 112, the middle insulating layer MIL, and the second insulating layer IL2. Each of the drain electrode DE and the source electrode SE may include a material having good conductivity. Each of the drain electrode DE and the source electrode SE may include a conductive material including molybdenum (Mo), aluminum (Al), copper (Cu), titanium (Ti), and/or the like and may include a single layer or multiple layers including the above-described material. According to an embodiment, each of the drain electrode DE and the source electrode SE may have a multiple layer structure of Ti/Al/Ti.

The first organic insulating layer 115 may be arranged to cover the drain electrode DE and the source electrode SE. The first organic insulating layer 115 may include an organic insulating material such as a general-purpose polymer (polymethylmethacrylate (PMMA), polystyrene (PS), etc.) a polymer derivative having a phenol-based group, an acryl-based polymer, an aryl ether-based polymer, an amide-based polymer, a fluorine-based polymer, a p-xylene-based polymer, a vinyl alcohol-based polymer, and any blend thereof.

A connection electrode CM may be on the first organic insulating layer 115. In this case, the connection electrode CM may be connected to the drain electrode DE or the source electrode SE through a contact hole of the first organic insulating layer 115. The connection electrode CM may include a material having good conductivity. The connection electrode CM may include a conductive material such as molybdenum (Mo), aluminum (Al), copper (Cu), or titanium (Ti), and may include a single layer or multiple layers including the above-described material. According to an embodiment, the connection electrode CM may have a multiple layer structure of Ti/Al/Ti.

The second organic insulating layer 116 may be arranged to cover the connection electrode CM. The second organic insulating layer 116 may include an organic insulating material such as a general-purpose polymer (polymethylmethacrylate (PMMA), polystyrene (PS), etc.) a polymer derivative having a phenol-based group, an acryl-based polymer, an aryl ether-based polymer, an amide-based polymer, a fluorine-based polymer, a p-xylene-based polymer, a vinyl alcohol-based polymer, and any blend thereof.

The organic light-emitting diode OLED may be on the second organic insulating layer 116. The organic light-emitting diode OLED may emit red light, green light, or blue light, or may emit red light, green light, blue light, or white light. The organic light-emitting diode OLED may include a first electrode 211, a middle layer 212, and a second electrode 213. The first electrode 211 may be a pixel electrode of the organic light-emitting diode OLED, and the second electrode 213 may be an opposite electrode of the organic light-emitting diode OLED.

The first electrode 211 may be on the second organic insulating layer 116. The first electrode 211 may be electrically connected to the connection electrode CM through a contact hole of the second organic insulating layer 116. The first electrode 211 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the first electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. According to another embodiment, the first electrode 211 may further include a layer including ITO, IZO, ZnO, or $In_2O_3$ above and/or below the reflective layer. For example, the first electrode 211 may have a multiple layer structure of ITO/Ag/ITO.

The pixel defining layer 118 having an opening 118OP exposing the central portion of the first electrode 211 may be on the first electrode 211. The pixel defining layer 118 may include an organic insulating material and/or an inorganic insulating material. The opening 118OP of the pixel defining layer 118 may define an emission area in which light is emitted from the organic light-emitting diode OLED. For example, the width of the opening 118OP may correspond to the width of the emission area.

The spacer 119 may be on the pixel defining layer 118. The spacer 119 may include an organic insulating material such as polyimide. Alternatively, the spacer 119 may include an inorganic insulating material such as silicon nitride ($SiN_x$) or silicon oxide ($SiO_2$), or may include an organic insulating material and an inorganic insulating material.

According to an embodiment, the spacer 119 may include a material different from that of the pixel defining layer 118. Alternatively, according to another embodiment, the spacer 119 and the pixel defining layer 118 may include a same material. In this case, the pixel defining layer 118 and the spacer 119 may be formed together in a mask process using a halftone mask or the like. According to an embodiment, the pixel defining layer 118 and the spacer 119 may be integrally formed (i.e., form a monolithic structure).

The middle layer 212 may be on the pixel defining layer 118. The middle layer 212 may include an emission layer 212b arranged in the opening 118OP of the pixel defining layer 118. The emission layer 212b may include a high molecular weight organic material or a low molecular weight organic material that emits light of a certain color.

The middle layer 212 may further include at least one of a first functional layer 212a between the first electrode 211 and the emission layer 212b or a second functional layer 212c between the emission layer 212b and the second electrodes 213. For example, the first functional layer 212a may be between the first electrode 211 and the emission layer 212b, and the second functional layer 212c may be omitted between the emission layer 212b and the second electrode 213. As another example, the first functional layer 212a may be omitted between the first electrode 211 and the emission layer 212b, and the second functional layer 212c may be between the emission layer 212b and the second electrode 213. As another example, the first functional layer 212a may be between the first electrode 211 and the emission layer 212b, and the second functional layer 212c may be between the emission layer 212b and the second electrode 213. Hereinafter, a detailed description will be given focusing on a case in which the first functional layer 212a and the second functional layer 212c are arranged.

For example, the first functional layer 212a may include a hole transport layer (HTL), or may include an HTL and a hole injection layer (HIL). The second functional layer 212c may include an electron transport layer (ETL) and/or an electron injection layer (EIL). The first functional layer 212a and/or the second functional layer 212c may be a common layer covering the entire substrate 100, as in the second electrode 213 to be described in more detail below.

The second electrode 213 may include a conductive material having a low work function. For example, the second electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the second electrode 213 may further include a layer such as ITO, IZO, ZnO, or $In_2O_3$ on the (semi)transparent layer including the above-mentioned material.

According to an embodiment, the capping layer 215 may be further on the second electrode 213. The capping layer 215 may include LiF, an inorganic material, and/or an organic material.

The first non-display area NDA1 may include a first sub-non-display area SNDA1 and a second sub-non-display area SNDA2. The first sub-non-display area SNDA1 may be farther from the opening area OA than the second sub-non-display area SNDA2. That is, the second sub-non-display area SNDA2 may be between the first sub-non-display area SNDA1 and the opening area OA. According to an embodiment, the first sub-non-display area SNDA1 may be between the second sub-non-display area SNDA2 and the display area DA.

According to an embodiment, the second organic insulating layer 116 may cover the side surface of the first organic insulating layer 115. According to another embodiment, the second organic insulating layer 116 may expose the side surface of the first organic insulating layer 115. Hereinafter, a detailed description will be given focusing on a case in which the second organic insulating layer 116 covers the side surface of the first organic insulating layer 115, as illustrated in FIGS. 7A and 7B.

According to an embodiment, the pixel defining layer 118 may cover the side surface of the second organic insulating layer 116. According to another embodiment, the pixel defining layer 118 may expose the side surface of the second organic insulating layer 116. Hereinafter, a detailed description will be given focusing on a case in which the pixel defining layer 118 covers the side surface of the second organic insulating layer 116, as illustrated in FIGS. 7A and 7B.

Signal lines, for example, the data lines DL described above with reference to FIG. 5, may be on the first sub-non-display area SNDA1. According to an embodiment, the data lines DL may be between the second insulating layer IL2 and the first organic insulating layer 115 and/or between the first organic insulating layer 115 and the second organic insulating layer 116. When the data lines DL are on or at different layers from each other, the width of the first non-display area NDA1 may be reduced. Although FIGS. 7A and 7B illustrate that only the data line DL is arranged in the first sub-non-display area SNDA1, the scan line bypassing the opening area OA, which has been described above with reference to FIG. 5, may also be arranged in the first sub-non-display area SNDA1.

The dam portion DP may be provided by stacking multiple layers. According to an embodiment, the dam portion DP may protrude from the upper surface of the second insulating layer IL2. According to an embodiment, the dam portion DP may include an organic pattern layer 116A, a first upper organic pattern layer 118A, and a second upper organic pattern layer 119A. The organic pattern layer 116A may be separated from or spaced from the first organic insulating layer 115 and the second organic insulating layer 116. According to an embodiment, the organic pattern layer 116A and the second organic insulating layer 116 may include a same material. According to another embodiment, the organic pattern layer 116A and the first organic insulating layer 115 may include a same material. According to another embodiment, the organic pattern layer 116A may include a first organic pattern layer and a second organic pattern layer on the first organic pattern layer. In this case, the first organic pattern layer and the first organic insulating layer 115 may include a same material. The second organic pattern layer and the second organic insulating layer 116 may include a same material.

The first upper organic pattern layer 118A may be on the organic pattern layer 116A. According to an embodiment, the first upper organic pattern layer 118A may be on the upper surface of the organic pattern layer 116A. The first upper organic pattern layer 118A may be separated from or spaced from the pixel defining layer 118. The first upper organic pattern layer 118A and the pixel defining layer 118 may include a same material.

The second upper organic pattern layer 119A may be on the first upper organic pattern layer 118A. The second upper organic pattern layer 119A may be separated from or spaced from the spacer 119. The second upper organic pattern layer 119A and the spacer 119 may include a same material.

The first insulating layer IL1 may include a first recess R1 or a first opening OP1 overlapping the first non-display area NDA1. Referring to FIG. 7A, a first opening OP1 may penetrate through the upper surface of the first insulating layer IL1 and the lower surface of the first insulating layer IL1. According to an embodiment, the first opening OP1 may overlap the opening of the buffer layer 111 and the opening of the gate insulating layer 112. Referring to FIG. 7B, the first insulating layer IL1 may be recessed in a depth or thickness direction to define the first recess R1. According to an embodiment, the first recess R1 may be defined by the upper surface of the buffer layer 111 and the opening of the gate insulating layer 112. According to another embodiment, the gate insulating layer 112 may be recessed in a depth or thickness direction to define the first recess R1. According to another embodiment, the first recess R1 may be defined by the recess of the buffer layer 111 in the depth or thickness direction and the opening of the gate insulating layer 112. The first recess R1 may be arranged closer to the opening area OA than the dam portion DP. That is, the first recess R1 may be between the opening area OA and the dam portion DP. Hereinafter, a detailed description will be given focusing on a case in which the first insulating layer IL1 includes the first opening OP1.

The first opening OP1 may be arranged closer to the opening area OA than the dam portion DP. That is, the first opening OP1 may be between the opening area OA and the dam portion DP. According to an embodiment, the first insulating layer IL1 may include at least one first opening OP1. For example, the first insulating layer IL1 may include one first opening OP1. As another example, the first insulating layer IL1 may include a plurality of first openings OP1.

The middle insulating layer MIL may include a middle opening MILOP connected to the first recess R1 or the first opening OP1. The middle opening MILOP may penetrate through the upper and lower surfaces of the middle insulating layer MIL. The middle opening MILOP may be connected to the first recess R1 or the first opening OP1.

According to an embodiment, the middle insulating layer MIL may be on the first upper surface ILUS1 of the first insulating layer IL1. For example, the first insulating layer IL1 (e.g., a portion of the first insulating layer IL1) may be between the first recess R1 or the first opening OP1 and the opening area OA, and the upper surface of the first insulating layer IL1 (e.g., the upper surface of the portion of the first insulating layer IL1) arranged between the first recess R1 or the first opening OP1 and the opening area OA may be defined or referred to as the first upper surface ILUS1 of the first insulating layer IL1. In this case, the middle insulating layer MIL (e.g., a portion of the middle insulating layer MIL) may be on the first upper surface ILUS1 of the first insulating layer IL1. The portion of the middle insulating layer MIL may be between the middle opening MILOP and the opening area OA.

The second insulating layer IL2 may include a second opening OP2. The second opening OP2 may penetrate through the upper and lower surfaces of the second insulating layer IL2. The second opening OP2 may be connected to the middle opening MILOP.

The second opening OP2 may expose the first upper surface ILUS1 of the first insulating layer IL1. According to an embodiment, the second opening OP2 may expose the second upper surface MILUS of the middle insulating layer MIL. The middle insulating layer MIL (e.g., a portion of the middle insulating layer MIL) may be between the middle opening MILOP and the opening area OA, and the upper surface of the middle insulating layer MIL (e.g., the upper surface of the portion of the middle insulating layer MIL) arranged between the middle opening MILOP and the opening area OA may be defined or referred to as the second upper surface MILUS of the middle insulating layer MIL. Alternatively, the upper surface of the middle insulating layer MIL on the first upper surface ILUS1 of the first insulating layer IL1 may be defined or referred to as the second upper surface MILUS of the middle insulating layer MIL.

According to an embodiment, the second insulating layer IL2 may include a groove between (e.g., between in the x direction) the organic pattern layer 116A and the first organic insulating layer 115. The groove may be formed by over-etching the second insulating layer IL2. In other words, the groove may be formed in the second insulating layer IL2. According to some embodiments, the groove may not be provided.

The first functional layer 212a, the second functional layer 212c, the second electrode 213, and the capping layer 215 may extend from the display area DA to the first non-display area NDA1. According to an embodiment, the first functional layer 212a, the second functional layer 212c, the second electrode 213, and the capping layer 215 may cover the dam portion DP, and may extend to the first opening OP1 or the first recess R1. Therefore, the first functional layer 212a, the second functional layer 212c, the second electrode 213, and the capping layer 215 may be within the first opening OP1 or the first recess R1, and may overlap the first recess R1 or the first opening OP1.

The first functional layer 212a, the second functional layer 212c, the second electrode 213, and the capping layer 215 may be disconnected from the first non-display area NDA1. According to an embodiment, each of the first functional layer 212a, the second functional layers 212c, the second electrode 213, and the capping layer 215 may include the transmission hole TAH exposing the first upper surface ILUS1 of the first insulating layer IL1. Specifically, at least one of the first functional layer 212a or the second functional layer 212c may include a first transmission hole TAH1 exposing the first upper surface ILUS1 of the first insulating layer IL1. The second electrode 213 may include a second transmission hole TAH2 exposing the first upper surface ILUS1 of the first insulating layer IL1. The capping layer 215 may include a third transmission hole TAH3 exposing the first upper surface ILUS1 of the first insulating layer IL1. Also, according to an embodiment, each of the first transmission hole TAH1, the second transmission hole TAH2, and the third transmission hole TAH3 may expose the second upper surface MILUS of the middle insulating layer MIL.

The area of the transmission hole TAH may be greater than the area of the opening area OA. When at least one of the first functional layer 212a or the second functional layer 212c each including an organic material is entirely formed in the first non-display area NDA1 and extends to the opening area OA, moisture may infiltrate toward the organic light-emitting diode OLED arranged in the display area DA through the first functional layer 212a and the second functional layer 212c due to the characteristics of the organic material layer. According to the present embodiment, the first functional layer 212a and the second functional layer 212c may be arranged in the first recess R1 or the first opening OP1, and the first transmission hole TAH1 exposing the first upper surface ILUS1 of the first insulating layer IL1 may be formed. Therefore, according to the present embodiment, it may be possible to prevent or reduce infiltration of a foreign material or moisture into the organic light-emitting diode OLED by at least one of the first functional layer 212a or the second functional layer 212c.

The encapsulation layer ENL may cover the organic light-emitting diode OLED. The encapsulation layer ENL may be on the second electrode 213 and/or the capping layer 215. According to an embodiment, the encapsulation layer ENL may include at least one inorganic encapsulation layer and at least one organic encapsulation layer. FIGS. 7A and 7B illustrate that the encapsulation layer ENL includes a first inorganic encapsulation layer 310, an organic encapsulation layer 320, and a second inorganic encapsulation layer 330, which are stacked (e.g., sequentially stacked).

The first inorganic encapsulation layer 310 and the second inorganic encapsulation layer 330 may extend from the display area DA to the first non-display area NDA1. The first inorganic encapsulation layer 310 and the second inorganic encapsulation layer 330 may be entirely and continuously arranged in the first non-display area NDA1. According to an embodiment, the first inorganic encapsulation layer 310 and the second inorganic encapsulation layer 330 may extend continuously in the display area DA and in the first non-display area NDA1. The first inorganic encapsulation layer 310 and the second inorganic encapsulation layer 330 may extend to the dam portion DP and may come in contact with each other on the upper surface of the dam portion DP. The first inorganic encapsulation layer 310 and the second inorganic encapsulation layer 330 may cover the first recess R1 or the first opening OP1, and may extend to the opening area OA.

The first inorganic encapsulation layer 310 and the second inorganic encapsulation layer 330 may overlap the transmission hole TAH. Specifically, the first inorganic encapsulation layer 310 and the second inorganic encapsulation layer 330 may overlap the first transmission hole TAH1, the second transmission hole TAH2, and the third transmission hole TAH3. In this case, the first inorganic encapsulation layer 310 may overlap the first recess R1 or the first opening OP1, and may come in contact with the second upper surface MILUS of the middle insulating layer MIL adjacent to the opening area OA. According to an embodiment, the first inorganic encapsulation layer 310 may contact the second inorganic encapsulation layer 330 and may be between the second inorganic encapsulation layer 330 and the second upper surface MILUS of the middle insulating layer MIL. Therefore, because the organic material layer is not on the second upper surface MILUS of the middle insulating layer MIL, it is possible to prevent or reduce infiltration of moisture toward the organic light-emitting diode OLED arranged in the display area DA.

The organic encapsulation layer 320 may be formed by applying and curing a monomer. The flow of the monomer may be controlled by the dam portion DP. That is, the end portion of the organic encapsulation layer 320 may be located at one side of the dam portion DP.

Figure 8:
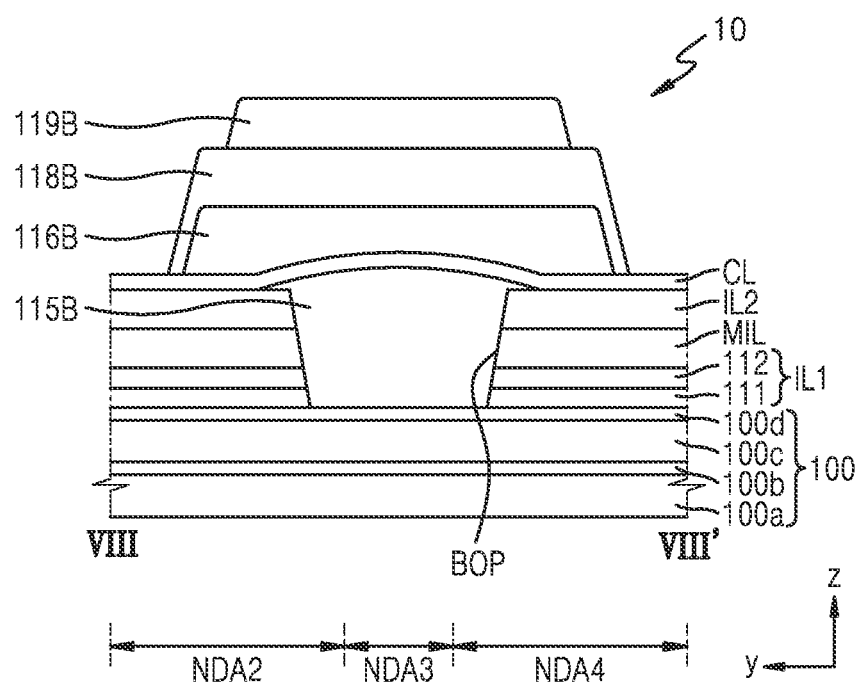
FIG. 8 is a schematic cross-sectional view of the display panel taken along the line VIII-VIII' of FIG. 3, according to an embodiment.

FIG. 8 is a schematic cross-sectional view of the display panel 10 taken along the line VIII-VIII' of FIG. 3, according to an embodiment. In FIG. 8, the same reference numerals as those in FIG. 7A refer to the same members, and redundant descriptions thereof may not be repeated.

Referring to FIG. 8, the display panel 10 may include a substrate 100, a first insulating layer IL1, a middle insulating layer MIL, a second insulating layer IL2, a connection line CL, and bending organic layers 115B, 116B, 118B, and 119B.

The substrate 100 may include a second non-display area NDA2, a third non-display area NDA3, and a fourth non-display area NDA4. The third non-display area NDA3 may be a bending area, and the fourth non-display area NDA4 may be a pad area. The third non-display area NDA3 may be between the fourth non-display area NDA4 and the second non-display area NDA2.

The first insulating layer IL1, the middle insulating layer MIL, and the second insulating layer IL2 may be arranged in the second non-display area NDA2 and the fourth non-display area NDA4. Each of the first insulating layer IL1, the middle insulating layer MIL, and the second insulating layer IL2 may include a bending opening BOP exposing the third non-display area NDA3 of the substrate 100. That is, a portion of the first insulating layer IL1, a portion of the middle insulating layer MIL, and a portion of the second insulating layer IL2 may be respectively separated from or spaced from another portion of the first insulating layer IL1, another portion of the middle insulating layer MIL, and another portion of the second insulating layer IL2 based on the third non-display area NDA3. Therefore, the display panel 10 may be bent while preventing or substantially preventing excessive tensile stress from being applied in the third non-display area NDA3, which is the bending area.

The bending opening BOP may be formed by overlapping the opening of the first insulating layer IL1, the opening of the middle insulating layer MIL, and the opening of the second insulating layer IL2, which overlap the third non-display area NDA3. In other words, the bending opening BOP may include the opening of the first insulating layer IL1, the opening of the middle insulating layer MIL, and the opening of the second insulating layer IL2. In this case, FIG.

8 illustrates that the inner surface of the opening of the first insulating layer IL1, the inner surface of the opening of the middle insulating layer MIL, and the inner surface of the opening of the second insulating layer IL2 coincide with each other, but according to an another embodiment, the inner surface of the opening of the first insulating layer IL1, the inner surface of the opening of the middle insulating layer MIL, and the inner surface of the opening of the second insulating layer IL2 may not coincide with each other. In this case, the bending opening BOP may have a step.

According to an embodiment, the width of the bending opening BOP may be greater than the width of the third non-display area NDA3. In this case, according to an embodiment, the width of the bending opening BOP may be defined as or refer to the shortest distance between facing surfaces of the buffer layer 111 defining the bending opening BOP.

The first bending organic layer 115B may be arranged in the bending opening BOP. In this case, the first bending organic layer 115B may fill the bending opening BOP. Therefore, the first bending organic layer 115B may overlap the bending opening BOP. According to an embodiment, the first bending organic layer 115B and the first organic insulating layer (e.g., see the first organic insulating layer 115 of the embodiment shown in FIG. 7A) may include a same material.

The connection line CL may overlap the third non-display area NDA3, and the connection line CL may extend from the second non-display area NDA2 to the fourth non-display area NDA4. According to an embodiment, the connection line CL may be on the upper surface of the second insulating layer IL2 and the upper surface of the first bending organic layer 115B. According to an embodiment, the connection line CL and the connection electrode CM of FIG. 7A may include a same material. The connection line CL may be configured to transmit, to the pixel arranged in the display area, a signal transmitted from the display driver or the display circuit board arranged in the fourth non-display area NDA4, which is the pad area.

The second bending organic layer 116B, the third bending organic layer 118B, and the fourth bending organic layer 119B may overlap the third non-display area NDA3, and may be stacked (e.g., sequentially stacked). According to an embodiment, the second bending organic layer 116B and the second organic insulating layer (e.g., see the second organic insulating layer 116 of the embodiment shown in FIG. 7A) may include a same material. The third bending organic layer 118B and the pixel defining layer (e.g., see the pixel defining layer 118 of the embodiment shown in FIG. 7A) may include a same material. The fourth bending organic layer 119B and the spacer (e.g., see the spacer 119 of the embodiment shown in FIG. 7A) may include a same material. When the display panel 10 is bent, the first bending organic layer 115B, the second bending organic layer 116B, the third bending organic layer 118B, and the fourth bending organic layer 119B may prevent or reduce the damage to the connection line CL due to tensile stress.

FIGS. 9A-9K are cross-sectional views illustrating a method of manufacturing a display device, according to an embodiment.

Figure 9A:
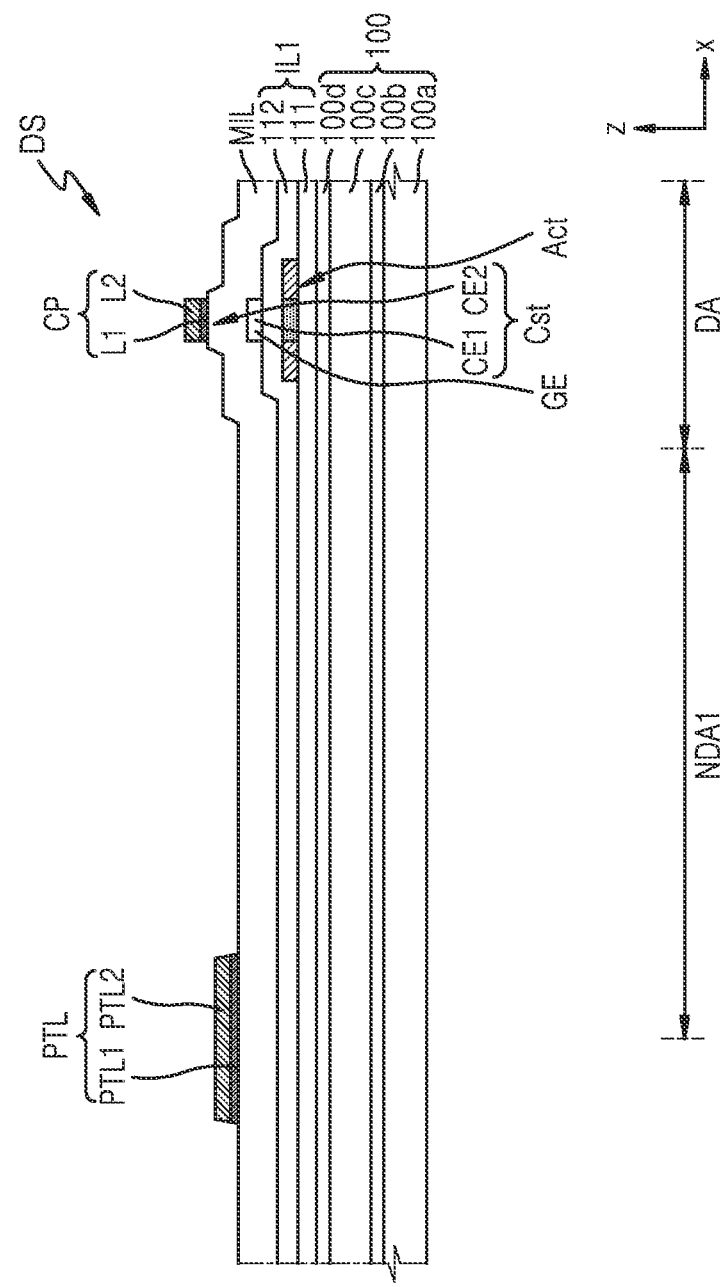
FIGS. 9A-9K are cross-sectional views illustrating a method of manufacturing a display device, according to an embodiment.

Referring to FIG. 9A, a display substrate DS may be prepared. The display substrate DS may include a substrate 100 and a first insulating layer IL1. The first insulating layer IL1 may be on a display area DA and a first non-display area NDA1.

The display substrate DS may include a semiconductor layer Act and a gate electrode GE. The semiconductor layer Act may be between the buffer layer 111 and the gate insulating layer 112. The gate electrode GE may be on the gate insulating layer 112.

A middle insulating layer MIL may be formed on the first insulating layer IL1. The middle insulating layer MIL may be arranged in the display area DA and the first non-display area NDA1, and may cover the gate electrode GE.

A conductive pattern CP may be formed on the first insulating layer IL1. According to an embodiment, after the middle insulating layer MIL is formed, the conductive pattern CP may be formed on the middle insulating layer MIL. The conductive pattern CP may include a first layer L1 and a second layer L2 on the first layer L1. According to an embodiment, the thickness of the first layer L1 may be less than the thickness of the second layer L2.

According to an embodiment, the first layer L1 may include titanium (Ti). According to another embodiment, the first layer L1 may include amorphous silicon to which a dopant is added. The second layer L2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

A pattern layer PTL may be formed on the first non-display area NDA1. According to an embodiment, the pattern layer PTL may be formed on the first insulating layer IL1. According to an embodiment, after the middle insulating layer MIL is formed, the pattern layer PTL may be formed on the middle insulating layer MIL. According to an embodiment, the pattern layer PTL may include a lower pattern layer PTL1 and an upper pattern layer PTL2 on the lower pattern layer PTL1. According to an embodiment, the thickness of the lower pattern layer PTL1 may be less than the thickness of the upper pattern layer PTL2.

The lower pattern layer PTL1 and the first layer L1 of the conductive pattern CP may include a same material. The upper pattern layer PTL2 and the second layer L2 of the conductive pattern CP may include a same material.

The pattern layer PTL may be formed concurrently (e.g., simultaneously) with the conductive pattern CP. Specifically, the conductive layer may be continuously formed on the middle insulating layer MIL and then patterned to form the pattern layer PTL and the conductive pattern CP.

Figure 9B:
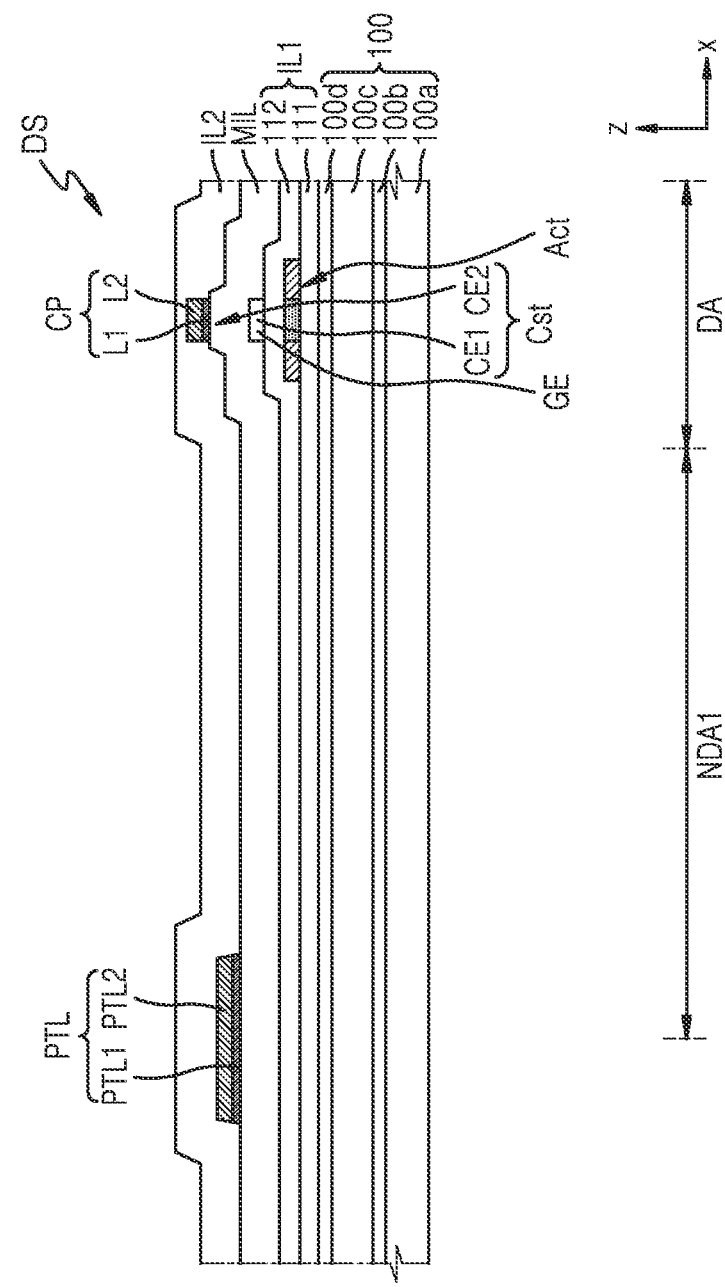

Referring to FIG. 9B, a second insulating layer IL2 may be formed. The second insulating layer IL2 may be formed in the display area DA and the first non-display area NDA1. The second insulating layer IL2 may be formed on the middle insulating layer MIL. The second insulating layer IL2 may cover the conductive pattern CP and the pattern layer PTL.

Figure 9C:
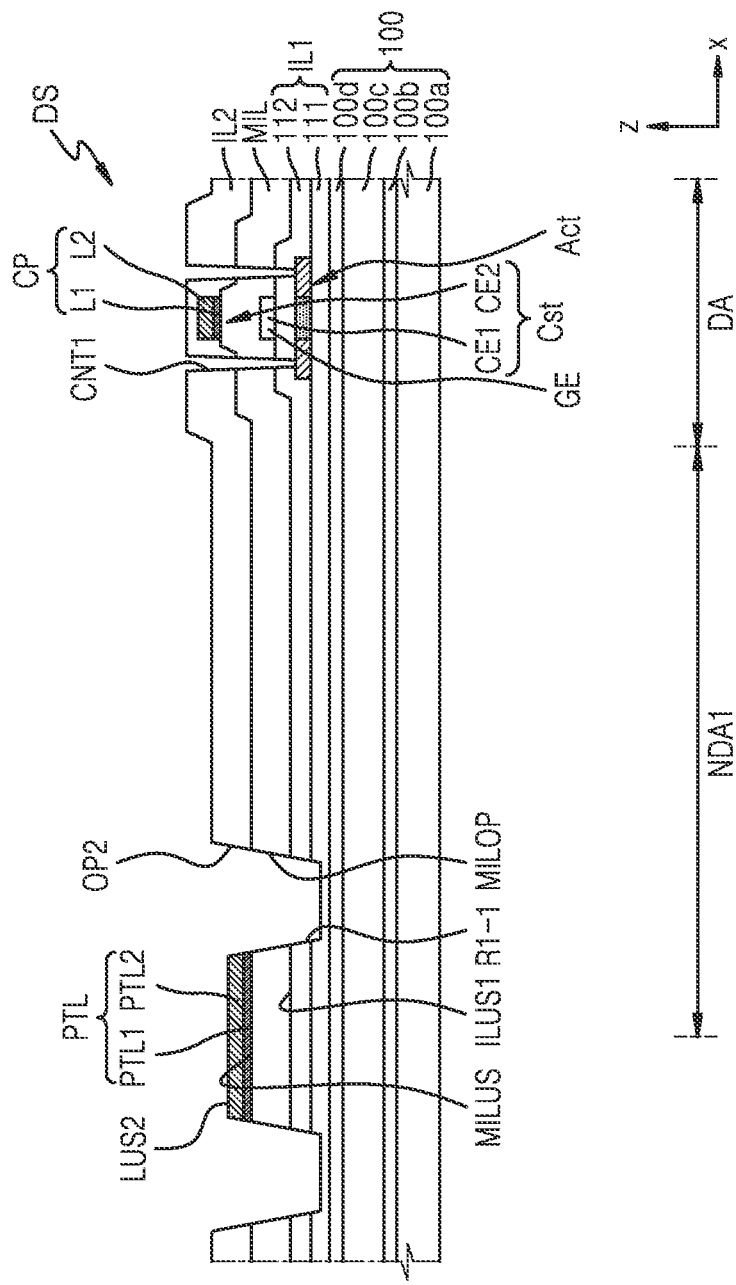

Referring to FIG. 9C, the first insulating layer IL1, the middle insulating layer MIL, and the second insulating layer IL2 may be partially removed. According to an embodiment, the first insulating layer IL1, the middle insulating layer MIL, and the second insulating layer IL2 may be partially etched.

The first insulating layer IL1, the middle insulating layer MIL, and the second insulating layer IL2 may be partially removed to form a first contact hole CNT1. The first contact hole CNT1 may expose a portion of the semiconductor layer Act.

A second opening OP2 may be formed in the second insulating layer IL2. The second opening OP2 may expose the pattern layer PTL. The second opening OP2 may expose the upper surface LUS2 of the upper pattern layer PTL2.

According to an embodiment, the width of the second opening OP2 may be greater than the width of the pattern layer PTL.

A middle opening MILOP may be formed in the middle insulating layer MIL. The middle opening MILOP may be formed around or adjacent to the pattern layer PTL. According to an embodiment, a plurality of middle openings MILOP may be formed around the pattern layer PTL. The pattern layer PTL may prevent or substantially prevent the middle insulating layer MIL (e.g., the portion of the middle insulating layer MIL) under or covered by the pattern layer PTL from being etched. According to an embodiment, the middle opening MILOP may be formed when the second opening OP2 of the second insulating layer IL2 is formed.

A first recess R1-1 may be formed in the first insulating layer IL1. The first recess R1-1 may be formed around the pattern layer PTL. According to an embodiment, a plurality of first recesses R1-1 may be formed around the middle opening MILOP. The pattern layer PTL may prevent or substantially prevent the first insulating layer IL1 under the pattern layer PTL from being etched. The first recess R1-1 may be defined by the opening of the gate insulating layer 112 and the recess of the buffer layer 111.

The first recess R1-1 may be connected to the middle opening MILOP of the middle insulating layer MIL. According to an embodiment, when a plurality of first recesses R1-1 and a plurality of middle openings MILOP are provided, the first recesses R1-1 may be respectively connected to the middle openings MILOP.

According to an embodiment, the first contact hole CNT1 exposing the semiconductor layer Act and the second opening OP2 exposing the pattern layer PTL may be formed in the same process. Therefore, the pattern layer PTL may be exposed without an additional mask process.

Figure 9D:
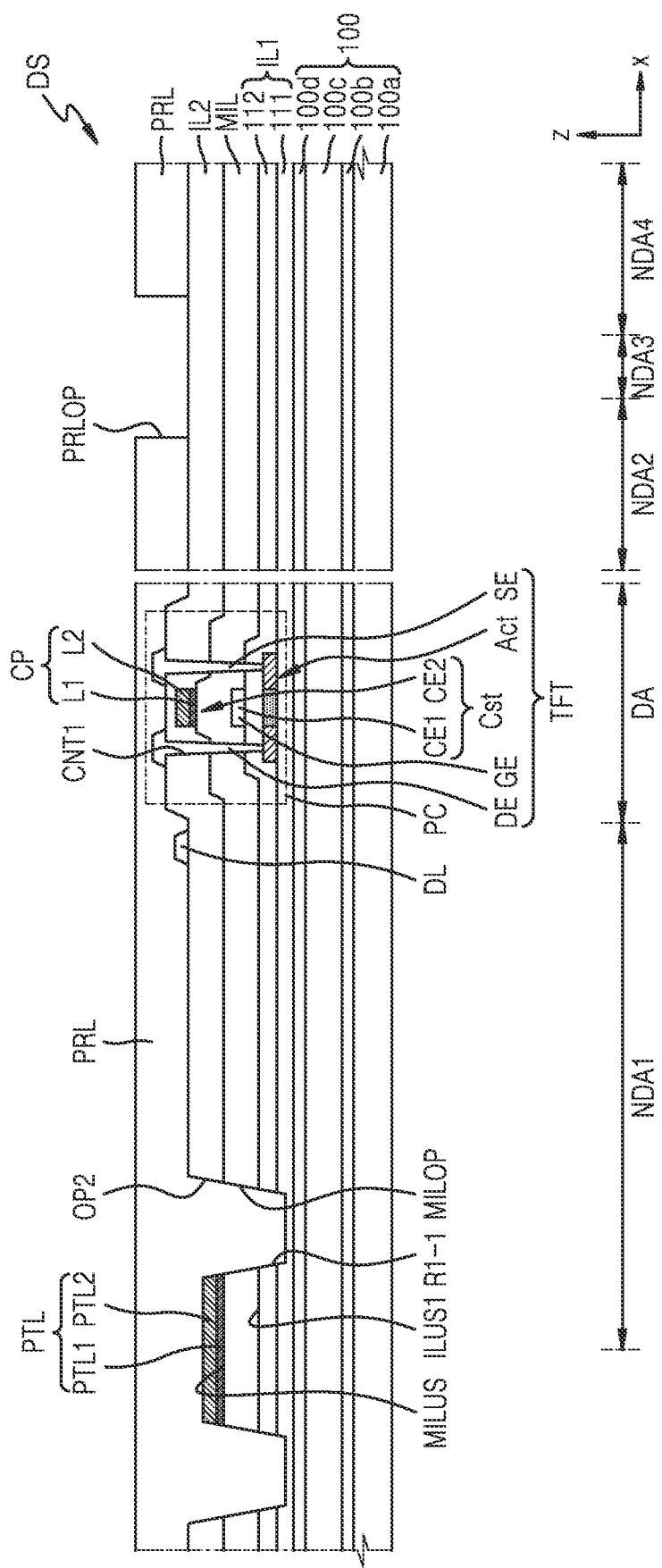

Referring to FIG. 9D, a source electrode SE, a drain electrode DE, and a data line DL may be formed. The source electrode SE and the drain electrode DE are formed on the middle insulating layer MIL, and may be connected to the semiconductor layer Act through the first contact hole CNT1. In one or more embodiments, the source electrode SE and the drain electrode DE are formed on the second insulating layer IL2, and may be connected to the semiconductor layer Act through the first contact hole CNT1 extending through the second insulating layer IL2, the middle insulating layer MIL, and the gate insulating layer 112. The data line DL may be formed on the middle insulating layer MIL. For example, the data line DL may be formed on the middle insulating layer MIL with the second insulating layer IL2 therebetween.

A photoresist layer PRL including a photoresist opening PRLOP may be formed. A photoresist solution may be applied onto the display substrate DS. The photoresist solution may cover the first recess R1-1, the middle opening MILOP, the second opening OP2, the pattern layer PTL, the data line DL, the source electrode SE, the drain electrode DE, and the second insulating layer IL2. The photoresist solution may be formed as a positive type or a negative type. In the case of a positive type photoresist solution, portions of the positive photoresist solution exposed to light may be removed (e.g., etched) in a subsequent develop process. In the case of a negative type photoresist solution, portions of the negative photoresist solution other than the portions of the negative photoresist solution exposed to light may be removed (e.g., etched) in a subsequent develop process. Hereinafter, a detailed description will be given focusing on a case in which the photoresist solution is a positive type.

The photoresist solution may be applied by various suitable methods such as spin-coating, slit-coating, spraying, or immersion.

The photoresist layer PRL may be exposed. In this case, at least a portion of the photoresist layer PRL may be exposed. For example, when a photo mask is used, a region of the photoresist layer PRL overlapping an opening of the photo mask may be exposed. According to an embodiment, the opening of the photo mask may be arranged to overlap the third non-display area NDA3, and the photoresist layer PRL arranged in the third non-display area NDA3 may be exposed.

A portion of the photoresist layer PRL may be removed through a develop process. Therefore, a photoresist opening PRLOP overlapping the third non-display area NDA3 may be formed. According to an embodiment, the photoresist opening PRLOP may be formed to overlap the third non-display area NDA3, a portion of the second non-display area NDA2, and a portion of the fourth non-display area NDA4.

Figure 9E:
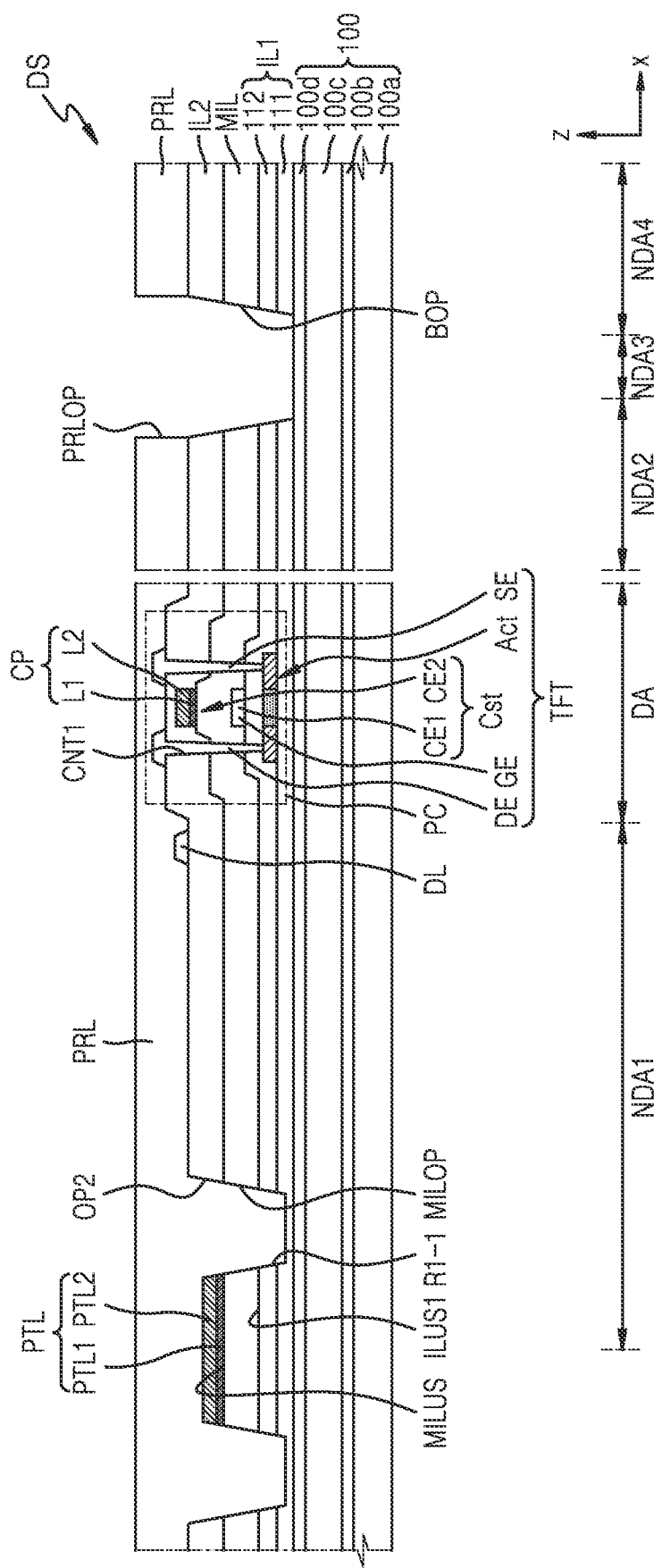

Referring to FIG. 9E, the first insulating layer IL1, the middle insulating layer MIL, and the second insulating layer IL2, which overlap the photoresist opening PRLOP, may be etched. Therefore, a bending opening BOP overlapping the third non-display area NDA3 may be formed. In this case, because the photoresist layer PRL is arranged in the display area DA and the first non-display area NDA1, it is possible to prevent or substantially prevent the insulating layers under the photoresist layer PRL from being etched.

The photoresist layer PRL may be removed or stripped through a develop process. Therefore, the photoresist layer PRL may be removed or stripped from the display substrate DS.

Figure 9F:
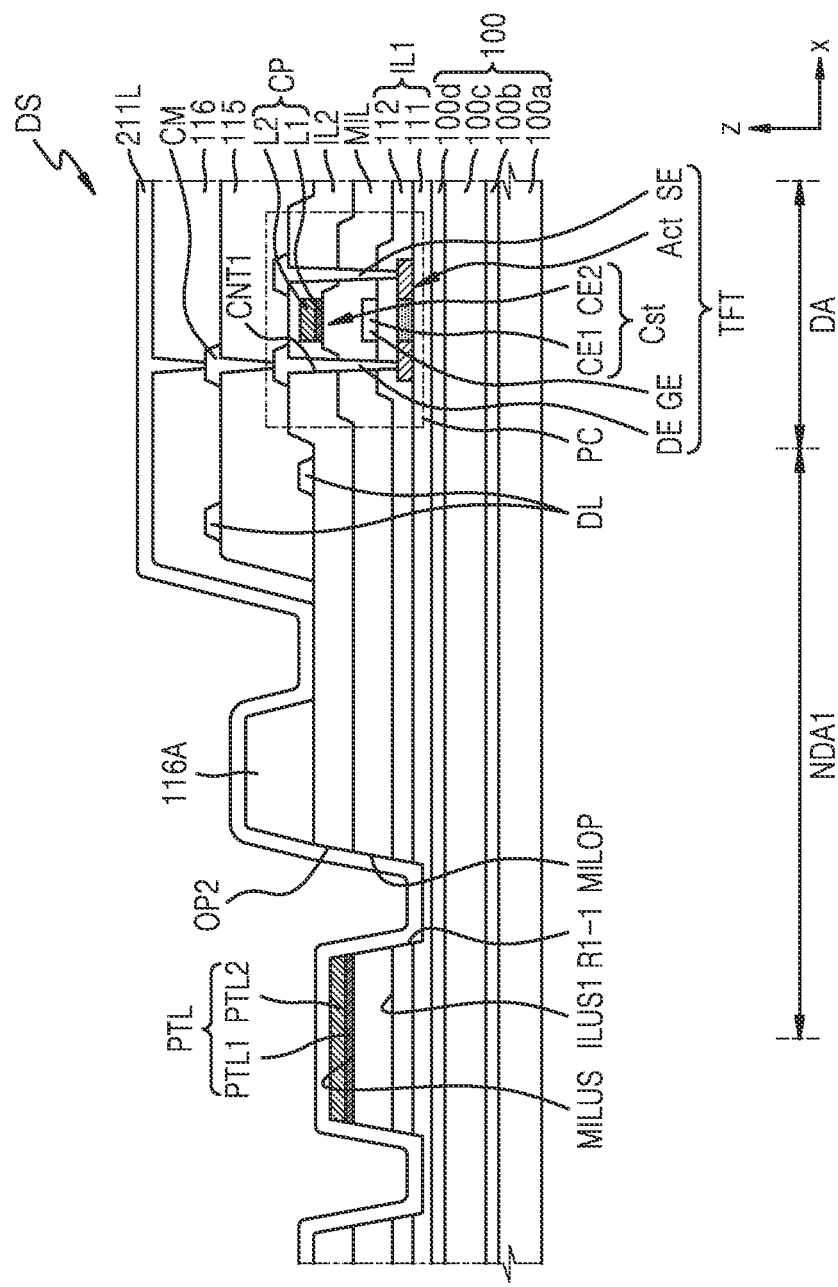

Referring to FIG. 9F, a first organic insulating layer 115 may be formed. The first organic insulating layer 115 may be formed by applying an organic material onto the entire display substrate DS and performing a photocuring process and a patterning process thereon.

A connection electrode CM may be formed, and a second organic insulating layer 116 and an organic pattern layer 116A may be formed. The second organic insulating layer 116 and the organic pattern layer 116A may be formed by applying an organic material on the entire display substrate DS and performing a photocuring process and a patterning process thereon. In this case, the second organic insulating layer 116 and the organic pattern layer 116A may include a same material and may be formed at the same time. According to some embodiments, the organic pattern layer 116A may be formed concurrently (e.g., simultaneously) when the first organic insulating layer 115 is formed.

A conductive layer 211L may be formed on the pattern layer PTL and the display area DA. The conductive layer 211L may be formed to cover the upper pattern layer PTL2. The conductive layer 211L may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the conductive layer 211L may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. According to another embodiment, the conductive layer 211L may further include a layer including ITO, IZO, ZnO, or $In_2O_3$ above and/or below the reflective layer. For example, the conductive layer 211L may have a multiple layer structure of ITO/Ag/ITO.

Figure 9G:
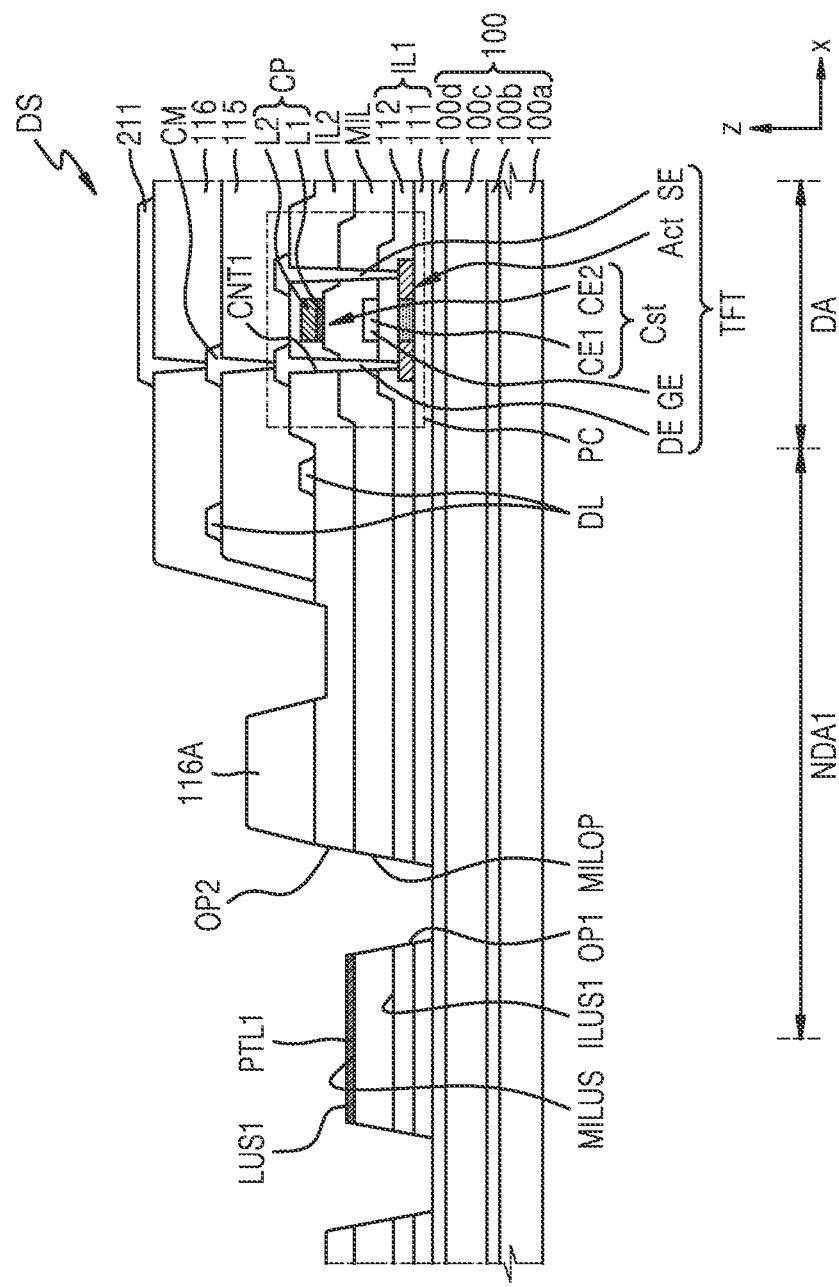

Referring to FIG. 9G, the conductive layer 211L may be patterned to form a first electrode 211. Also, according to an embodiment, the upper pattern layer PTL2 may be removed. According to an embodiment, after the conductive layer 211L is etched, the upper pattern layer PTL2 may be etched. Therefore, the conductive layer 211L and the upper pattern layer PTL2 may be removed to expose the lower pattern layer PTL1. In this case, the upper surface LUS1 of the lower pattern layer PTL1 may be exposed to the outside. All the pattern layers PTL may be unsuitable for use as a sacrificial layer for a laser lift-off process. According to the present embodiment, the upper pattern layer PTL2 may be removed, and only the lower pattern layer PTL1 is left to optimize the laser lift-off process.

According to an embodiment, when the conductive layer 211L and the upper pattern layer PTL2 are removed, a first opening OP1 may be formed. The first opening OP1 may be formed by over-etching the first insulating layer IL1 when the conductive layer 211L and the upper pattern layer PTL2 are removed. According to another embodiment, when the conductive layer 211L and the upper pattern layer PTL2 are removed, the buffer layer 111 may be over-etched. In this case, the depth of the first recess may become deeper.

According to an embodiment, when the conductive layer 211L and the upper pattern layer PTL2 are removed, a portion of the second insulating layer IL2 may be over-etched. For example, when the conductive layer 211L and the upper pattern layer PTL2 are removed, the second insulating layer IL2 between (e.g., between in the x direction) the organic pattern layer 116A and the first organic insulating layer 115 may be over-etched. In this case, a groove may be formed (e.g., formed in the second insulating layer IL2) between the organic pattern layer 116A and the first organic insulating layer 115. According to some embodiments, a groove may not be formed (e.g., not be formed in the second insulating layer IL2) between the organic pattern layer 116A and the first organic insulating layer 115.

Figure 9H:
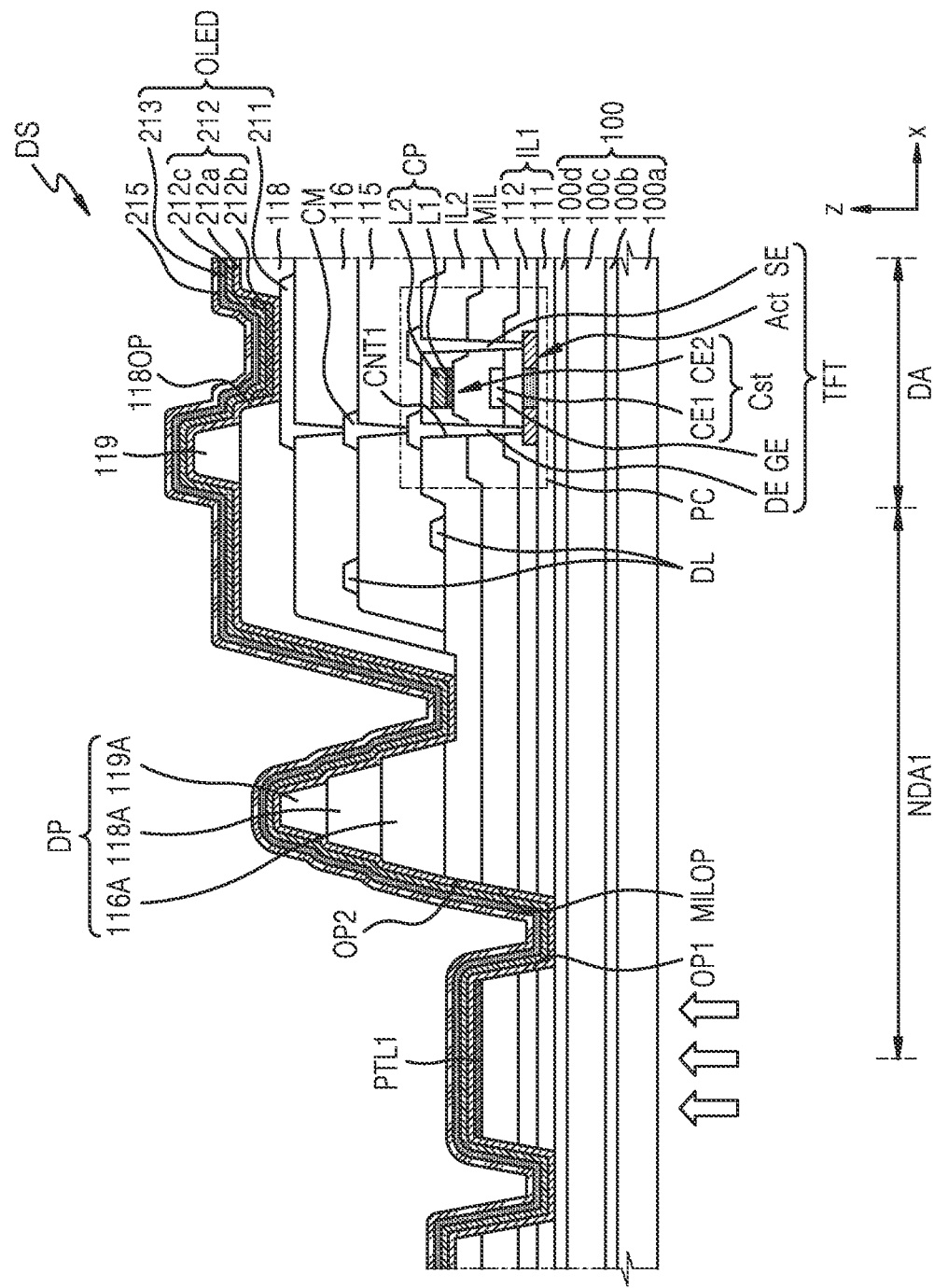

Referring to FIG. 9H, a pixel defining layer 118 having an opening 118OP exposing a central portion of the first electrode 211 may be formed on the first electrode 211, and a spacer 119 may be formed on the pixel defining layer 118.

A first upper organic pattern layer 118A and a second upper organic pattern layer 119A may be formed on the organic pattern layer 116A. According to an embodiment, the first upper organic pattern layer 118A may be formed concurrently (e.g., simultaneously) with the pixel defining layer 118. According to an embodiment, when the first upper organic pattern layer 118A and the pixel defining layer 118 include an organic material, the first upper organic pattern layer 118A and the pixel defining layer 118 may be formed by applying an organic material onto the entire substrate 100 and performing a photocuring process and a patterning process thereon. In this case, the first upper organic pattern layer 118A and the pixel defining layer 118 may include a same material. According to an embodiment, the second upper organic pattern layer 119A may be formed concurrently (e.g., simultaneously) with the spacer 119. When the second upper organic pattern layer 119A and the spacer 119 include an organic material, the second upper organic pattern layer 119A and the spacer 119 may be formed by applying an organic material onto the entire substrate 100 and performing a photocuring process and a patterning process thereon. In this case, the second upper organic pattern layer 119A and the spacer 119 may include a same material.

A second electrode 213 and at least one of a first functional layer 212a or a second functional layer 212c may be formed. Specifically, the first functional layer 212a, an emission layer 212b, the second functional layer 212c, the second electrode 213, and a capping layer 215 may be sequentially formed on the entire display substrate DS. The emission layer 212b may overlap the first electrode 211. The first functional layer 212a, the second functional layer 212c, the second electrode 213, and the capping layer 215 may be stacked (e.g., sequentially stacked) on the lower pattern layer PTL1.

The second electrode 213 and at least one of the first functional layer 212a or the second functional layer 212c on the lower pattern layer PTL1 may be removed. According to an embodiment, laser light may be irradiated on the lower pattern layer PTL1. Specifically, the laser light may travel in the thickness direction of the substrate 100 from the lower surface of the substrate 100 and may be irradiated on the lower surface of the lower pattern layer PTL1. The laser light may have an infrared wavelength. When the laser light is infrared light, the transmittance of the laser light with respect to the substrate 100, the first insulating layer IL1, and the middle insulating layer MIL is about 80% to about 90% or greater, the laser light may efficiently reach the lower pattern layer PTL1.

Because the lower pattern layer PTL1 includes an opaque metal, the lower pattern layer PTL1 may absorb the laser light. According to an embodiment, at least a portion of the lower pattern layer PTL1 may be thermally expanded and lifted off from the middle insulating layer MIL.

Figure 9I:
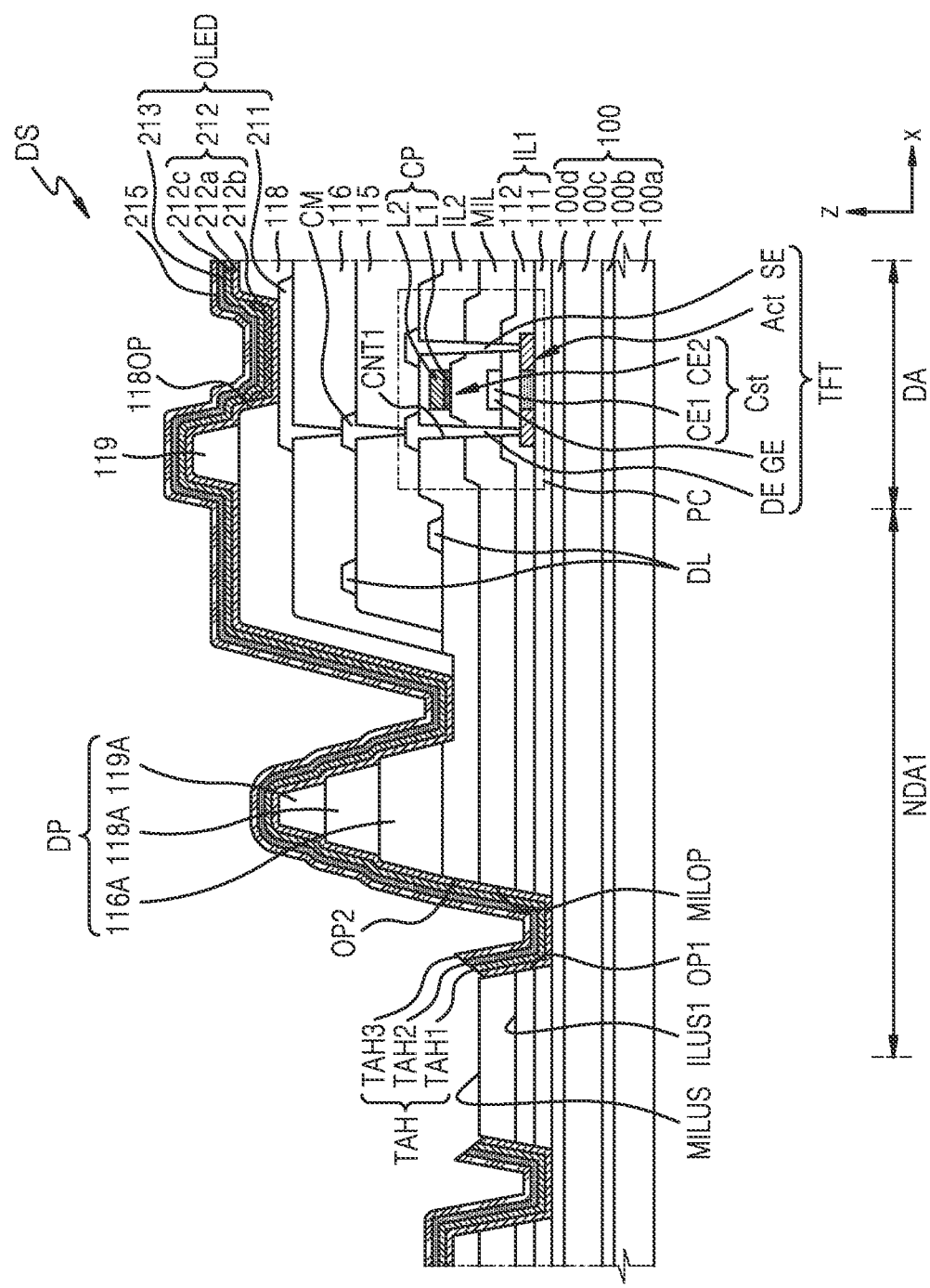

Referring to FIG. 9I, when the lower pattern layer PTL1 includes titanium (Ti), the first functional layer 212a, the second functional layer 212c, the second electrode 213, and the capping layer 215 may be lifted off together with the lower pattern layer PTL1. Therefore, a first transmission hole TAH1 exposing the second upper surface MILUS of the middle insulating layer MIL may be formed in the first functional layer 212a and the second functional layer 212c. A second transmission hole TAH2 exposing the second upper surface MILUS of the middle insulating layer MIL may be formed in the second electrode 213. A third transmission hole TAH3 exposing the second upper surface MILUS of the middle insulating layer MIL may be formed in the capping layer 215. Also, the first transmission hole TAH1, the second transmission hole TAH2, and the third transmission hole TAH3 may expose the first upper surface ILUS1 of the first insulating layer IL1.

The melting point of the material forming the lower pattern layer PTL1 may be higher than the melting point of the material forming the second electrode 213. As a comparative example, when the lower pattern layer PTL1 includes silver (Ag), the lower pattern layer PTL1 may be lifted off before the second electrode 213 on the lower pattern layer PTL1 is melted, and silver (Ag) of the second electrode 213 is bonded thereto. This may act as a foreign material. The foreign material may be arranged around the lower pattern layer PTL1, for example, in the dam portion DP. In this case, the foreign material may damage the encapsulation layer and may form an inflow passage for moisture or the like. Therefore, the organic light-emitting diode OLED may be damaged.

According to the present embodiment, the lower pattern layer PTL1 may include a material having a melting point higher than that of the second electrode 213. The second electrode 213 may be first melted, and the lower pattern layer PTL1 may be lifted off. Therefore, a foreign material such as, for example, silver (Ag) particles may not be generated.

Also, according to the present embodiment, because the lower pattern layer PTL1 may be formed concurrently (e.g., simultaneously) with the conductive pattern CP, a process time may be shortened, and a mask process may not be added.

Figure 9J:
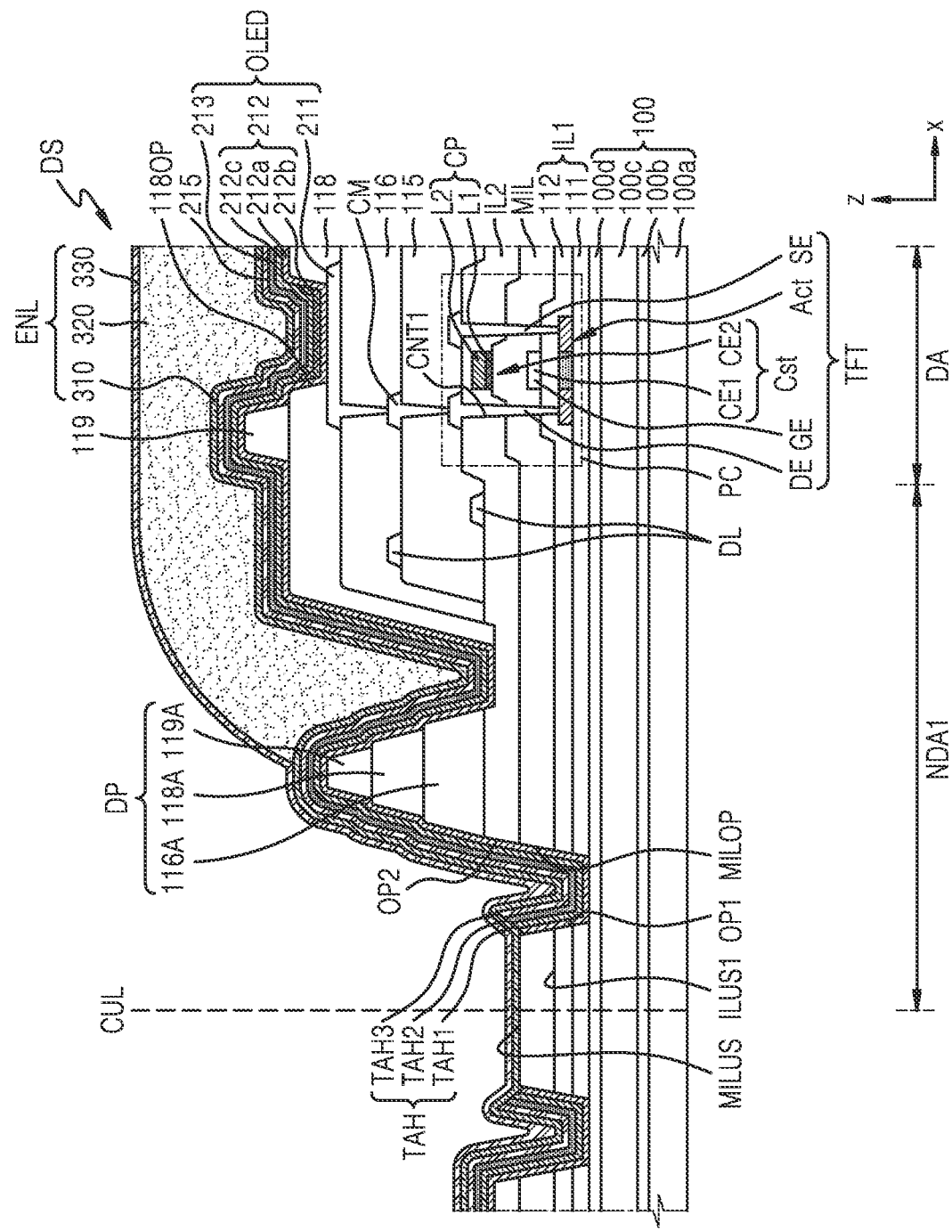
Figure 9K:
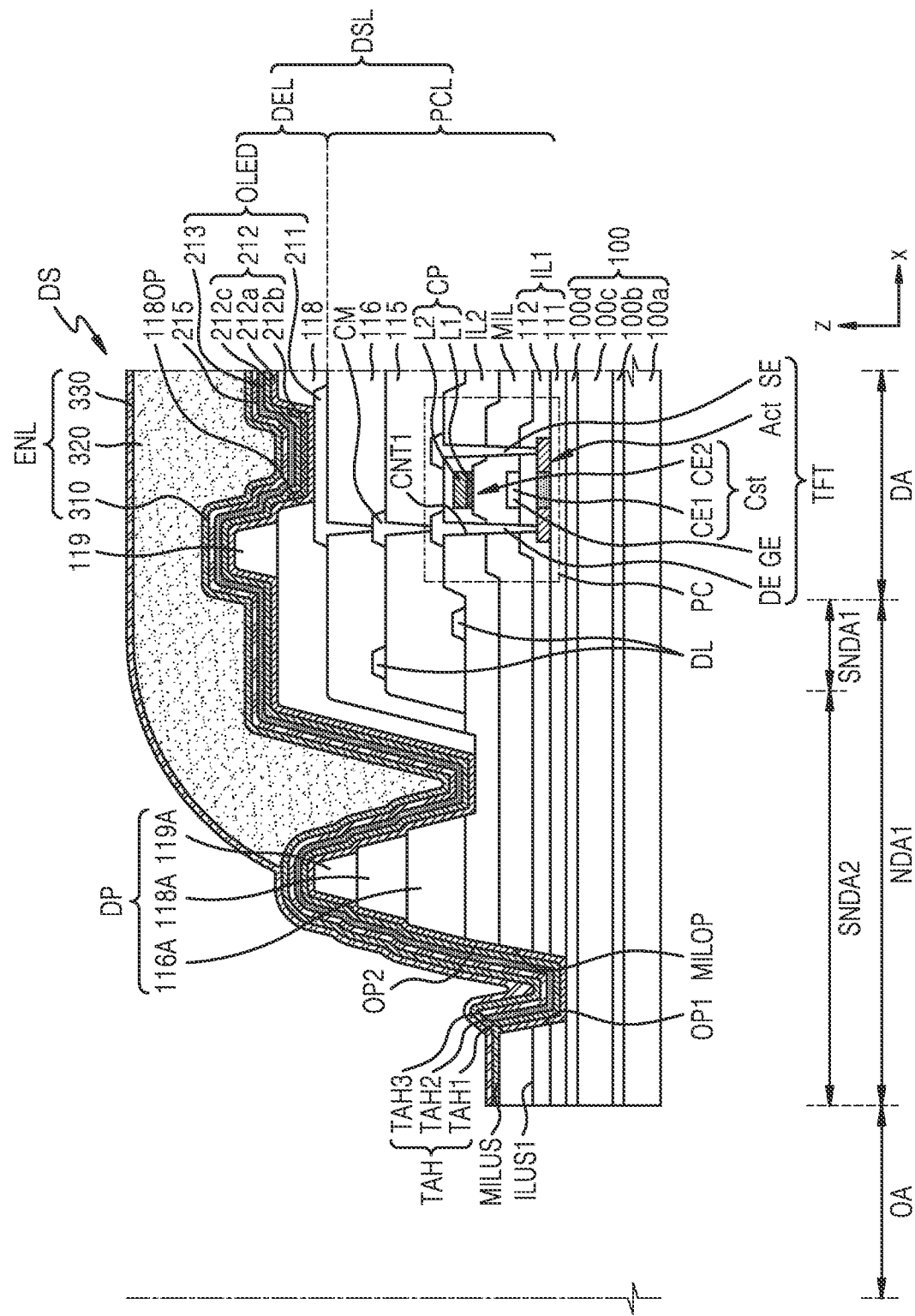

Referring to FIGS. 9J and 9K, an encapsulation layer ENL may be formed. The encapsulation layer ENL may include a first inorganic encapsulation layer 310, an organic encapsulation layer 320, and a second inorganic encapsulation layer 330. The first inorganic encapsulation layer 310 and the second inorganic encapsulation layer 330 may extend from the display area DA to the transmission hole TAH to overlap the transmission hole TAH. Therefore, the first inorganic encapsulation layer 310 may come in contact with the second upper surface MILUS of the middle insulating layer MIL.

The opening area OA may be formed by removing the substrate 100 and the first insulating layer IL1 thereon along a cutting line CUL. According to the present embodiment, because the first functional layer 212a, the second functional layer 212c, the second electrode 213, and the capping layer 215 are not exposed to the outside on the opening area OA, it is possible to prevent or reduce infiltration of moisture through at least one of the first functional layer 212a or the second functional layer 212c.

Figure 10:
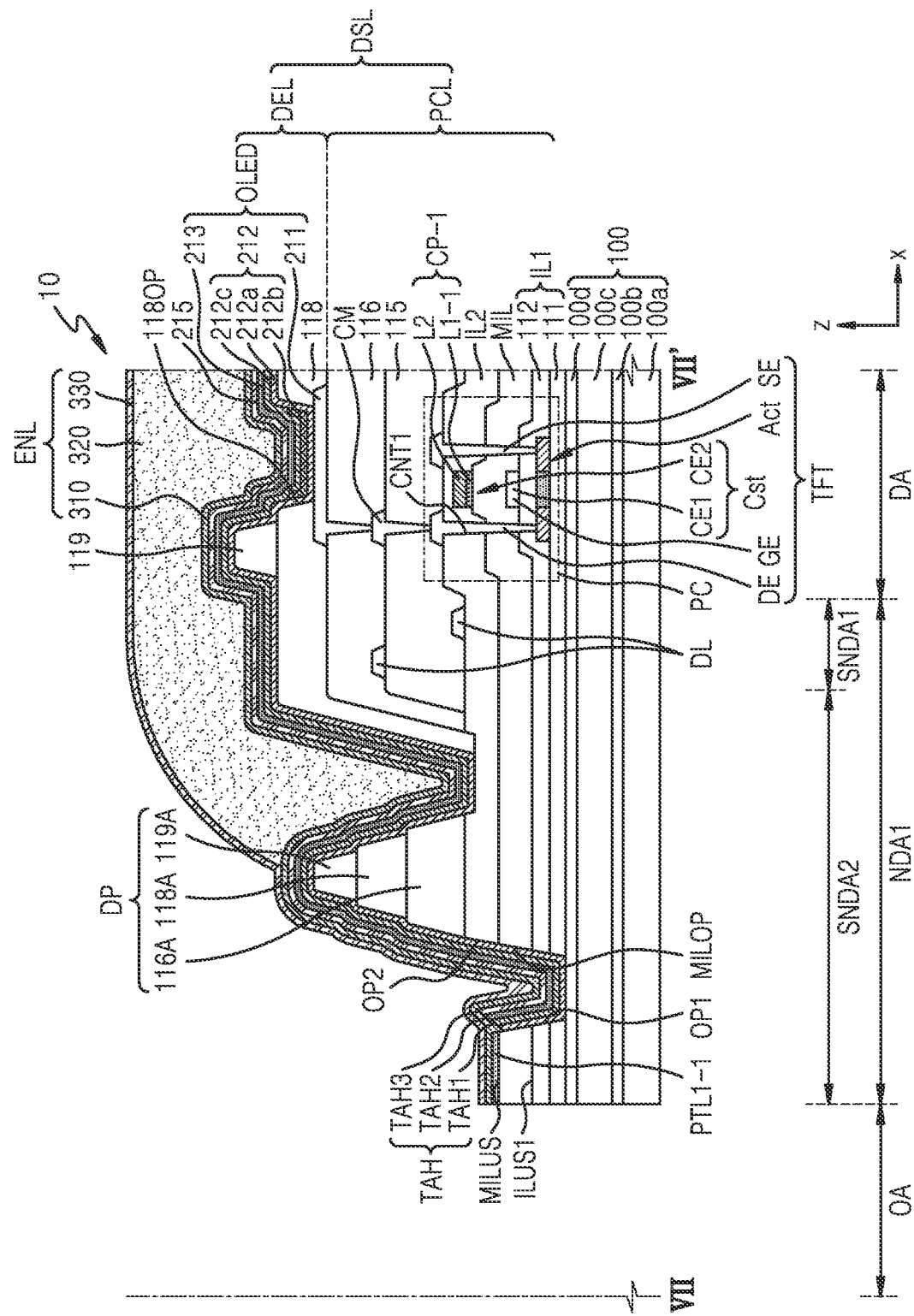
FIG. 10 is a schematic cross-sectional view of a display panel taken along the line VII-VII' of FIG. 6, according to another embodiment.

FIG. 10 is a schematic cross-sectional view of the display panel 10 taken along the line VII-VII' of FIG. 6, according to another embodiment. In FIG. 10, the same reference numerals as those in FIG. 7A refer to the same members, and redundant descriptions thereof may not be repeated. The display panel 10 illustrated in FIG. 10 differs from the embodiment illustrated in FIG. 7A in that the display panel 10 further includes a lower pattern layer PTL1-1.

Referring to FIG. 10, the display panel 10 may include a substrate 100, a first insulating layer IL1, a second insulating layer IL2, a conductive pattern CP-1, an organic light-emitting diode OLED as a display element, and a lower pattern layer PTL1-1. The substrate 100 may include an opening area OA, a display area DA surrounding the opening area OA, and a first non-display area NDA1 between the opening area OA and the display area DA.

The first insulating layer IL1 may include a first recess or a first opening OP1 overlapping the first non-display area NDA1 and may be on the substrate 100.

The second insulating layer IL2 may include a second opening OP2 exposing the first upper surface ILUS1 of the first insulating layer IL1 between the first recess or the first opening OP1 and the opening area OA and may be on the first insulating layer IL1.

The conductive pattern CP-1 may be between the first insulating layer IL1 and the second insulating layer IL2, and may include a first layer L1-1 and a second layer L2. The first layer L1-1 may include amorphous silicon to which a dopant is added. The dopant added to the amorphous silicon (a-Si) may include one selected from boron (B), phosphorus (P), nitrogen (N), nickel (Ni), cobalt (Co), and fluorine (F). The second layer L2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

The organic light-emitting diode OLED may be arranged to overlap the display area DA on the second insulating layer IL2, and may include a first electrode 211, an emission layer 212b on the first electrode 211, and a second electrode 213 on the emission layer 212b.

According to an embodiment, the lower pattern layer PTL1-1 may be on the first upper surface ILUS1 of the first insulating layer IL1. According to an embodiment, the lower pattern layer PTL1-1 may be on the second upper surface MILUS of the middle insulating layer MIL. The lower pattern layer PTL1-1 may include amorphous silicon to which a dopant is added. In this case, the lower pattern layer PTL1-1 and the first layer L1-1 of the conductive pattern CP-1 may include a same material.

When the display panel 10 is manufactured, the first functional layer 212a, the second functional layer 212c, the second electrode 213, and the capping layer 215, which are formed on the lower pattern layer PTL1-1, may be removed. Specifically, when laser is irradiated on the region in which the lower pattern layer PTL1-1 is arranged, the first functional layer 212a, the second functional layer 212c, the second electrode 213, and the capping layer 215, which are formed on the lower pattern layer PTL1-1, may be removed. Therefore, the transmission hole TAH exposing the lower pattern layer PTL1-1 may be formed, and the first inorganic encapsulation layer 310 and the lower pattern layer PTL1-1 arranged in the transmission hole TAH may come in contact with each other, thereby preventing or reducing infiltration of a foreign material or moisture into the organic light-emitting diode OLED.

Figure 11A:
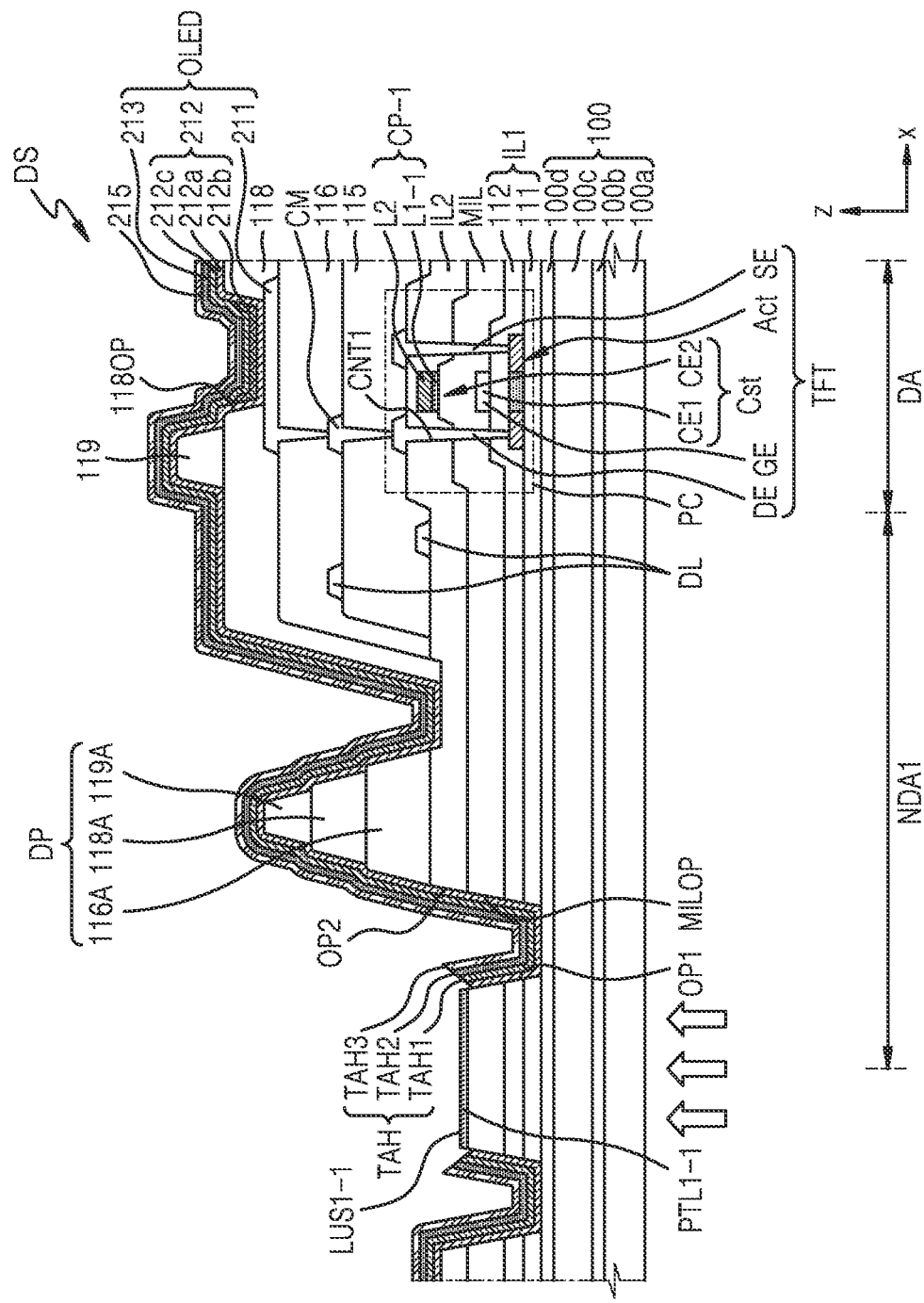
FIGS. 11A and 11B are schematic cross-sectional views illustrating a method of manufacturing a display device, according to another embodiment.
Figure 11B:
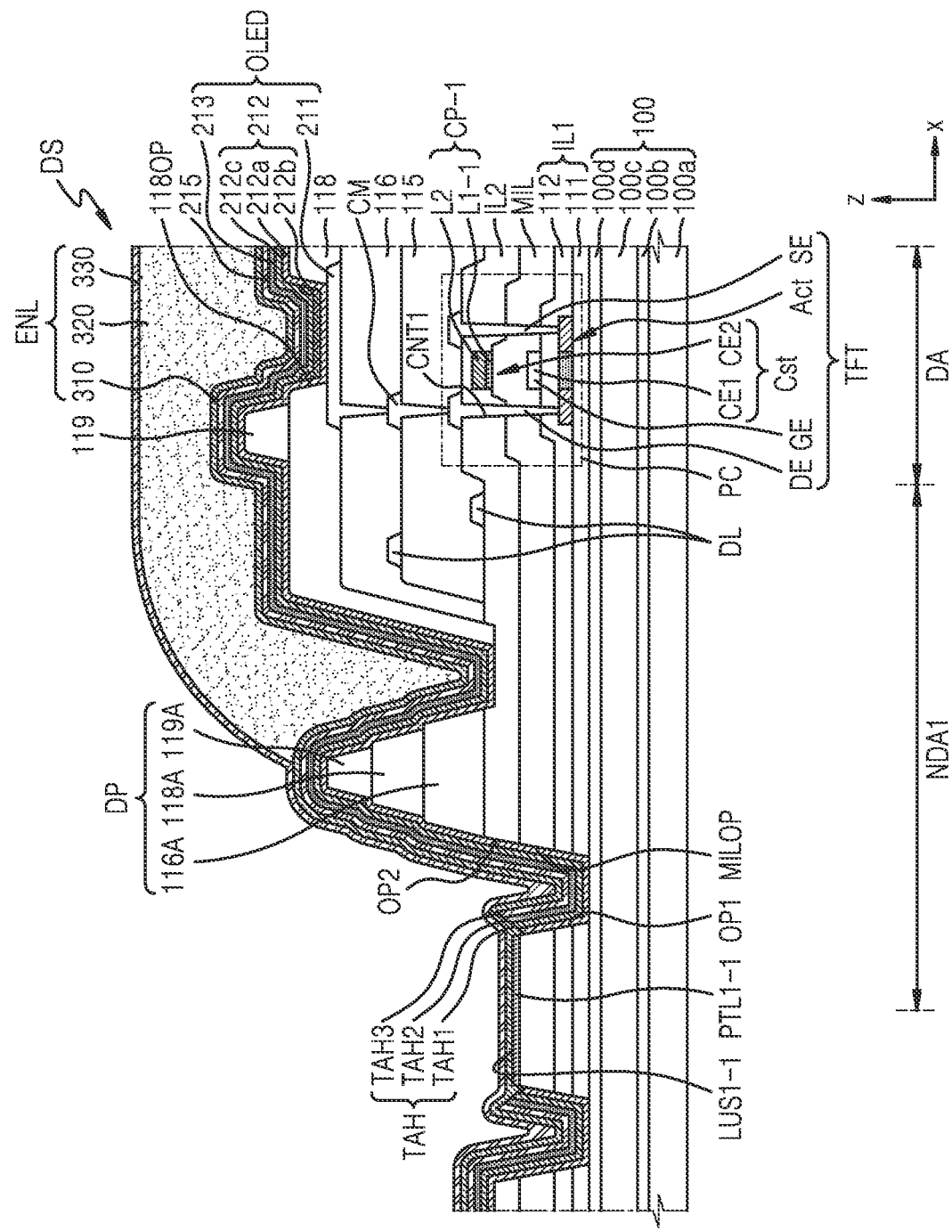

FIGS. 11A and 11B are schematic cross-sectional views illustrating a method of manufacturing a display device, according to another embodiment. In FIGS. 11A and 11B, the same reference numerals as those in FIGS. 9H, 9I, and 9J refer to the same members, and redundant descriptions thereof may not be repeated.

Referring to FIG. 11A, a display substrate DS including a substrate 100 including a first non-display area NDA1 and a display area DA, and a first insulating layer IL1 on the substrate 100 may be prepared. A conductive pattern CP-1 including a first layer L1-1 and a second layer L2 may be formed.

A pattern layer may include a lower pattern layer PTL1-1 and an upper pattern layer, and may be formed on the first non-display area NDA1. According to an embodiment, the pattern layer may be formed on a second upper surface MILUS of a middle insulating layer MIL. The lower pattern layer PTL1-1 may include amorphous silicon to which a dopant is added.

A conductive layer may be formed on the pattern layer and the display area DA, and the conductive layer may be patterned to form a first electrode 211. In this case, the upper pattern layer may be removed.

At least one of a first functional layer 212a or a second functional layer 212c, a second electrode 213, and a capping layer 215 may be formed on the lower pattern layer PTL1-1 and the first electrode 211. At least one of the first functional layer 212a or the second functional layer 212c, the second electrode 213, and the capping layer 215, which are on the lower pattern layer PTL1-1, may be removed.

Laser light may be irradiated on the lower pattern layer PTL1-1 to remove at least one of the first functional layer 212a or the second functional layer 212c, the second electrode 213, and the capping layer 215. In this case, the upper surface LUS1-1 of the lower pattern layer PTL1-1 may be exposed through a transmission hole TAH. That is, the first functional layer 212a, the second functional layer 212c, the second electrode 213, and the capping layer 215 may be lifted off from the lower pattern layer PTL1-1. The melting point of the lower pattern layer PTL1-1 when the lower pattern layer PTL1-1 includes amorphous silicon to which a dopant is added may be higher than the melting point of the lower pattern layer when the lower pattern layer includes titanium (Ti). Therefore, when the lower pattern layer PTL1-1 includes amorphous silicon to which a dopant is added, the lower pattern layer PTL1-1 may not be lifted off from the middle insulating layer MIL or the first insulating layer IL1.

Referring to FIG. 11B, an encapsulation layer ENL may be formed. The encapsulation layer ENL may include a first inorganic encapsulation layer 310, an organic encapsulation layer 320, and a second inorganic encapsulation layer 330. The first inorganic encapsulation layer 310 and the second inorganic encapsulation layer 330 may extend from the display area DA to the transmission hole TAH to overlap the transmission hole TAH. Therefore, the first inorganic encapsulation layer 310 may come in contact with the upper surface LUS1-1 of the lower pattern layer PTL1-1.

Figure 12:
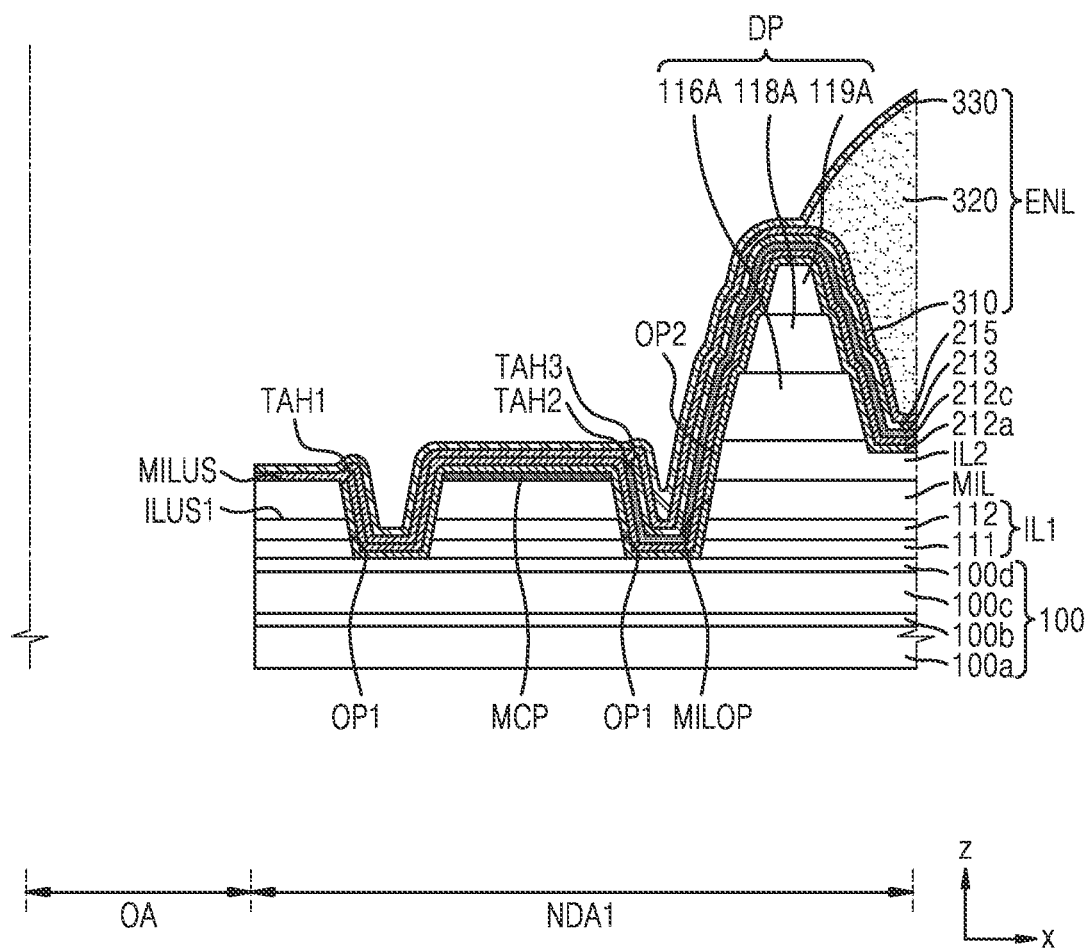
FIG. 12 is a schematic cross-sectional view of a display panel according to another embodiment.

FIG. 12 is a schematic cross-sectional view of a display panel according to another embodiment. In FIG. 12, the same reference numerals as those in FIG. 7A refer to the same members, and redundant descriptions thereof may not be repeated.

Referring to FIG. 12, the display panel may include a substrate 100, a first insulating layer IL1, a second insulating layer IL2, a conductive pattern, an organic light-emitting diode as a display element, and a middle conductive pattern MCP. The substrate 100 may include an opening area OA and a first non-display area NDA1.

The first insulating layer IL1 may include a first recess or a first opening OP1 overlapping the first non-display area NDA1 and may be on the substrate 100. Hereinafter, a detailed description will be given focusing on a case in which the first insulating layer IL1 includes the first opening OP1.

According to an embodiment, a plurality of first openings OP1 may be provided. The first openings OP1 may be apart from or spaced from each other in the first non-display area NDA1.

The second insulating layer IL2 may include a second opening OP2 exposing the first upper surface ILUS1 of the first insulating layer IL1 between the first recess or the first opening OP1 and the opening area OA, and may be on the first insulating layer IL1.

The middle insulating layer MIL may be between the first insulating layer IL1 and the second insulating layer IL2. The middle insulating layer MIL may include a middle opening MILOP connected to the first opening OP1. A plurality of middle openings MILOP may be provided in the first non-display area NDA1. According to an embodiment, the middle openings MILOP may be connected to the first openings OP1, respectively.

The middle conductive pattern MCP may be between the first openings OP1. When the first insulating layer IL1 includes a plurality of first recesses, the middle conductive pattern MCP may be between the first recesses. The middle conductive pattern MCP and the first layer of the conductive pattern may include a same material. For example, the middle conductive pattern MCP may include titanium (Ti). As another example, the middle conductive pattern MCP may include amorphous silicon to which a dopant is added.

The organic light-emitting diode may be on the second insulating layer IL2 to overlap the display area, and may include a first electrode 211, an emission layer on the first electrode 211, and a second electrode 213 on the emission layer. A capping layer 215 may be further arranged on the second electrode 213. The organic light-emitting diode may further include a first functional layer 212a between the first electrode 211 and the emission layer and/or a second functional layer 212c between the emission layer and the second electrode 213. According to an embodiment, at least one of the first functional layer 212a or the second functional layer 212c, the second electrode 213, and the capping layer 215 may extend from the display area to the first non-display area NDA1.

At least one of the first functional layer 212a or the second functional layer 212c may extend to the first opening OP1, and may be within the first opening OP1. Also, at least one of the first functional layer 212a or the second functional layer 212c may cover the middle conductive pattern MCP. At least one of the first functional layer 212a or the second functional layer 212c may include a first transmission hole TAH1 exposing a first upper surface ILUS1 of the first insulating layer IL1 and/or a second upper surface MILUS of the middle insulating layer MIL.

The second electrode 213 may include a second transmission hole TAH2 exposing the first upper surface ILUS1 of the first insulating layer IL1 and/or the second upper surface MILUS of the middle insulating layer MIL. The capping layer 215 may include a third transmission hole TAH3 exposing the first upper surface ILUS1 of the first insulating layer IL1 and/or the second upper surface MILUS of the middle insulating layer MIL. According to an embodiment, the second transmission hole TAH2 and the third transmission hole TAH3 may expose the middle conductive pattern MCP.

The area of the first transmission hole TAH1 may be less than the area of the second transmission hole TAH2 and/or the area of the third transmission hole TAH3. That is, at least one end portion of the first functional layer 212a and the second functional layer 212c may be closer to the opening area OA than the end portions of the second electrode 213 and the capping layer 215.

The first inorganic encapsulation layer 310 and the second inorganic encapsulation layer 330 may cover the first opening OP1, and may extend in a direction from the first non-display area NDA1 to the opening area OA. In this case, the first inorganic encapsulation layer 310 may come in contact with the second upper surface MILUS of the middle insulating layer MIL.

In this case, a passage through which a foreign material or moisture infiltrates into the organic light-emitting diode through at least one of the first functional layer 212a or the second functional layer 212c may be formed to be long. Therefore, it is possible to prevent or reduce infiltration of a foreign material or moisture into the organic light-emitting diode.

Figure 13A:
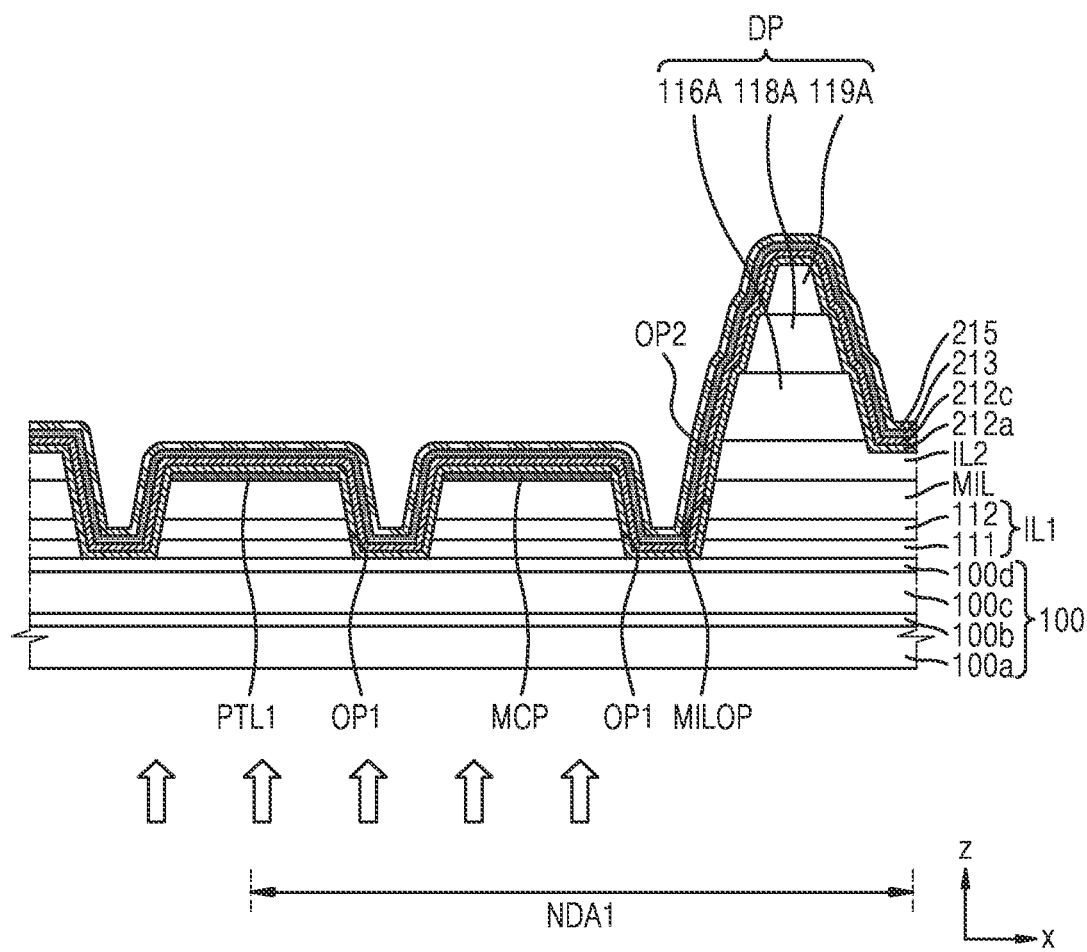
FIGS. 13A-13C are schematic cross-sectional views illustrating a method of manufacturing a display device, according to another embodiment.
Figure 13B:
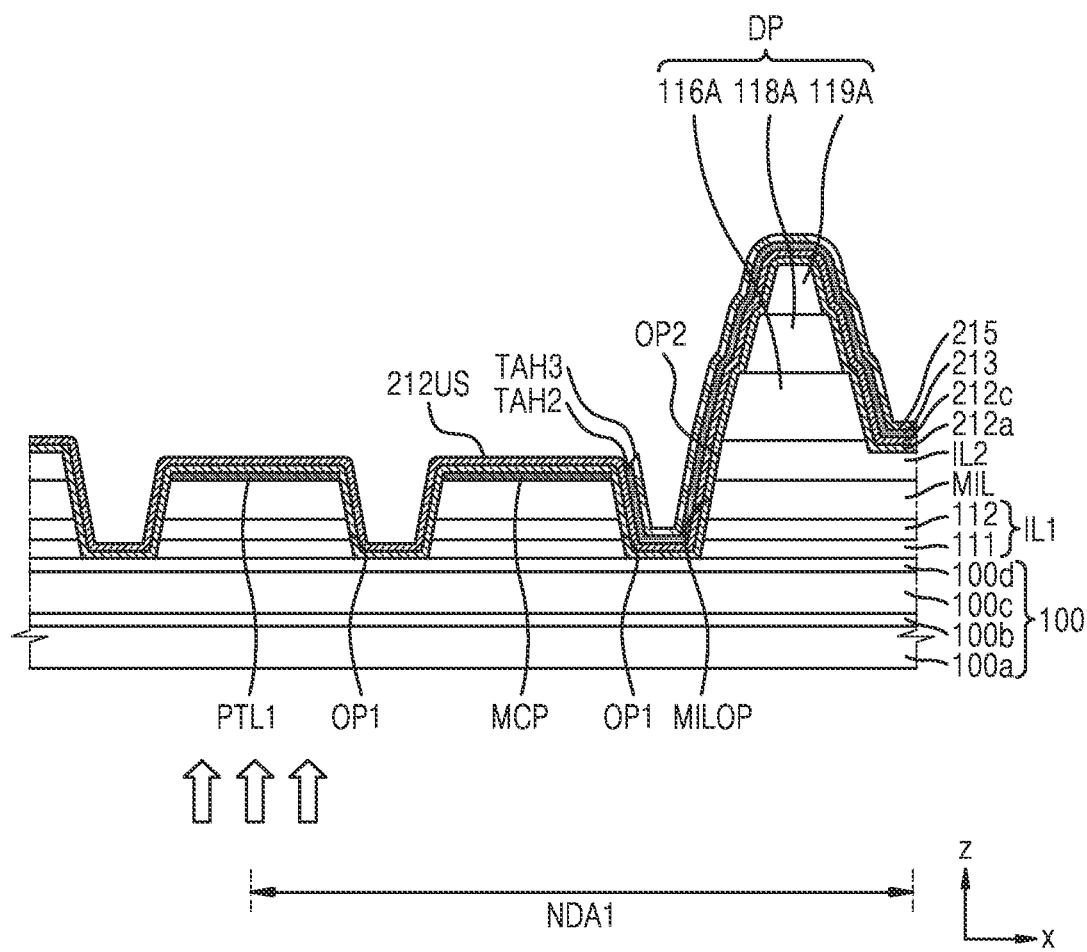
Figure 13C:
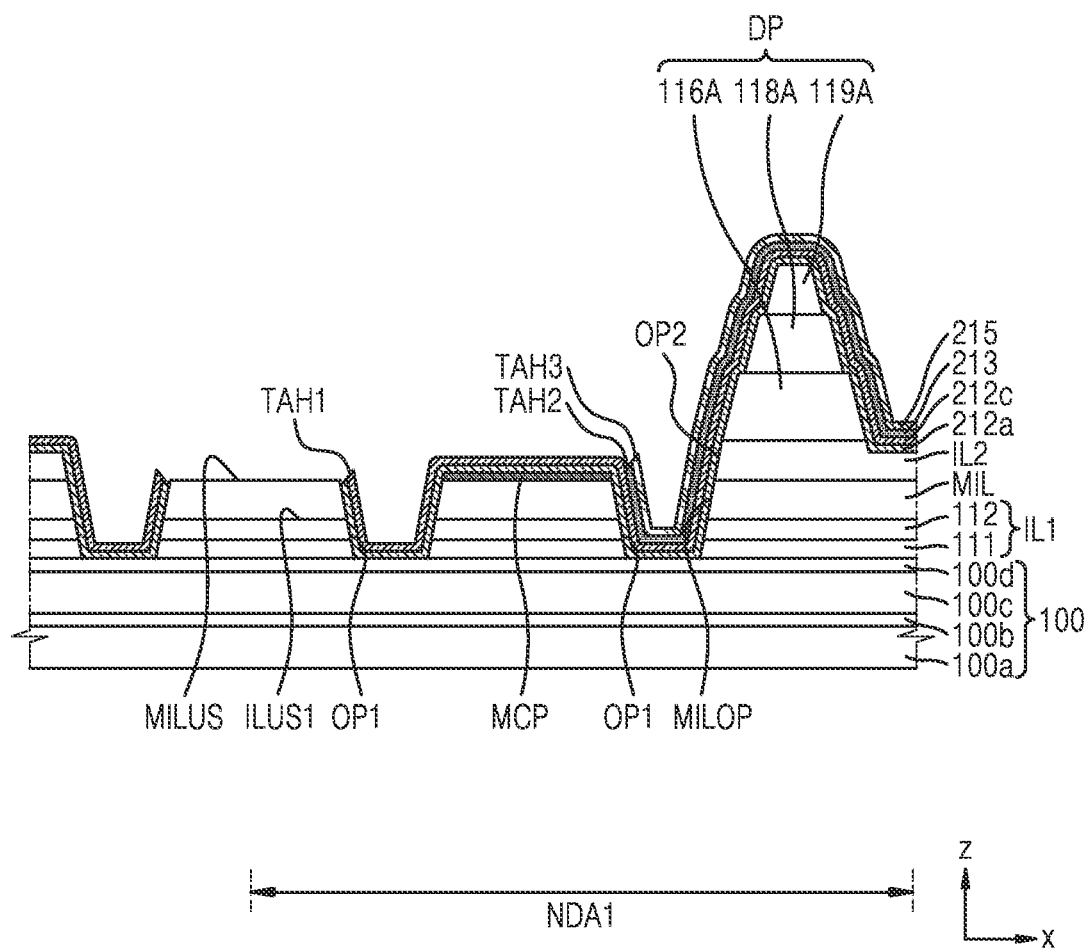

FIGS. 13A-13C are schematic cross-sectional views illustrating a method of manufacturing a display device, according to another embodiment. In FIGS. 13A-13C, the same reference numerals as those in FIG. 12 refer to the same members, and redundant descriptions thereof may not be repeated.

Referring to FIG. 13A, a middle conductive pattern MCP overlapping a first non-display area NDA1 may be formed on a first insulating layer IL1. The middle conductive pattern MCP may be formed similar to the lower pattern layer PTL1 described above with reference to FIGS. 9A-9G. For example, a middle conductive pattern MCP may be formed, and an upper conductive pattern may be formed on the middle conductive pattern MCP. A conductive layer may be formed on the upper conductive pattern. When the conductive layer is patterned into a first electrode 211, the upper conductive pattern may be removed. According to an embodiment, the middle conductive pattern MCP and the lower pattern layer PTL1 may include a same material. Also, the middle conductive pattern MCP and a first layer of the conductive pattern may include a same material.

A second electrode 213 and at least one of a first functional layer 212a or a second functional layer 212c may be formed on the middle conductive pattern MCP. According to an embodiment, a capping layer 215 may be further formed on the second electrode 213. At least one of the first functional layer 212a or the second functional layer 212c, the second electrode 213, and the capping layer 215 may be continuously formed in the first non-display area NDA1. Therefore, at least one of the first functional layer 212a or the second functional layer 212c, the second electrode 213, and the capping layer 215 may cover the dam portion DP, the first opening OP1, the middle opening MILOP, the second opening OP2, the lower pattern layer PTL1, and the middle conductive pattern MCP.

The second electrode 213 and the capping layer 215 on the middle conductive pattern MCP may be removed. According to an embodiment, laser light of a first energy density (J/cm$^2$) may be irradiated on the first non-display area NDA1. The laser light of the first energy density may lift off the second electrode 213 and the capping layer 215, but the first functional layer 212a, the second functional layer 212c, and the middle conductive pattern MCP may not be lifted off.

Referring to FIG. 13B, a second transmission hole TAH2 exposing a portion of the second functional layer 212c may be formed in the second electrode 213. A third transmission hole TAH3 exposing a portion of the second functional layer 212c may be formed in the capping layer 215. Therefore, the upper surface 212US of at least one of the first functional layer 212a or the second functional layer 212c on the middle conductive pattern MCP may be exposed.

At least one of the first functional layer 212a or the second functional layer 212c on the lower pattern layer PTL1 may be removed. According to an embodiment, laser light of a second energy density (J/cm$^2$) may be irradiated on the lower pattern layer PTL1. The second energy density may be greater than the first energy density. Therefore, the laser light of the second energy density may lift off the lower pattern layer PTL1. In this case, the lower pattern layer PTL1 and at least one of the first functional layer 212a or the second functional layer 212c on the lower pattern layer PTL1 may be lifted off from the middle insulating layer MIL.

Referring to FIG. 13C, the first transmission hole TAH1 exposing the second upper surface MILUS of the middle insulating layer MIL may be formed in the first functional layer 212a and the second functional layer 212c.

According to an embodiment, the area of the second transmission hole TAH2 and/or the third transmission hole TAH3 may be greater than the area of the first transmission hole TAH1. Therefore, a passage through which a foreign material or moisture infiltrates into the organic light-emitting diode through at least one of the first functional layer 212a or the second functional layer 212c may be formed to be long.

Figure 14:
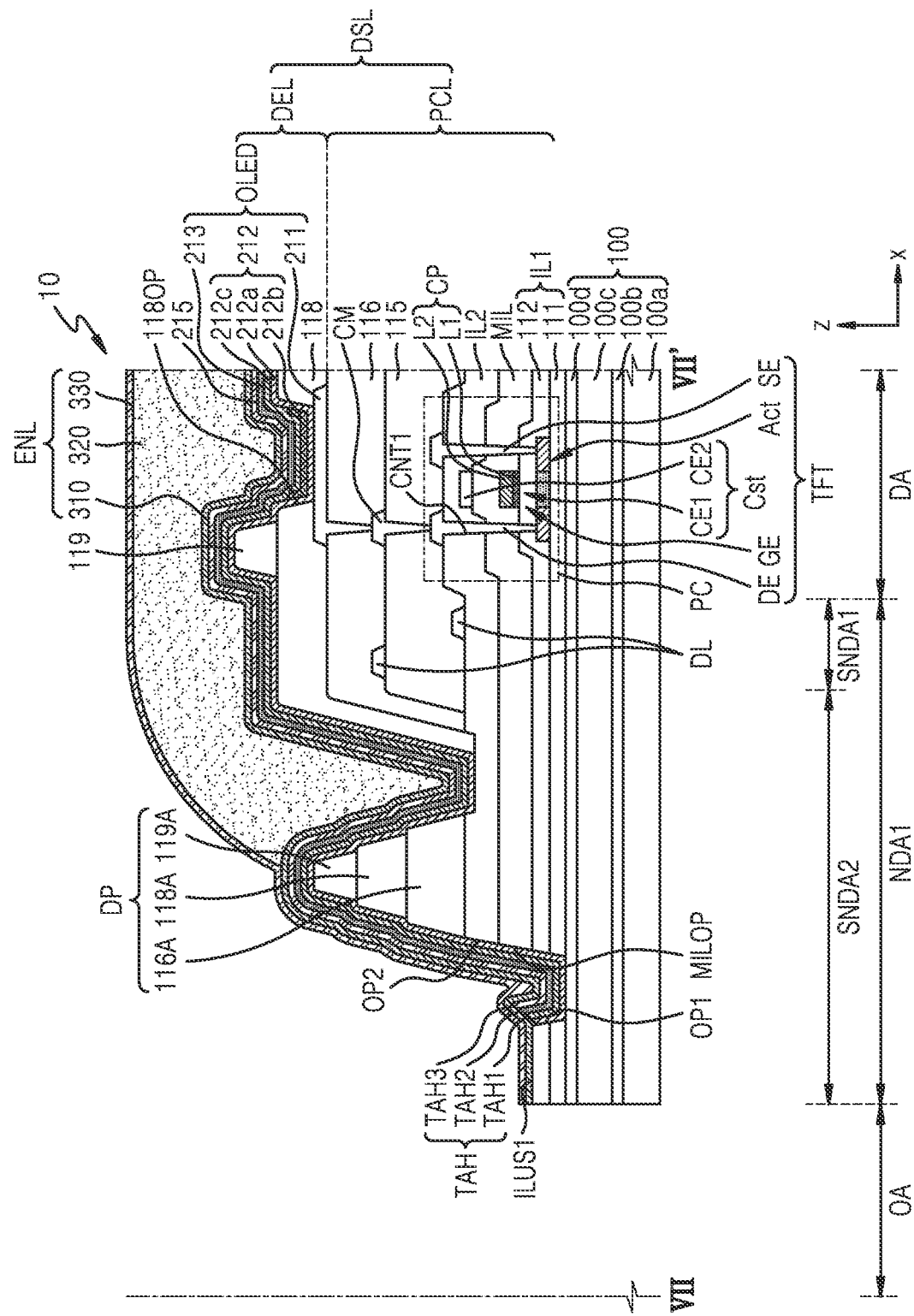
FIG. 14 is a schematic cross-sectional view of a display panel taken along the line VII-VII' of FIG. 6, according to another embodiment.

FIG. 14 is a schematic cross-sectional view of the display panel 10 taken along the line VII-VII' of FIG. 6, according to another embodiment. In FIG. 14, the same reference numerals as those in FIG. 7A refer to the same members, and redundant descriptions thereof may not be repeated. The display panel 10 illustrated in FIG. 14 differs from the embodiment illustrated in FIG. 7A in that a conductive pattern CP is between a gate insulating layer 112 and a middle insulating layer MIL.

Referring to FIG. 14, the display panel 10 may include a substrate 100, a first insulating layer IL1, a second insulating layer IL2, a conductive pattern CP, and an organic light-emitting diode OLED as a display element. The substrate 100 may include an opening area OA, a display area DA surrounding the opening area OA, and a first non-display area NDA1 between the opening area OA and the display area DA.

The first insulating layer IL1 may include a first recess or a first opening OP1 overlapping the first non-display area NDA1 and may be on the substrate 100.

The second insulating layer IL2 may include a second opening OP2 exposing the first upper surface ILUS1 of the first insulating layer IL1 between the first recess or the first opening OP1 and the opening area OA, and may be on the first insulating layer IL1.

The middle insulating layer MIL may be between the first insulating layer IL1 and the second insulating layer IL2. The middle insulating layer MIL may include a middle opening MILOP connected to the first recess or the first opening OP1. The middle opening MILOP may penetrate through the upper and lower surfaces of the middle insulating layer MIL. According to an embodiment, the middle opening MILOP may expose the first upper surface ILUS1 of the first insulating layer IL1. That is, the middle insulating layer MIL may not be on the first upper surface ILUS1 of the first insulating layer IL1.

The conductive pattern CP may be between the gate insulating layer 112 and the middle insulating layer MIL, and may include a first layer L1 and a second layer L2. According to an embodiment, the first layer L1 may include titanium (Ti). According to another embodiment, the first layer L1 may include amorphous silicon to which a dopant is added. The dopant added to the amorphous silicon (a-Si) may include one selected from boron (B), phosphorus (P), nitrogen (N), nickel (Ni), cobalt (Co), and fluorine (F).

The conductive pattern CP may function as a lower electrode CE1 of a storage capacitor Cst. For example, the conductive pattern CP may overlap an upper electrode CE2 of the storage capacitor Cst thereon. According to an embodiment, the conductive pattern CP may function as a gate electrode GE. Therefore, the conductive pattern CP may overlap a semiconductor layer Act thereunder.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material.

The organic light-emitting diode OLED may be arranged to overlap the display area DA on the second insulating layer IL2, and may include a first electrode 211, an emission layer 212b on the first electrode 211, and a second electrode 213 on the emission layer 212b.

The first functional layer 212a, the second functional layer 212c, the second electrode 213, and the capping layer 215 may be disconnected from the first non-display area NDA1. According to an embodiment, each of the first functional layer 212a, the second functional layer 212c, the second electrode 213, and the capping layer 215 may include the transmission hole TAH exposing the first upper surface ILUS1 of the first insulating layer IL1.

An encapsulation layer ENL may cover the organic light-emitting diode OLED. A first inorganic encapsulation layer 310 and a second inorganic encapsulation layer 330 may extend from the display area DA to the first non-display area NDA1.

The first inorganic encapsulation layer 310 and the second inorganic encapsulation layer 330 may overlap the transmission hole TAH. Specifically, the first inorganic encapsulation layer 310 and the second inorganic encapsulation layer 330 may overlap a first transmission hole TAH1, a second transmission hole TAH2, and a third transmission hole TAH3. In this case, the first inorganic encapsulation layer 310 may overlap the first recess or the first opening OP1, and may come in contact with the first upper surface ILUS1 of the first insulating layer IL1 adjacent to the opening area OA. According to an embodiment, the first inorganic encapsulation layer 310 may contact the second inorganic encapsulation layer 330 and may be between the second inorganic encapsulation layer 330 and the first upper surface ILUS1 of the first insulating layer IL1. Therefore, because an organic material layer is not on the first upper surface ILUS1 of the first insulating layer IL1, it is possible to prevent or reduce infiltration of moisture toward the organic light-emitting diode OLED arranged in the display area DA.

Figure 15A:
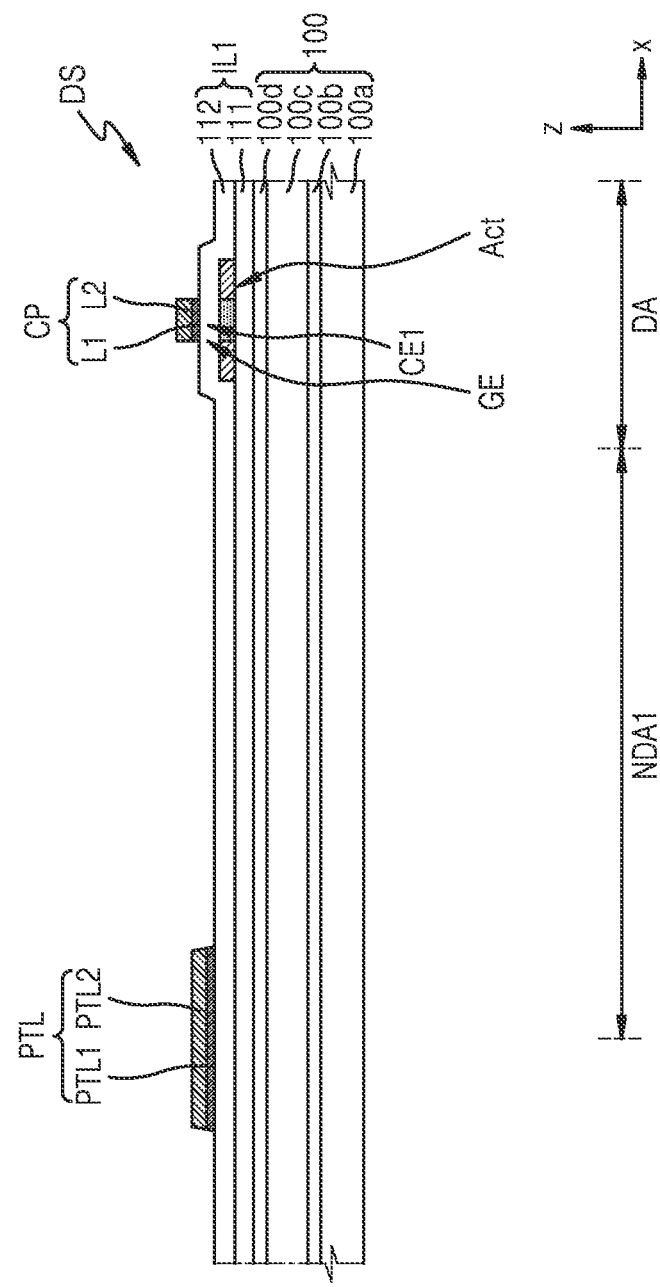
FIGS. 15A-15C are schematic cross-sectional views illustrating a method of manufacturing a display device, according to another embodiment.
Figure 15B:
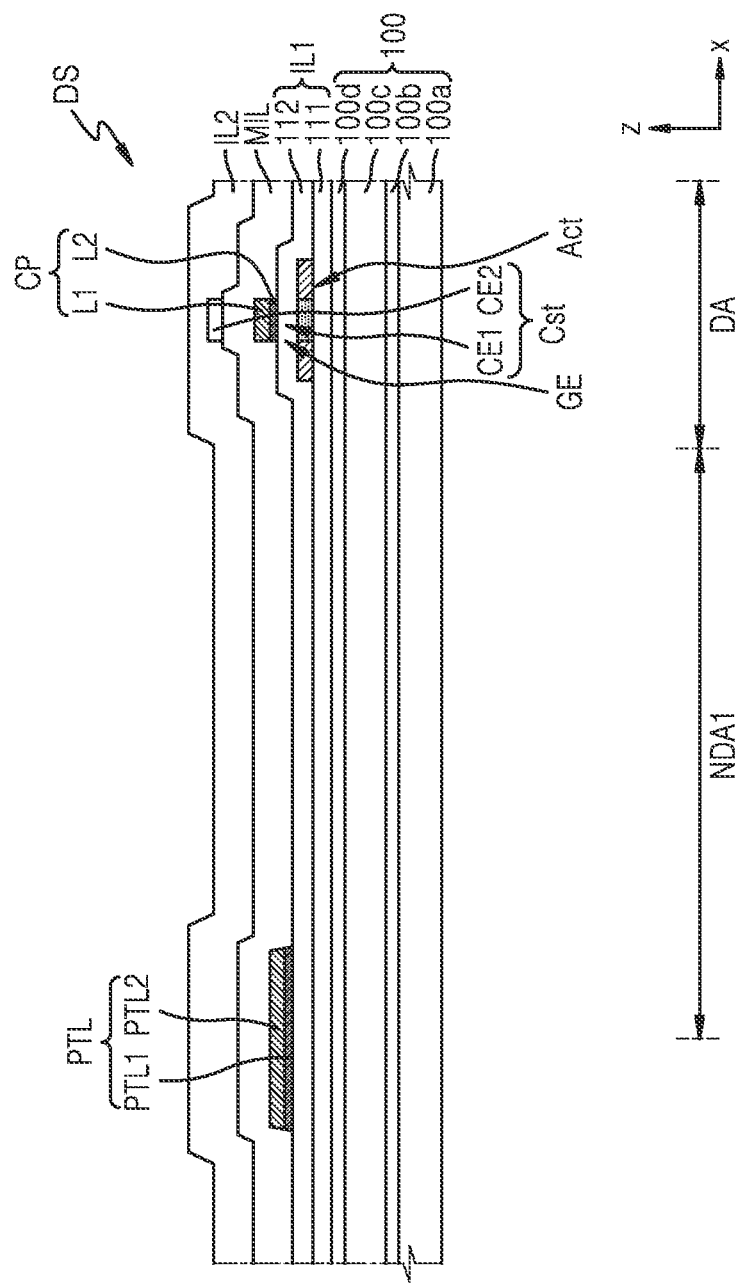
Figure 15C:
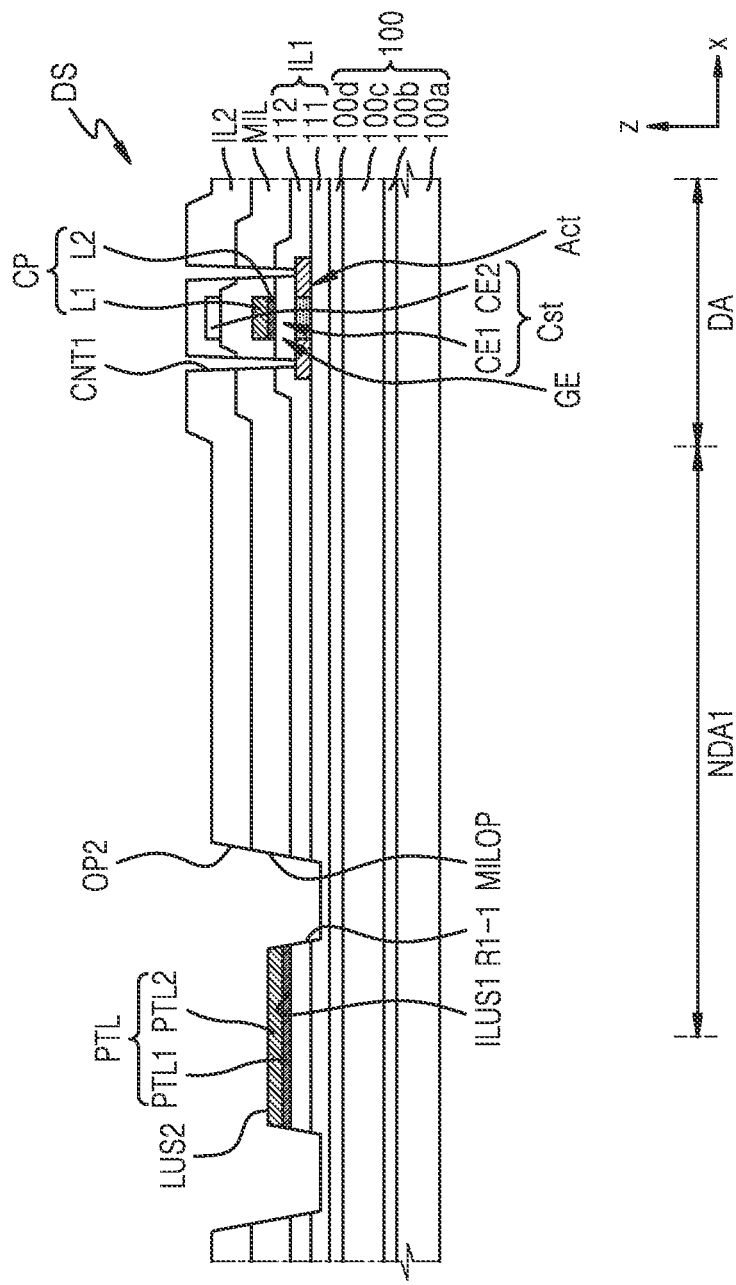

FIGS. 15A-15C are schematic cross-sectional views illustrating a method of manufacturing a display device, according to another embodiment. In FIGS. 15A-15C, the same reference numerals as those in FIG. 14 refer to the same members, and redundant descriptions thereof may not be repeated. The embodiments illustrated in FIGS. 15A-15C differ from the embodiments illustrated in FIGS. 9A-9K in that a middle insulating layer MIL is formed after a conductive pattern CP and a pattern layer PTL are formed.

Referring to FIG. 15A, a display substrate DS may be prepared. The display substrate DS may include a substrate 100 and a first insulating layer IL1. The first insulating layer IL1 may be on a display area DA and a first non-display area NDA1.

A conductive pattern CP may be formed on the first insulating layer IL1. The conductive pattern CP may include a first layer L1 and a second layer L2 on the first layer L1. According to an embodiment, the conductive pattern CP may function as a gate electrode GE. In this case, the conductive pattern CP may overlap a semiconductor layer Act.

A pattern layer PTL may be formed on the first non-display area NDA1. According to an embodiment, the pattern layer PTL may be formed on the first insulating layer IL1. The pattern layer PTL may include a lower pattern layer PTL1 and an upper pattern layer PTL2 on the lower pattern layer PTL1. The pattern layer PTL may be formed concurrently (e.g., simultaneously) with the conductive pattern CP.

Referring to FIG. 15B, a middle insulating layer MIL may be formed on the first insulating layer IL1. The middle insulating layer MIL may cover the pattern layer PTL and the conductive pattern CP. Therefore, the conductive pattern CP and the pattern layer PTL may be between the first insulating layer IL1 and the middle insulating layer MIL.

An upper electrode CE2 of a storage capacitor Cst may be formed, and a second insulating layer IL2 may be formed.

Referring to FIG. 15C, the first insulating layer IL1 (e.g., the gate insulating layer 112 of the first insulating layer IL1), the middle insulating layer MIL, and the second insulating layer IL2 may be partially removed. According to an embodiment, the first insulating layer IL1 (e.g., the gate insulating layer 112 of the first insulating layer IL1), the middle insulating layer MIL, and the second insulating layer IL2 may be partially etched.

A second opening OP2 may be formed in the second insulating layer IL2. The second opening OP2 may expose the pattern layer PTL. The second opening OP2 may expose an upper surface LUS2 of the upper pattern layer PTL2. According to an embodiment, the width of the second opening OP2 may be greater than the width of the pattern layer PTL. For example, the width of the second opening OP2 in the x direction may be greater than the width of the pattern layer PTL in the x direction as shown in FIG. 15C.

A middle opening MILOP may be formed in the middle insulating layer MIL. The middle opening MILOP may be connected to the second opening OP2. Also, the middle opening MILOP may expose the pattern layer PTL. That is, the middle opening MILOP may expose the upper surface LUS2 of the upper pattern layer PTL2. According to an embodiment, the width of the middle opening MILOP may be greater than the width of the pattern layer PTL. For example, the width of the middle opening MILOP in the x direction may be greater than the width of the pattern layer PTL in the x direction as shown in FIG. 15C.

Figure 16:
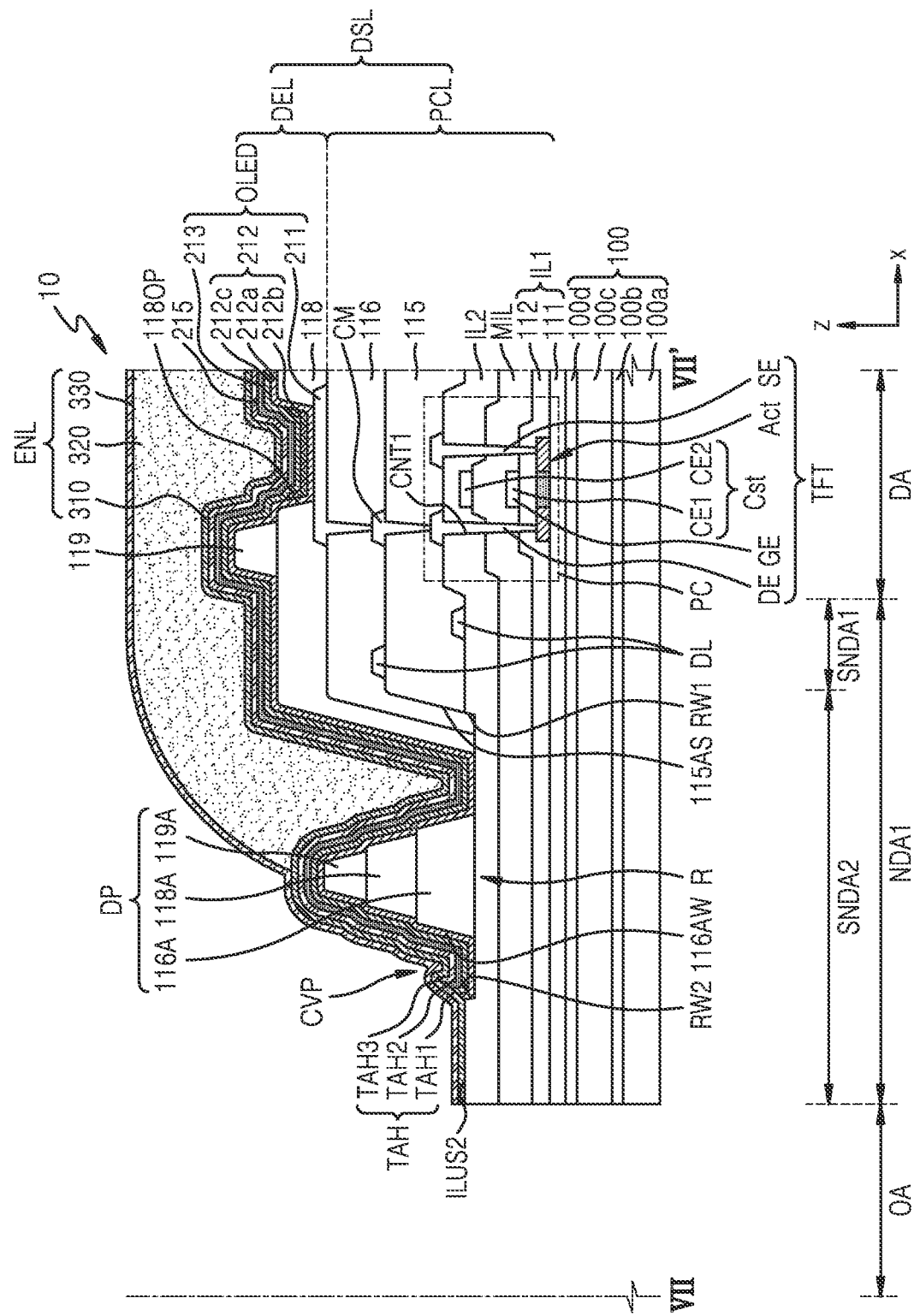
FIG. 16 is a schematic cross-sectional view of a display panel taken along the line VII-VII' of FIG. 6, according to another embodiment.

FIG. 16 is a schematic cross-sectional view of the display panel 10 taken along the line VII-VII' of FIG. 6, according to another embodiment. In FIG. 16, the same reference numerals as those in FIG. 7A refer to the same members, and redundant descriptions thereof may not be repeated.

Referring to FIG. 16, the display panel 10 may include a substrate 100, a first insulating layer IL1, a second insulating layer IL2, and an organic light-emitting diode OLED as a display element. The substrate 100 may include an opening area OA, a display area DA surrounding the opening area OA, and a first non-display area NDA1 between the opening area OA and the display area DA.

An upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material.

The second insulating layer IL2 may include a recess R, which is concave in the depth or thickness direction (e.g., the direction opposite to the z direction) of the second insulating layer IL2, on a second sub-non-display area SNDA2. The recess R may be defined by a bottom surface, a first sidewall RW1, and a second sidewall RW2, which are connected to each other. According to an embodiment, the bottom surface, the first sidewall RW1, and the second sidewall RW2 of the recess R may be portions of the second insulating layer IL2. The bottom surface of the recess R may be a surface arranged below the upper surface (e.g., uppermost surface) of the second insulating layer IL2. The first sidewall RW1 and the second sidewall RW2 may connect the upper surface of the second insulating layer IL2 and the bottom surface (e.g., the bottom surface of the recess R or the surface arranged below the upper surface of the second insulating layer IL2). The first sidewall RW1 and the second sidewall RW2 may be surfaces of the second insulating layer IL2 facing each other (e.g., facing each other in the x direction). The first sidewall RW1 may be closer to the display area DA than the second sidewall RW2.

According to an embodiment, the recess R may be between the first organic insulating layer 115 and the opening area OA. According to an embodiment, the first sidewall RW1 of the recess R may meet a side surface 115AS of the first organic insulating layer 115. For example, the first sidewall RW1 of the recess R and the side surface 115AS of the first organic insulating layer 115 may be continuously arranged. According to an embodiment, the first sidewall RW1 of the recess R and the side surface 115AS of the first organic insulating layer 115 may intersect with each other, or may be on the same plane. According to an embodiment, the first sidewall RW1 of the recess R and the side surface 115AS of the first organic insulating layer 115 may be aligned.

According to an embodiment, the second insulating layer IL2 may include at least one recess R. For example, the second insulating layer IL2 may include one recess R. As another example, the second insulating layer IL2 may include a plurality of recesses R.

A dam portion DP may be within the recess R. The dam portion DP may be on the bottom surface of the recess R, and the dam portion DP may include an organic pattern layer 116A. A sidewall 116AW (e.g., a portion of the sidewall 116AW) of the organic pattern layer 116A may face the second sidewall RW2 of the recess R.

According to an embodiment, the second sidewall RW2 of the recess R, at least a portion of the bottom surface of the recess R, and the sidewall 116AW of the organic pattern layer 116A may define a concave portion CVP. The concave portion CVP may be defined between (e.g., between in the x direction) the opening area OA and the dam portion DP.

A first functional layer 212a, a second functional layer 212c, a second electrode 213, and a capping layer 215 may extend from the display area DA to the first non-display area NDA1. According to an embodiment, the first functional layer 212a, the second functional layer 212c, the second electrode 213, and the capping layer 215 may cover the dam portion DP, and may extend to the concave portion CVP.

The first functional layer 212a, the second functional layer 212c, the second electrode 213, and the capping layer 215 may be disconnected from the second sidewall RW2 of the recess R. According to an embodiment, each of the first functional layer 212a, the second functional layer 212c, the second electrode 213, and the capping layer 215 may include a transmission hole TAH exposing a second upper surface ILUS2 of the second insulating layer IL2. The second upper surface ILUS2 of the second insulating layer IL2 may be the upper surface of the second insulating layer IL2 between the opening area OA and the concave portion CVP.

At least one of the first functional layer 212a or the second functional layer 212c may include a first transmission hole TAH1 exposing the second upper surface ILUS2 of the second insulating layer IL2. The second electrode 213 may include a second transmission hole TAH2 exposing the second upper surface ILUS2 of the second insulating layer IL2. The capping layer 215 may include a third transmission hole TAH3 exposing the second upper surface ILUS2 of the second insulating layer IL2.

The area of the transmission hole TAH may be greater than the area of the opening area OA. The end of the transmission hole TAH may be arranged at the end of the concave portion CVP at which the dam portion DP is not arranged. According to an embodiment, by forming the first transmission hole TAH1 based on the concave portion CVP, it may be possible to prevent or reduce infiltration of a foreign material or moisture into the organic light-emitting diode OLED by at least one of the first functional layer 212a or the second functional layer 212c.

An encapsulation layer ENL may cover the organic light-emitting diode OLED. A first inorganic encapsulation layer 310 and a second inorganic encapsulation layer 330 may extend from the display area DA to the first non-display area NDA1.

The first inorganic encapsulation layer 310 and the second inorganic encapsulation layer 330 may overlap the transmission hole TAH. Specifically, the first inorganic encapsulation layer 310 and the second inorganic encapsulation layer 330 may overlap the first transmission hole TAH1, the second transmission hole TAH2, and the third transmission hole TAH3. In this case, the first inorganic encapsulation layer 310 may overlap the concave portion CVP, and may come in contact with the second upper surface ILUS2 of the second insulating layer IL2 adjacent to the opening area OA. According to an embodiment, the first inorganic encapsulation layer 310 may contact the second inorganic encapsulation layer 330 and may be between the second inorganic encapsulation layer 330 and the second upper surface ILUS2 of the second insulating layer IL2. Therefore, because an organic material layer is not on the second upper surface ILUS2 of the second insulating layer IL2, it is possible to prevent or reduce infiltration of moisture toward the organic light-emitting diode OLED arranged in the display area DA.

FIGS. 17A-17E are schematic cross-sectional views illustrating a method of manufacturing a display device, according to another embodiment. The embodiments illustrated in FIGS. 17A-17C differ from the embodiments illustrated in FIGS. 9A-9K in that a pattern layer and a connection electrode are formed in the same process.

Figure 17A:
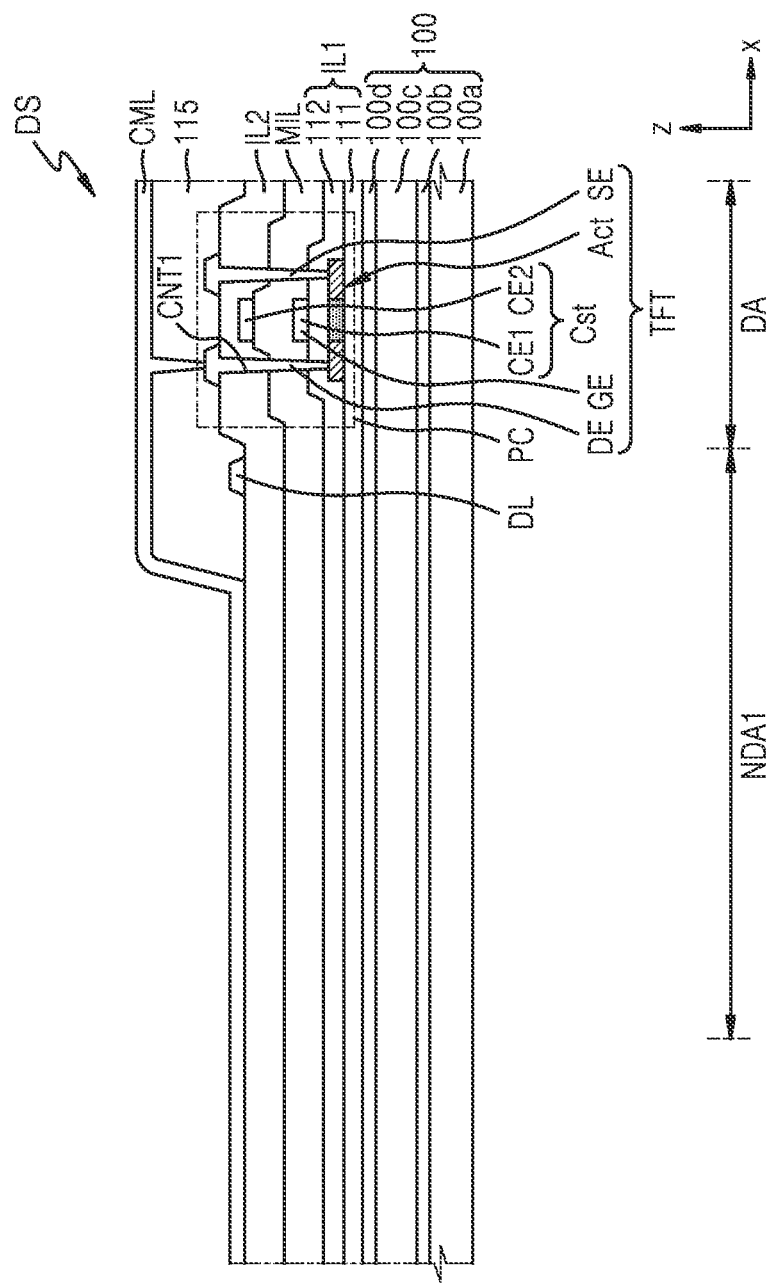
FIGS. 17A-17E are schematic cross-sectional views illustrating a method of manufacturing a display device, according to another embodiment.

Referring to FIG. 17A, a display substrate DS may be prepared. The display substrate DS may include a substrate 100, a first insulating layer IL1, a middle insulating layer MIL, a second insulating layer IL2, a pixel circuit PC, a portion of a data line DL, and a first organic insulating layer 115. According to an embodiment, the first insulating layer IL1, the middle insulating layer MIL, and the second insulating layer IL2 may be continuously arranged in a display area DA and a first non-display area NDA1.

A connection conductive layer CML may be formed on the display substrate DS. The connection conductive layer CML may be continuously formed in the first non-display area NDA1 and the display area DA. The connection conductive layer CML may be connected to a drain electrode DE or a source electrode SE through a contact hole provided in the first organic insulating layer 115.

Figure 17B:
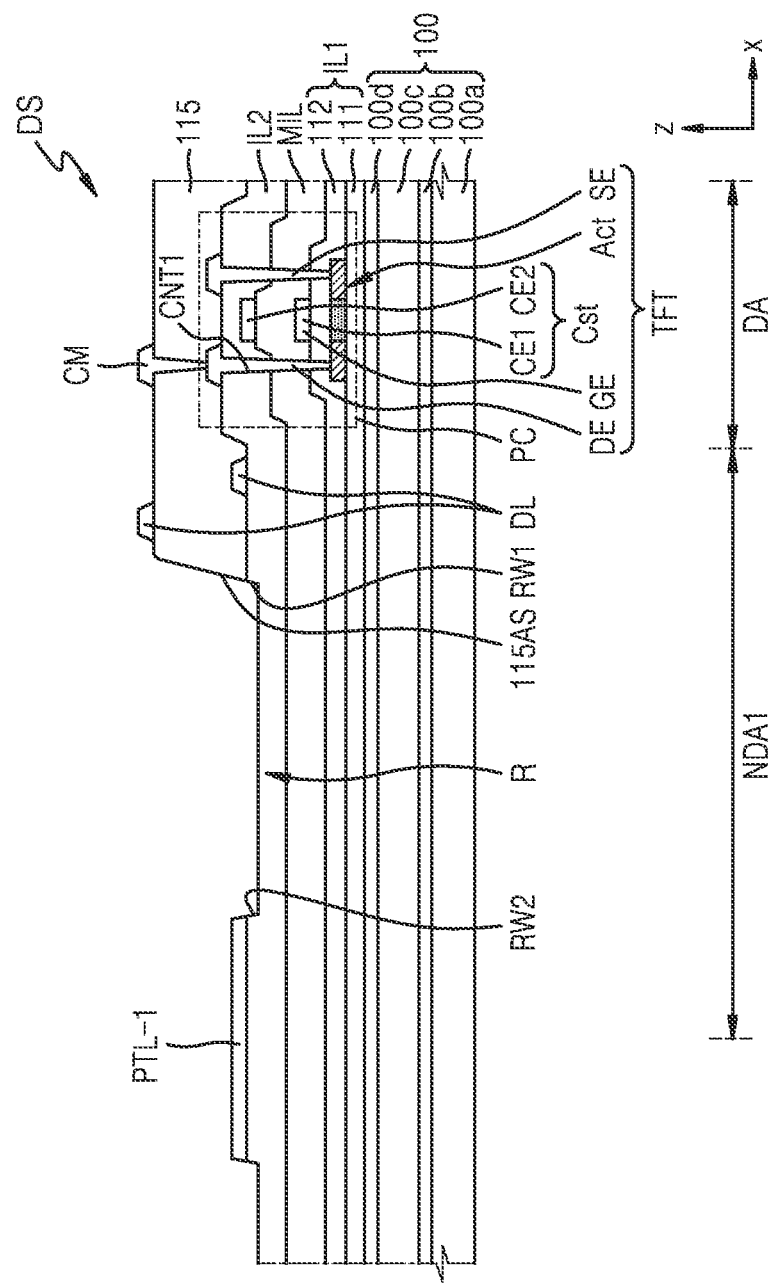

Referring to FIG. 17B, the connection conductive layer CML is patterned to form the connection electrode CM and other portions of the data line DL, and the pattern layer PTL-1. In this case, the pattern layer PTL-1 and the connection electrode CM may be formed concurrently (e.g., simultaneously) and may include a same material. The pattern layer PTL-1 may include a conductive material including molybdenum (Mo), aluminum (Al), copper (Cu), titanium (Ti), and/or the like, and may be formed as a single layer or multiple layers including the above-described material. According to an embodiment, the pattern layer PTL-1 may have a multiple layer structure of Ti/Al/Ti. When the pattern layer PTL-1 and the connection electrode CM are formed, the second insulating layer IL2 is over-etched to form a recess R.

The recess R may be formed to be concave in the depth or thickness direction of the second insulating layer IL2. The recess R may be formed between the pattern layer PTL-1 and the first organic insulating layer 115. The recess R may be defined by a bottom surface, a first sidewall RW1, and a second sidewall RW2. The first sidewall RW1 of the recess R may meet a side surface 115AS of the first organic insulating layer 115. According to an embodiment, the first sidewall RW1 of the recess R and the side surface 115AS of the first organic insulating layer 115 may be aligned. The second sidewall RW2 of the recess R may meet the sidewall of the pattern layer PTL-1. The recess R may be configured to facilitate disconnection of an organic material layer to be described in more detail below.

Figure 17C:
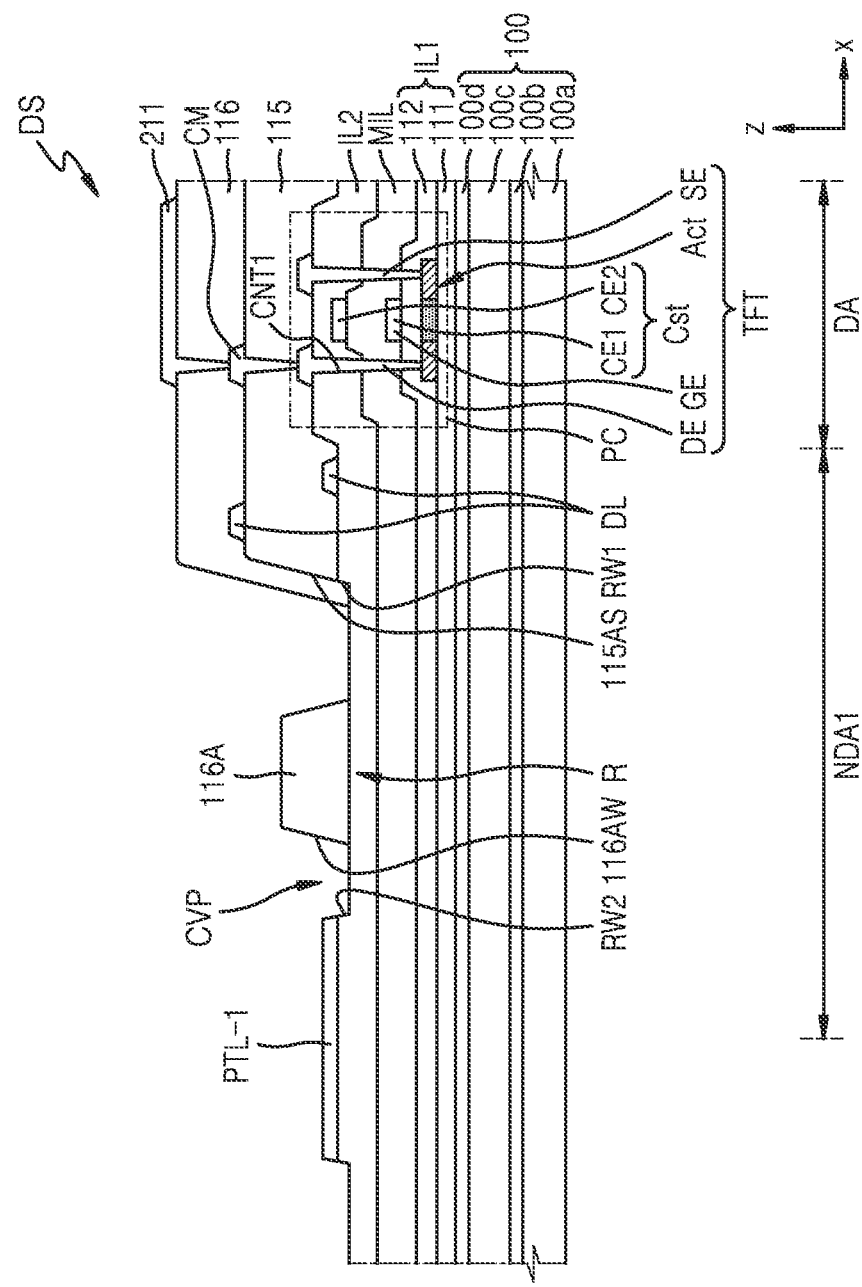

Referring to FIG. 17C, an organic pattern layer 116A and a second organic insulating layer 116 may be formed. The organic pattern layer 116A may be formed within the recess R. The organic pattern layer 116A and the second organic insulating layer 116 may be formed by applying an organic material onto the entire resulting structure and performing a photocuring process and a patterning process thereon.

The second sidewall RW2 of the recess R, at least a portion of the bottom surface of the recess R, and the sidewall 116AW of the organic pattern layer 116A may define a concave portion CVP. The sidewall 116AW of the organic pattern layer 116A may face the second sidewall RW2 of the recess R. The concave portion CVP may be defined between the pattern layer PTL-1 and the organic pattern layer 116A. The concave portion CVP may be configured to facilitate disconnection of an organic material layer to be described in more detail below.

A first electrode 211 may be formed on the second organic insulating layer 116. The first electrode 211 may be formed by forming a conductive layer on an entire display substrate DS and patterning the conductive layer.

Figure 17D:
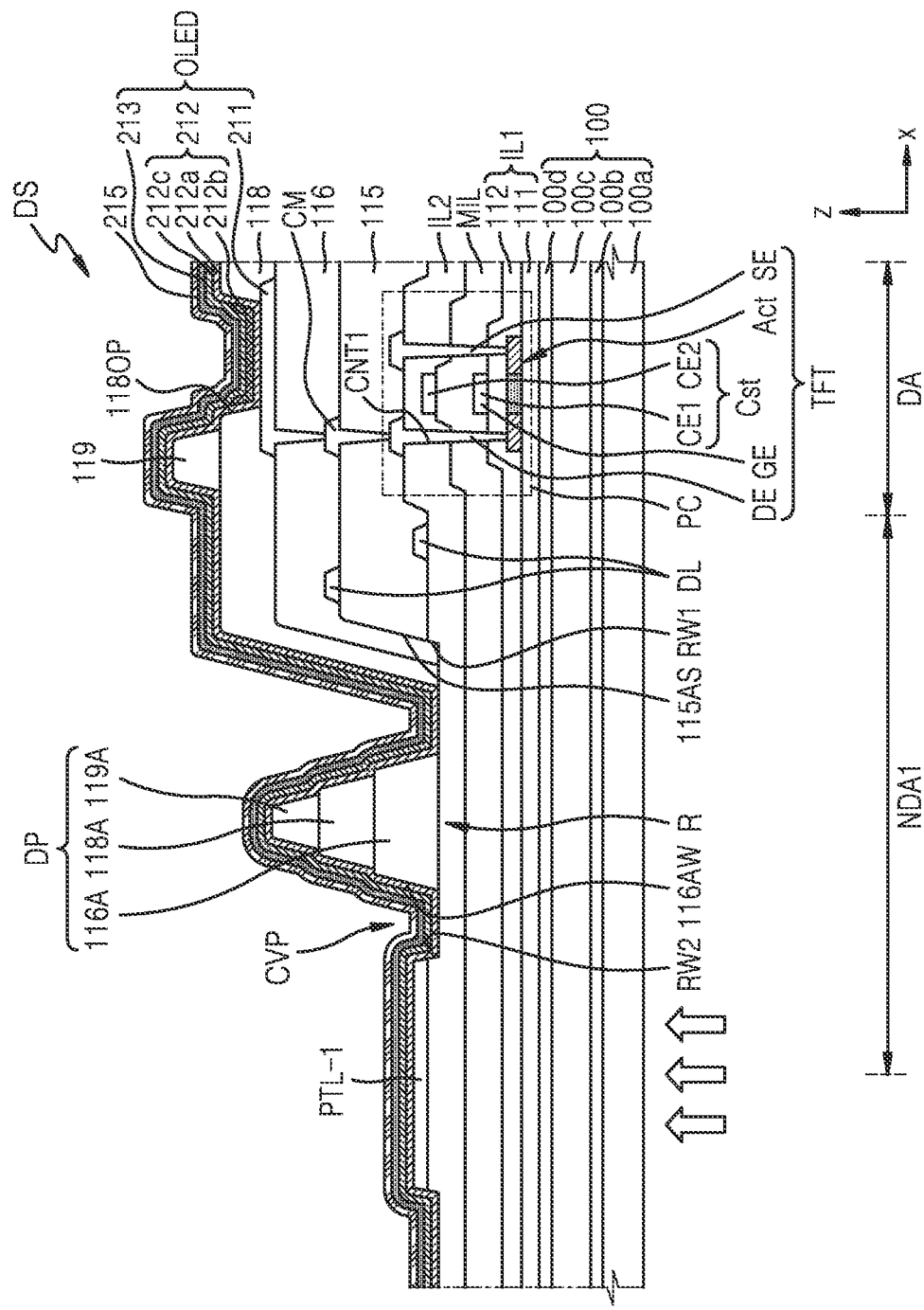

Referring to FIG. 17D, a pixel defining layer 118 including an opening 118OP exposing the central portion of the first electrode 211 may be formed on the first electrode 211, and a spacer 119 may be formed on the pixel defining layer 118.

A first upper organic pattern layer 118A and a second upper organic pattern layer 119A may be formed on the organic pattern layer 116A. According to an embodiment, the first upper organic pattern layer 118A may be formed concurrently (e.g., simultaneously) with the pixel defining layer 118. According to an embodiment, the second upper organic pattern layer 119A may be formed concurrently (e.g., simultaneously) with the spacer 119.

A second electrode 213 and at least one of a first functional layer 212a or a second functional layer 212c may be formed. Specifically, the first functional layer 212a, an emission layer 212b, the second functional layer 212c, the second electrode 213, and a capping layer 215 may be sequentially formed on the entire substrate 100. The emission layer 212b may overlap the first electrode 211. The first functional layer 212a, the second functional layer 212c, the second electrode 213, and the capping layer 215 may be stacked (e.g., sequentially stacked) on the pattern layer PTL-1.

The second electrode 213 and at least one of the first functional layer 212a or the second functional layer 212c on the pattern layer PTL-1 may be removed. According to an embodiment, laser light may be irradiated on the pattern layer PTL-1. Specifically, laser light may be irradiated on the pattern layer PTL-1 from below the substrate 100.

Because the pattern layer PTL-1 includes an opaque metal, the pattern layer PTL-1 may absorb the laser light. According to an embodiment, at least a portion of the pattern layer PTL-1 may be thermally expanded and lifted off from the second insulating layer IL2.

Figure 17E:
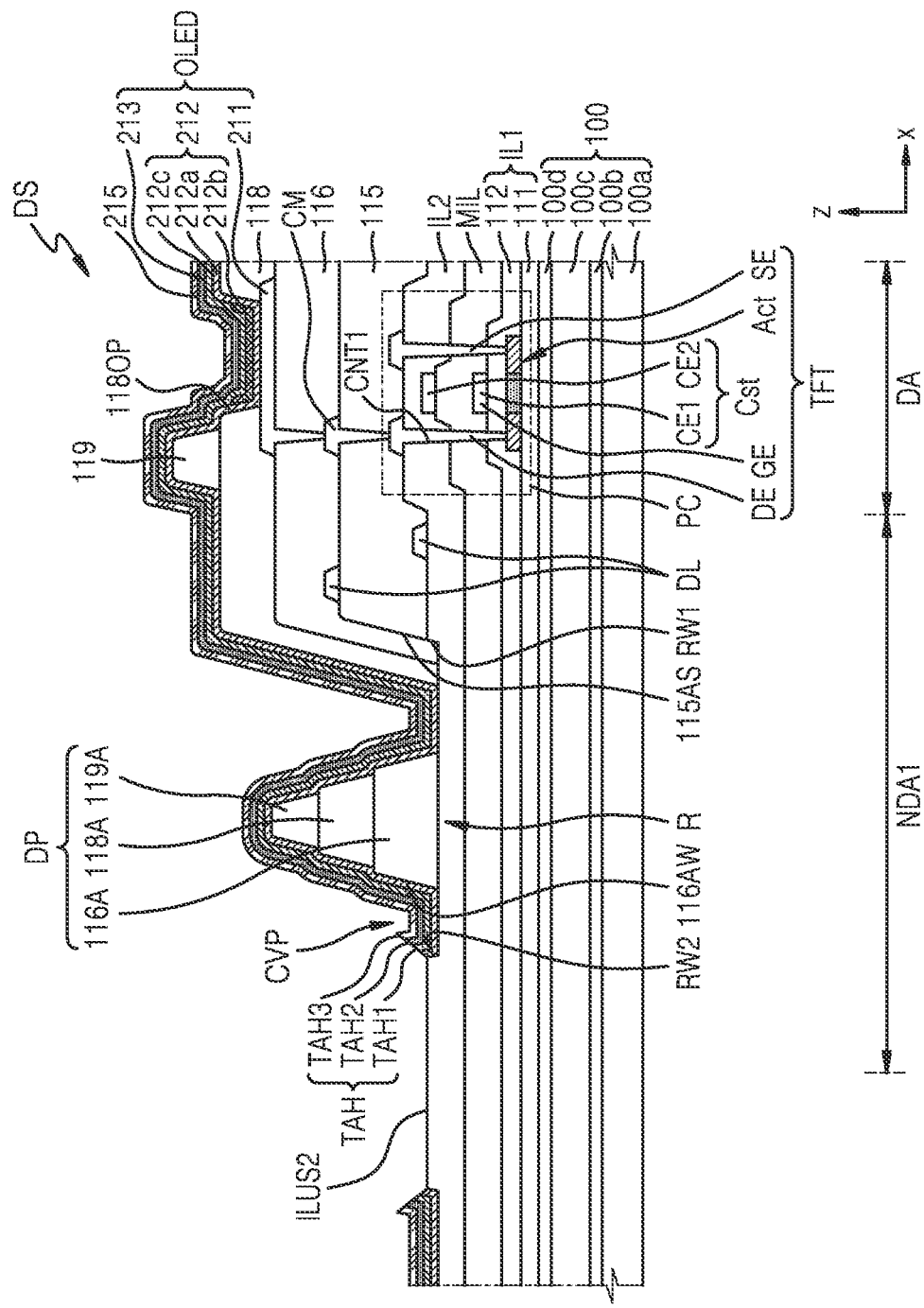

Referring to FIG. 17E, the first functional layer 212a, the second functional layer 212c, the second electrode 213, and the capping layer 215 may be lifted off together with the pattern layer PTL-1. Therefore, a first transmission hole TAH1 exposing the second upper surface ILUS2 of the second insulating layer IL2 may be formed in the first functional layer 212a and the second functional layer 212c. A second transmission hole TAH2 exposing the second upper surface ILUS2 of the second insulating layer IL2 may be formed in the second electrode 213. A third transmission hole TAH3 exposing the second upper surface ILUS2 of the second insulating layer IL2 may be formed in the capping layer 215.

As described above, according to embodiments, because the organic material layer around the opening may be removed by the laser lift-off process, it is possible to prevent or substantially prevent the display elements from being damaged by a foreign material or external moisture.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing a display device, the method comprising:
   preparing a display substrate comprising a substrate and a first insulating layer on the substrate, the substrate comprising a non-display area and a display area;
   forming, on the first insulating layer, a conductive pattern comprising a first layer and a second layer;
   forming, in the non-display area, a pattern layer comprising a lower pattern layer and an upper pattern layer;
   forming a conductive layer on the pattern layer and the display area;
   patterning the conductive layer to form a first electrode; and
   removing the upper pattern layer,
   wherein the lower pattern layer and the first layer include a same material, and
   wherein the upper pattern layer and the second layer include a same material.

2. The method of claim 1, further comprising:
   forming a second electrode and at least one of a first functional layer or a second functional layer, on the lower pattern layer and the first electrode; and
   removing the second electrode and at least one of the first functional layer or the second functional layer on the lower pattern layer.

3. The method of claim 2, wherein the removing of the second electrode and at least one of the first functional layer or the second functional layer comprises:
   forming, in at least one of the first functional layer or the second functional layer, a first transmission hole exposing a portion of an upper surface of the first insulating layer; and
   forming, in the second electrode, a second transmission hole exposing the portion of the upper surface of the first insulating layer.

4. The method of claim 2, wherein the removing of the second electrode and at least one of the first functional layer or the second functional layer comprises:
   irradiating laser light on the lower pattern layer; and
   removing the lower pattern layer.

5. The method of claim 2, wherein the removing of the second electrode and at least one of the first functional layer or the second functional layer comprises:
   irradiating laser light on the lower pattern layer; and
   exposing an upper surface of the lower pattern layer.

6. The method of claim 1, further comprising:
   forming, on the first insulating layer, a middle conductive pattern overlapping the non-display area;

forming, on the middle conductive pattern, a second electrode and at least one of a first functional layer or a second functional layer; and removing the second electrode on the middle conductive pattern to expose an upper surface of at least one of the first functional layer or the second functional layer, wherein the middle conductive pattern and the lower pattern layer include a same material.

7. The method of claim 1, further comprising:

forming a second insulating layer covering the conductive pattern and the pattern layer;

forming, in the second insulating layer, a second opening exposing the pattern layer; and forming, in the first insulating layer, a first recess or a first opening connected to the second opening.

8. The method of claim 7, further comprising forming a middle insulating layer on the first insulating layer, wherein the pattern layer and the conductive pattern are formed on the middle insulating layer, and wherein the forming of the second opening comprises forming a middle opening in the middle insulating layer.

9. The method of claim 7, further comprising forming a middle insulating layer on the first insulating layer, wherein the forming of the second opening comprises:

forming a middle opening in the middle insulating layer; and exposing the pattern layer through the middle opening.

10. The method of claim 7, wherein the substrate further comprises a bending area, and the method further comprises:

forming a photoresist layer having a photoresist opening exposing the bending area, the photoresist layer covering the second opening; and etching the first insulating layer and the second insulating layer overlapping the photoresist opening.

\* \* \* \* \*